United States Patent
Hori et al.

(10) Patent No.: US 10,471,557 B2
(45) Date of Patent: Nov. 12, 2019

(54) METHOD OF MANUFACTURING LIQUID-COOLED JACKET AND LIQUID-COOLED JACKET

(71) Applicant: NIPPON LIGHT METAL COMPANY, LTD., Tokyo (JP)

(72) Inventors: Hisashi Hori, Shizuoka (JP); Nobushiro Seo, Shizuoka (JP)

(73) Assignee: NIPPON LIGHT METAL COMPANY, LTD., Tokyo (JP)

( * ) Notice: Subject to any disclaimer, the term of this patent is extended or adjusted under 35 U.S.C. 154(b) by 275 days.

(21) Appl. No.: 15/524,550

(22) PCT Filed: Oct. 9, 2015

(86) PCT No.: PCT/JP2015/078725
§ 371 (c)(1),
(2) Date: May 4, 2017

(87) PCT Pub. No.: WO2016/072211
PCT Pub. Date: May 12, 2016

(65) Prior Publication Data
US 2018/0272479 A1    Sep. 27, 2018

(30) Foreign Application Priority Data

Nov. 5, 2014    (JP) ................................ 2014-225068
Nov. 5, 2014    (JP) ................................ 2014-225069

(51) Int. Cl.
*B23K 20/12* (2006.01)
*B23P 15/26* (2006.01)
(Continued)

(52) U.S. Cl.
CPC .......... *B23P 15/26* (2013.01); *B23K 20/1265* (2013.01); *H01L 21/4882* (2013.01);
(Continued)

(58) Field of Classification Search
CPC .... B23P 15/26; B23P 2700/10; H01L 23/473; H01L 21/4882; H01L 23/4006; B23K 20/1265; B23K 2101/36; B23K 2101/14
See application file for complete search history.

(56) References Cited

U.S. PATENT DOCUMENTS 5,971,247 A    10/1999 Gentry
2009/0065178 A1    3/2009 Kasezawa et al.
(Continued)

FOREIGN PATENT DOCUMENTS

CN    102317027 A    1/2012
CN    103537793 A    1/2014
(Continued)

OTHER PUBLICATIONS

English translation of JP2010069503 (Year: 2010).*
(Continued)

*Primary Examiner* — Jun S Yoo
(74) *Attorney, Agent, or Firm* — Merchant & Gould P.C.

(57) ABSTRACT

A method of manufacturing a liquid-cooled jacket, includes: a placing step for placing a sealing body on a jacket body; a first primary joining step for performing frictional stirring by moving a primary joining rotary tool along a first abutment portion where a step side surface of a peripheral wall stepped portion and an outer peripheral side surface of the sealing body abut on each other; and a second primary joining step for performing frictional stirring by moving the primary joining rotary tool along second abutment portions in each of which a step side surface of a columnar support stepped portion and a hole wall of a hole abut on each other.

8 Claims, 50 Drawing Sheets

(51) Int. Cl.
  *H01L 23/473* (2006.01)
  *H01L 21/48* (2006.01)
  *H01L 23/40* (2006.01)
  *B23K 101/14* (2006.01)
  *B23K 101/36* (2006.01)

(52) U.S. Cl.
  CPC ........ *H01L 23/473* (2013.01); *B23K 2101/14* (2018.08); *B23K 2101/36* (2018.08); *B23P 2700/10* (2013.01); *H01L 23/4006* (2013.01)

(56) References Cited

U.S. PATENT DOCUMENTS

| | | |
|---|---|---|
| 2011/0308059 A1 | 12/2011 | Seo et al. |
| 2013/0153186 A1 | 6/2013 | Gotou et al. |
| 2014/0165399 A1 | 6/2014 | Seo et al. |
| 2015/0273637 A1 | 10/2015 | Hori et al. |

FOREIGN PATENT DOCUMENTS

| | | |
|---|---|---|
| JP | 2000-202645 A | 7/2000 |
| JP | 2010-69503 A | 4/2010 |
| JP | 2010-284706 A | 12/2010 |
| JP | 2013-045781 A | 3/2013 |
| JP | 2013-121622 A | 6/2013 |
| JP | 2014-94409 A | 5/2014 |
| TW | I370527 B1 | 8/2012 |
| WO | 2012-026217 A1 | 3/1997 |

OTHER PUBLICATIONS

Office Action for Chinese Patent Application No. 201580060110.X, dated Nov. 28, 2018.
Office Action for Taiwanese Patent Application No. 104134162, dated Jul. 6, 2017.
International Search Report for PCT/JP2015/078725, dated Dec. 15, 2015.

* cited by examiner

FIG.11
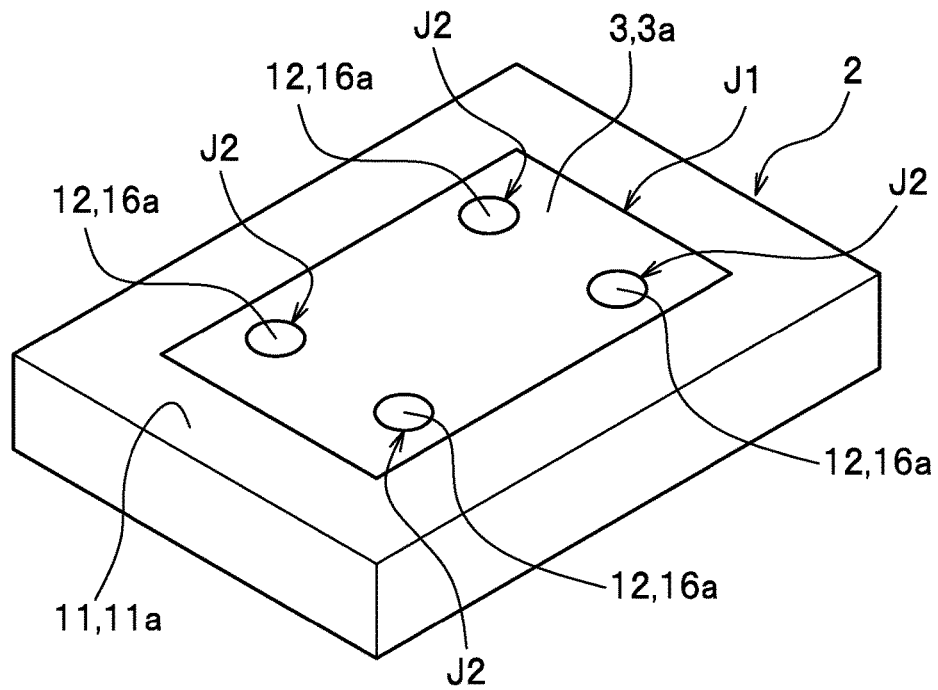
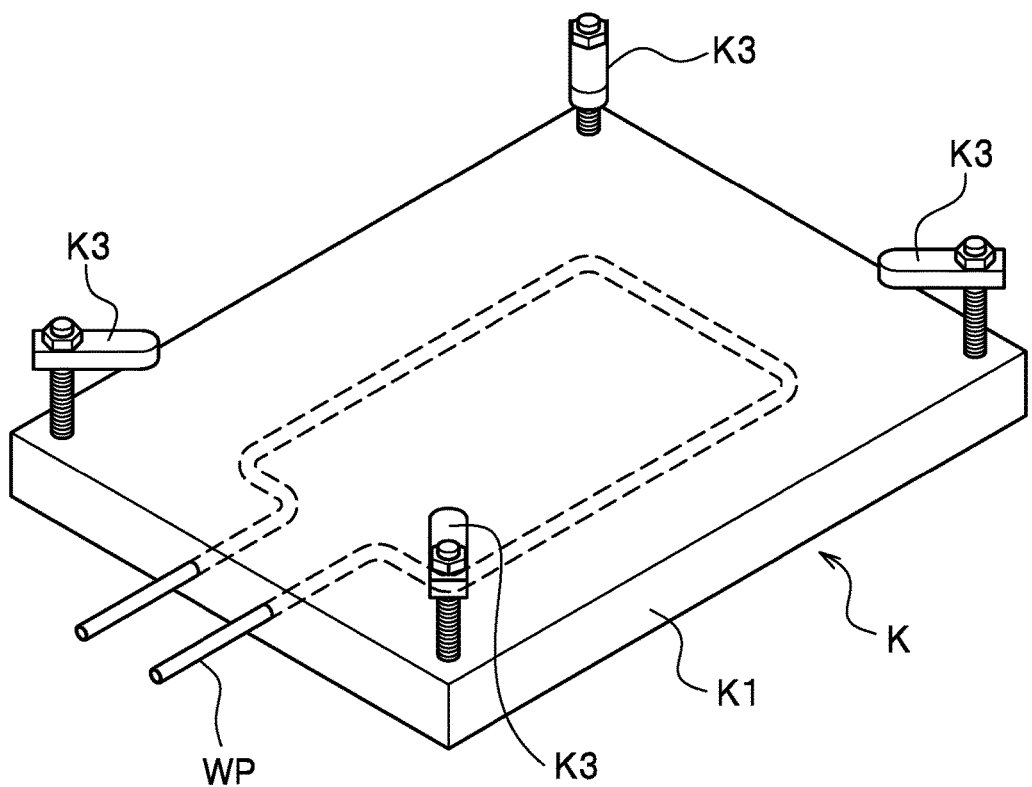

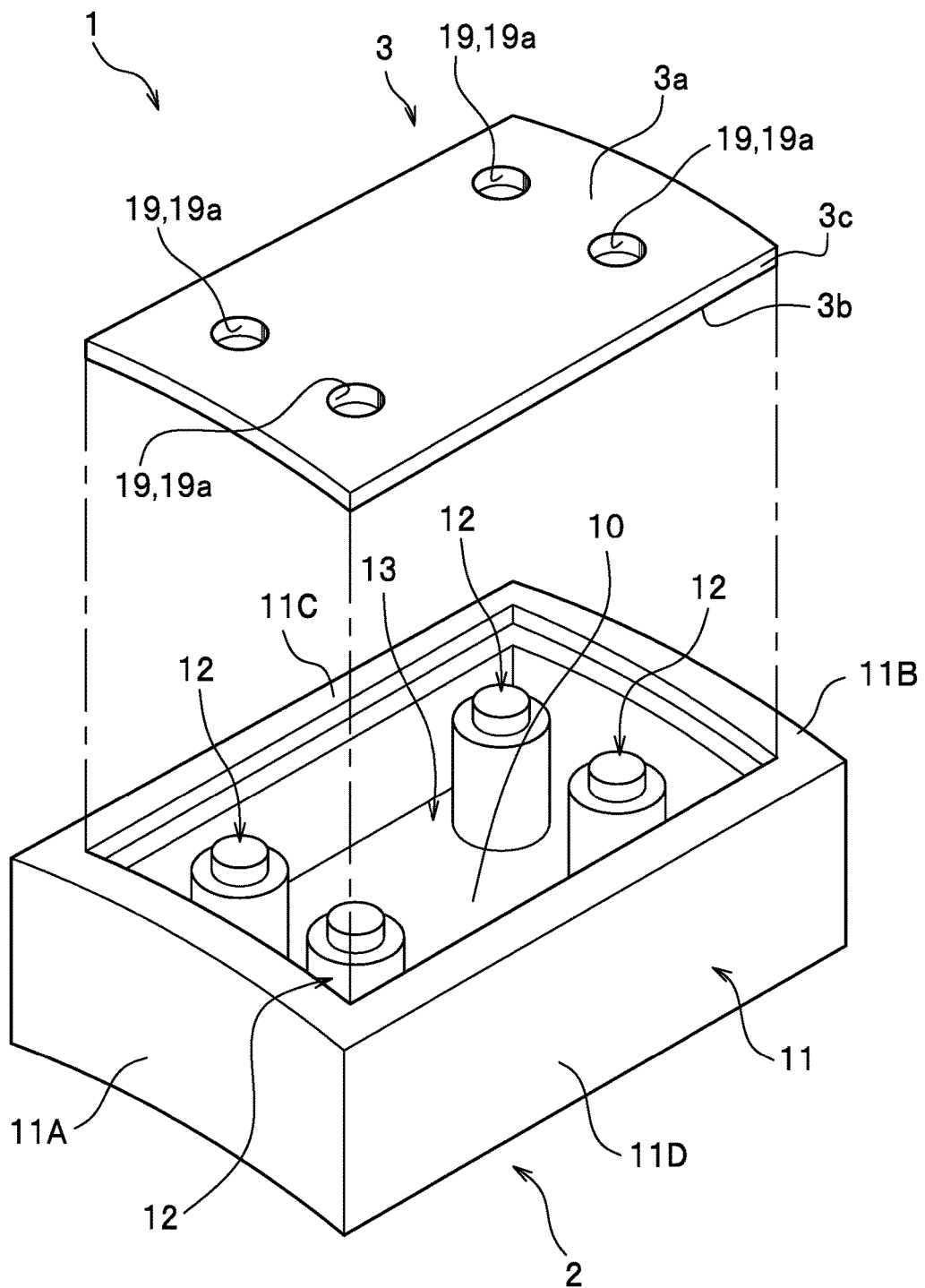

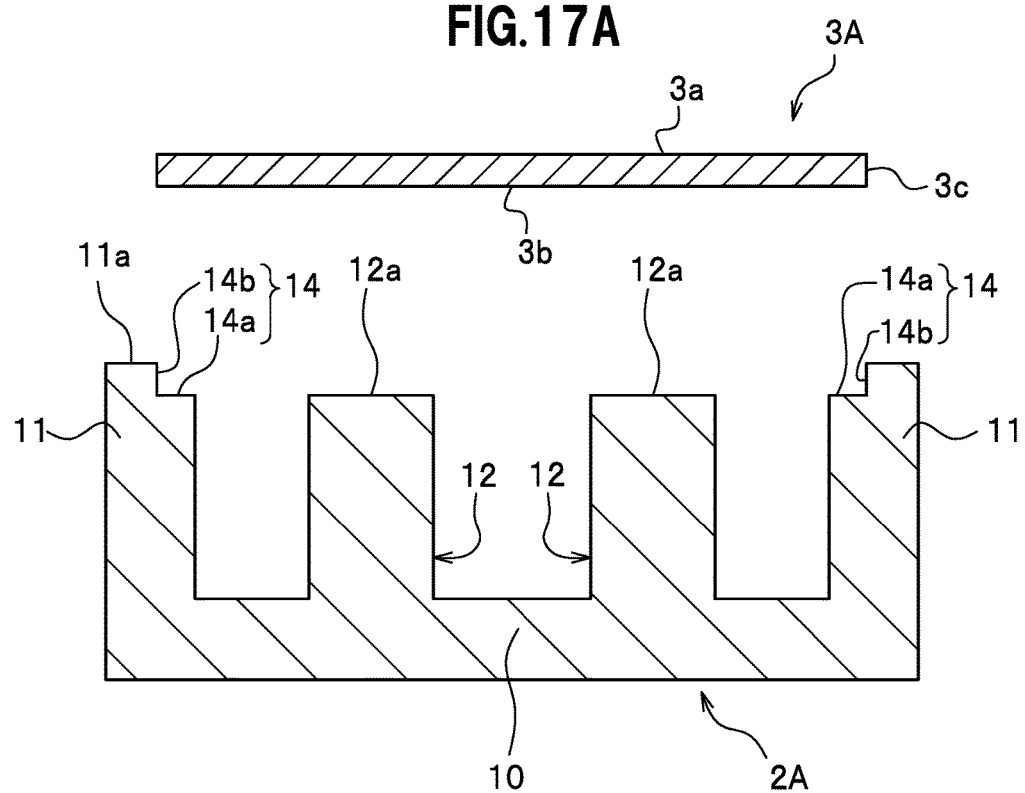
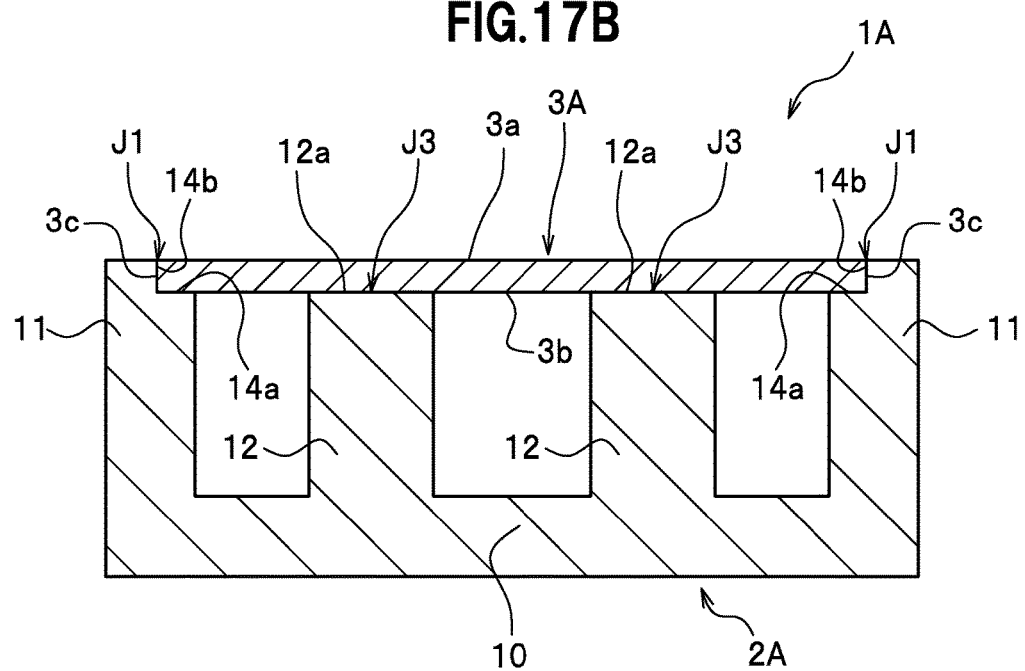

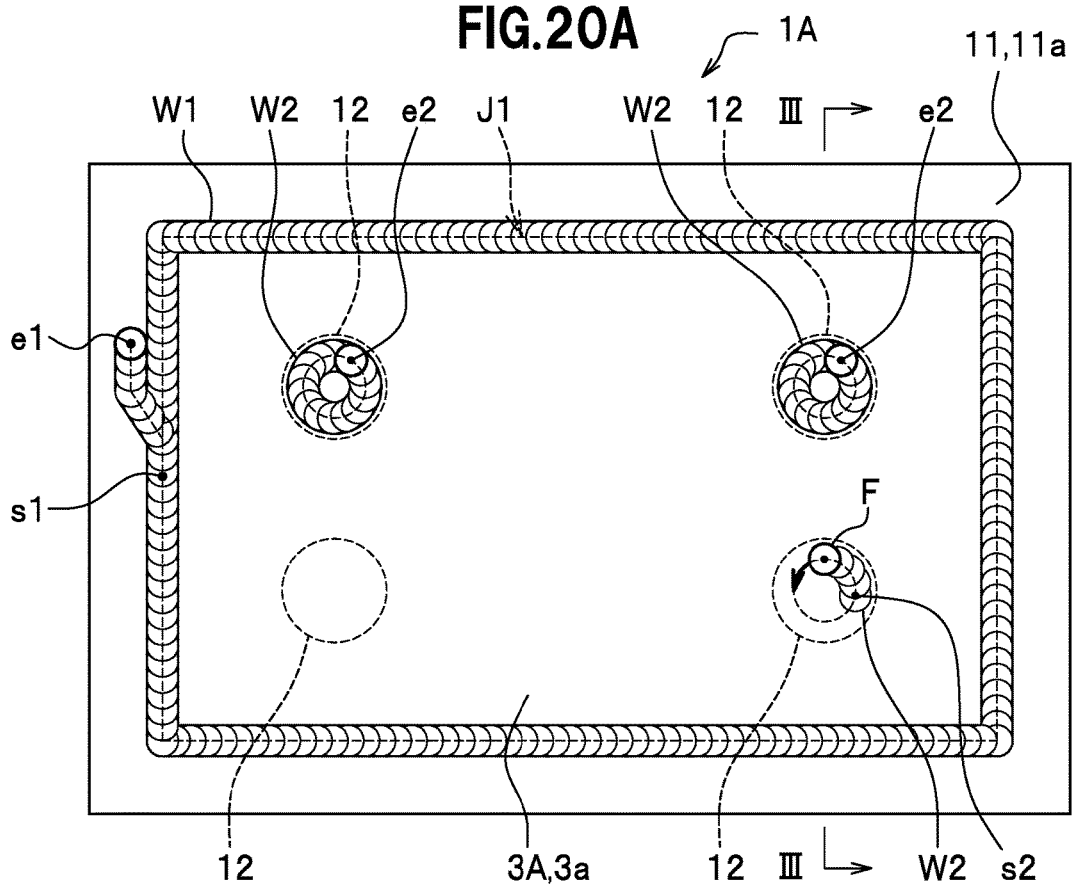
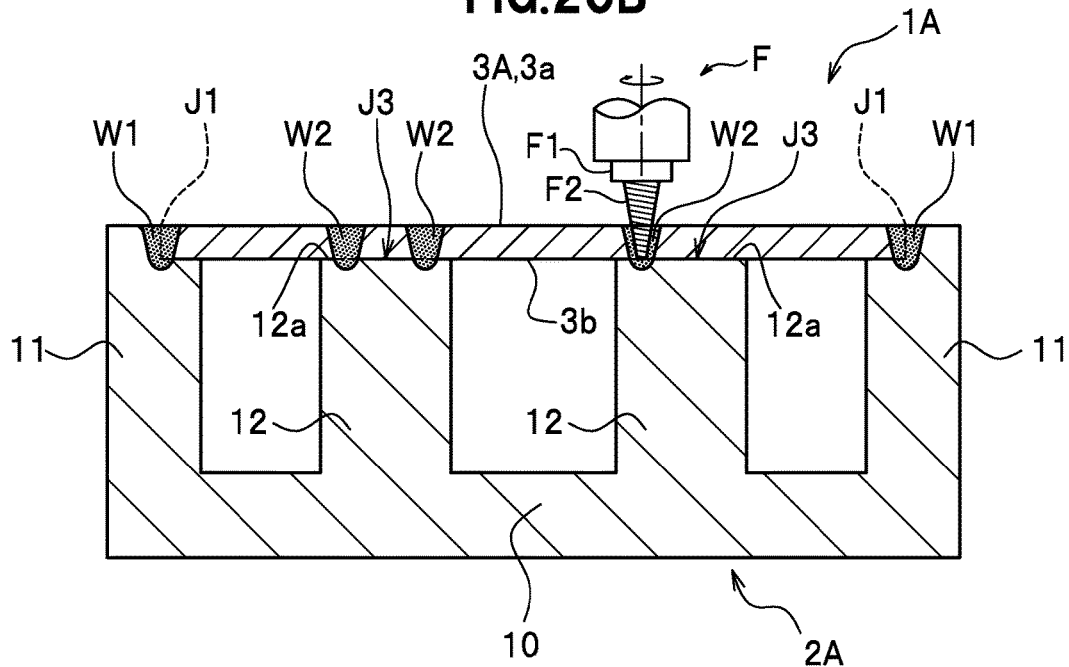

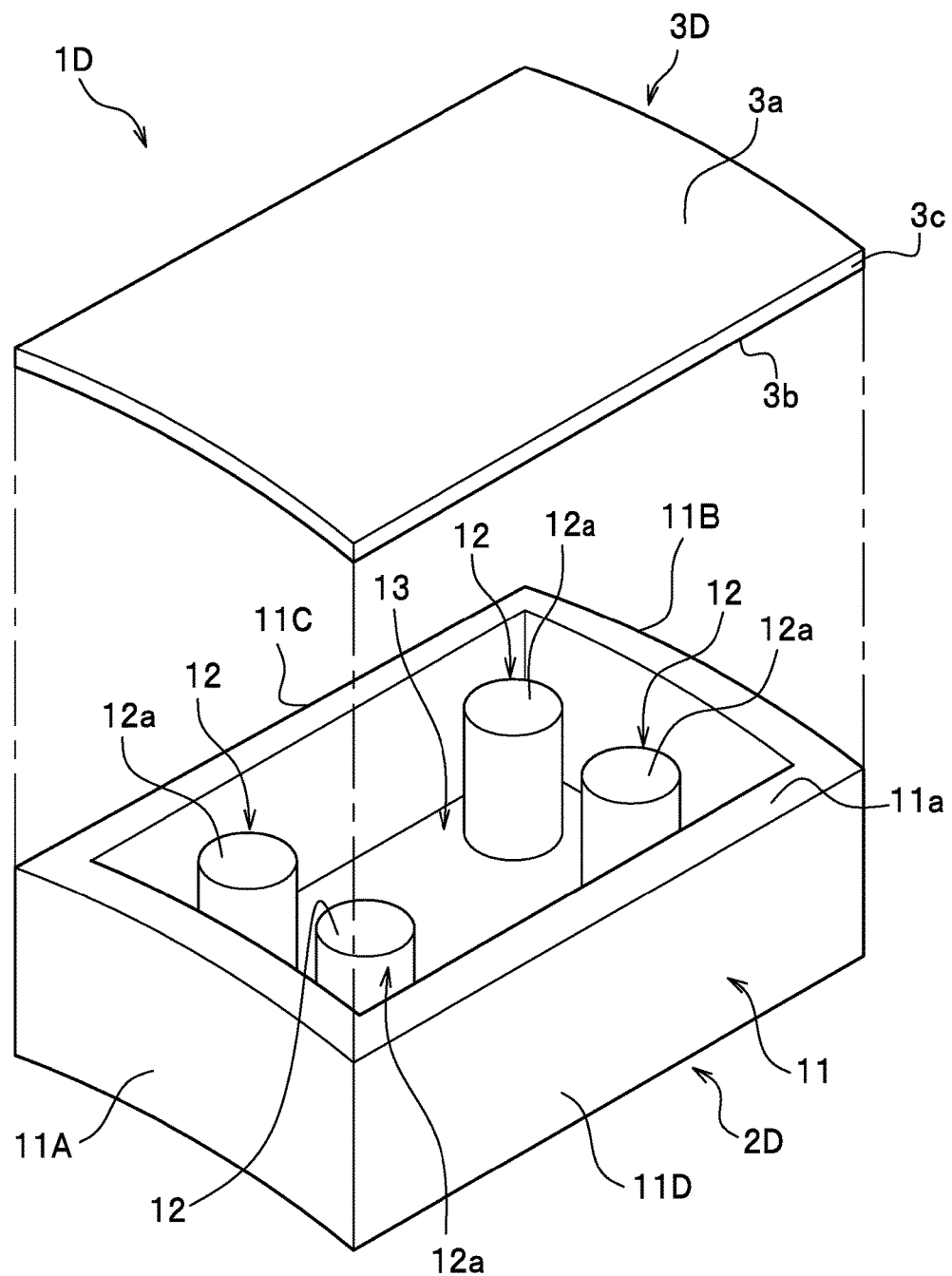

FIG.38
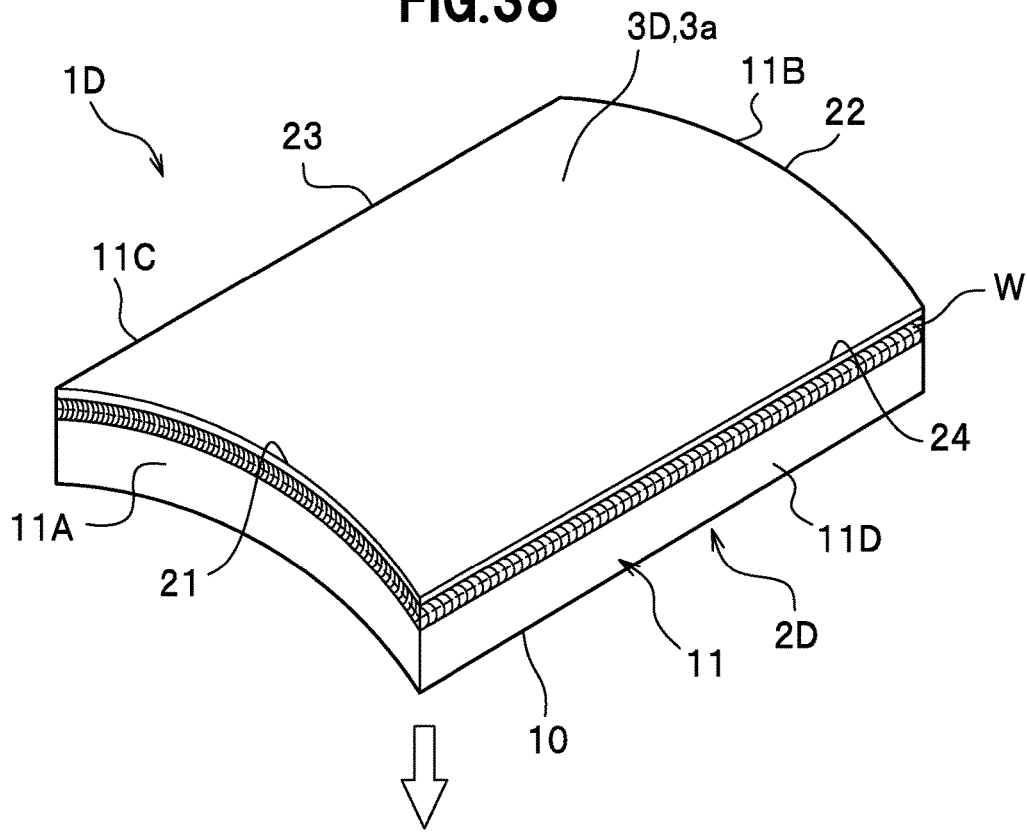
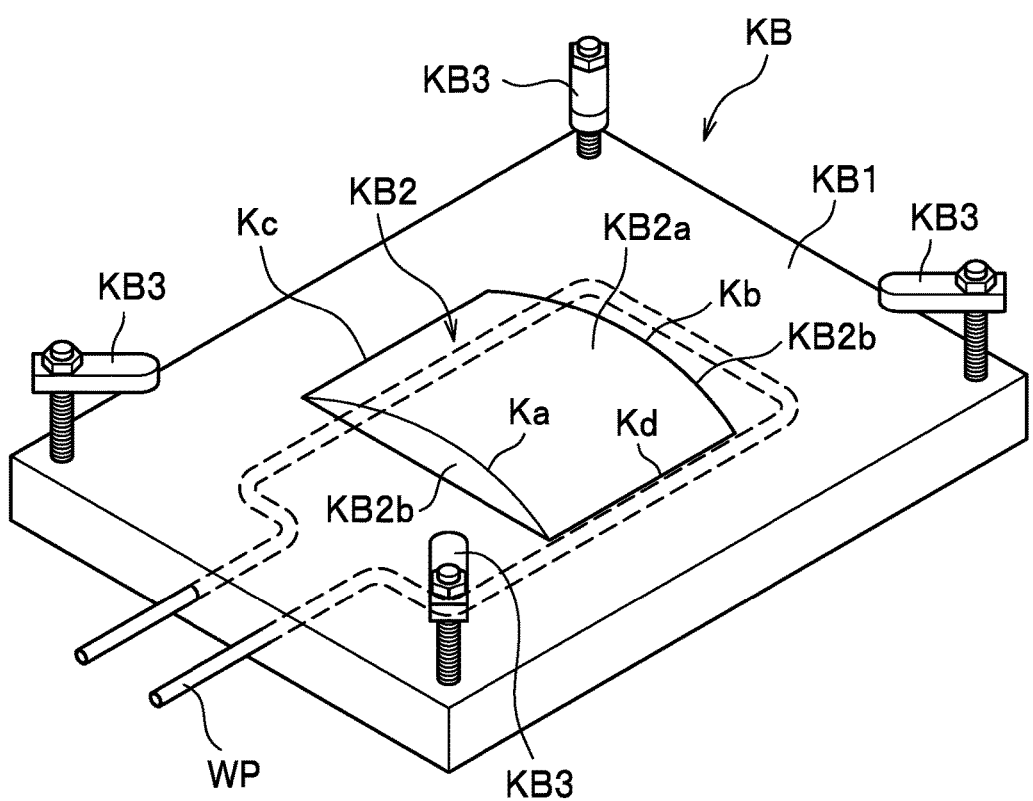

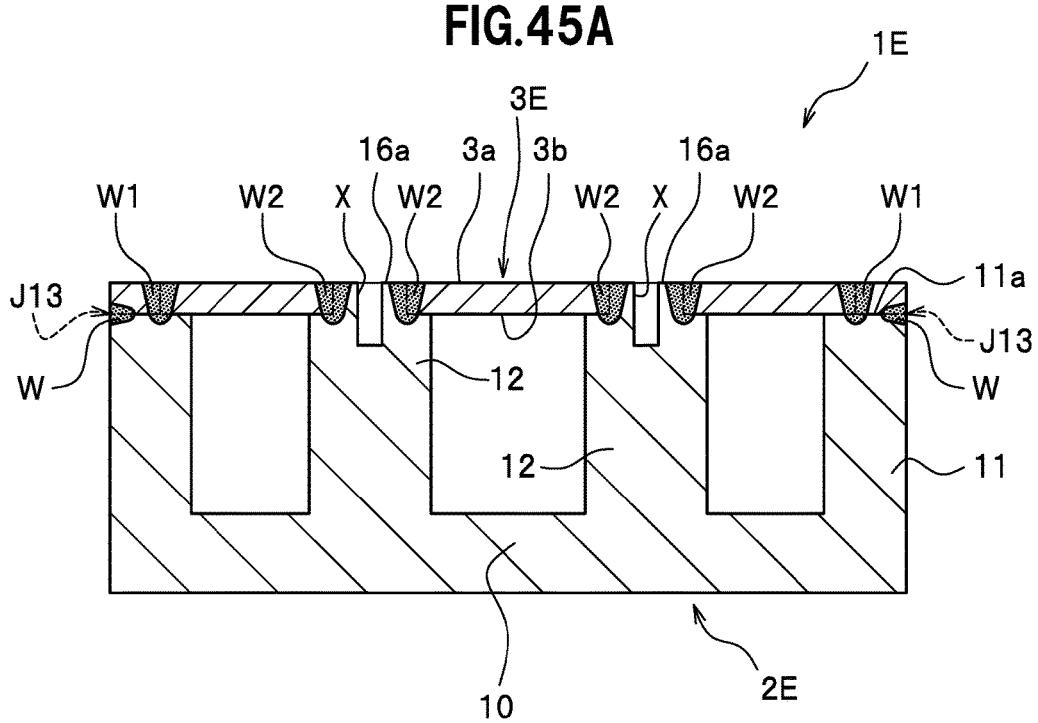
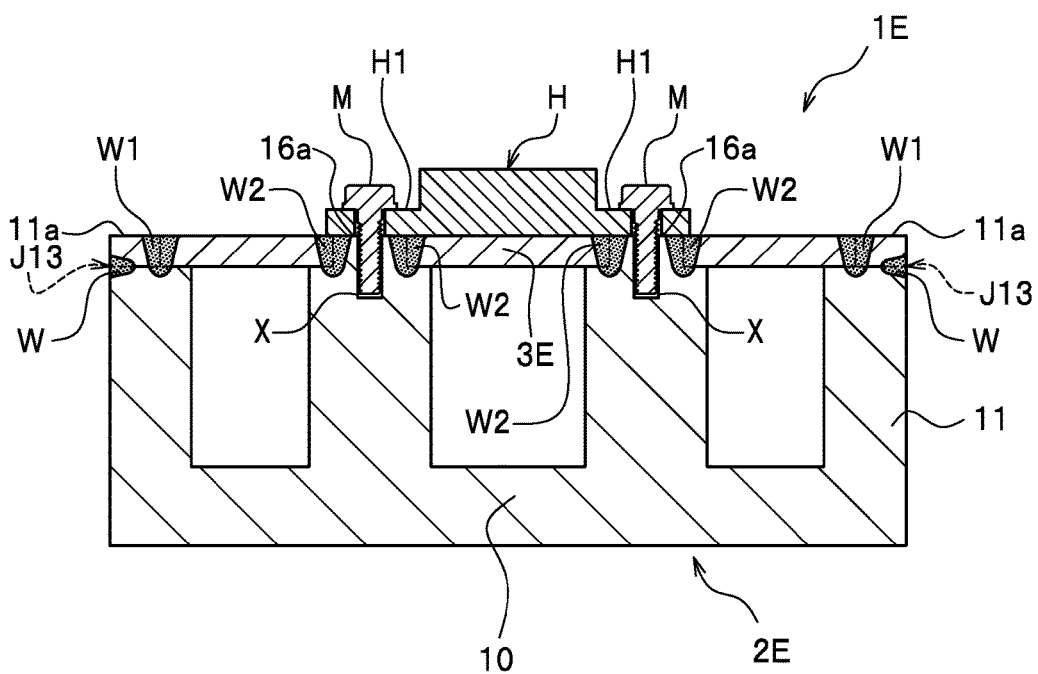

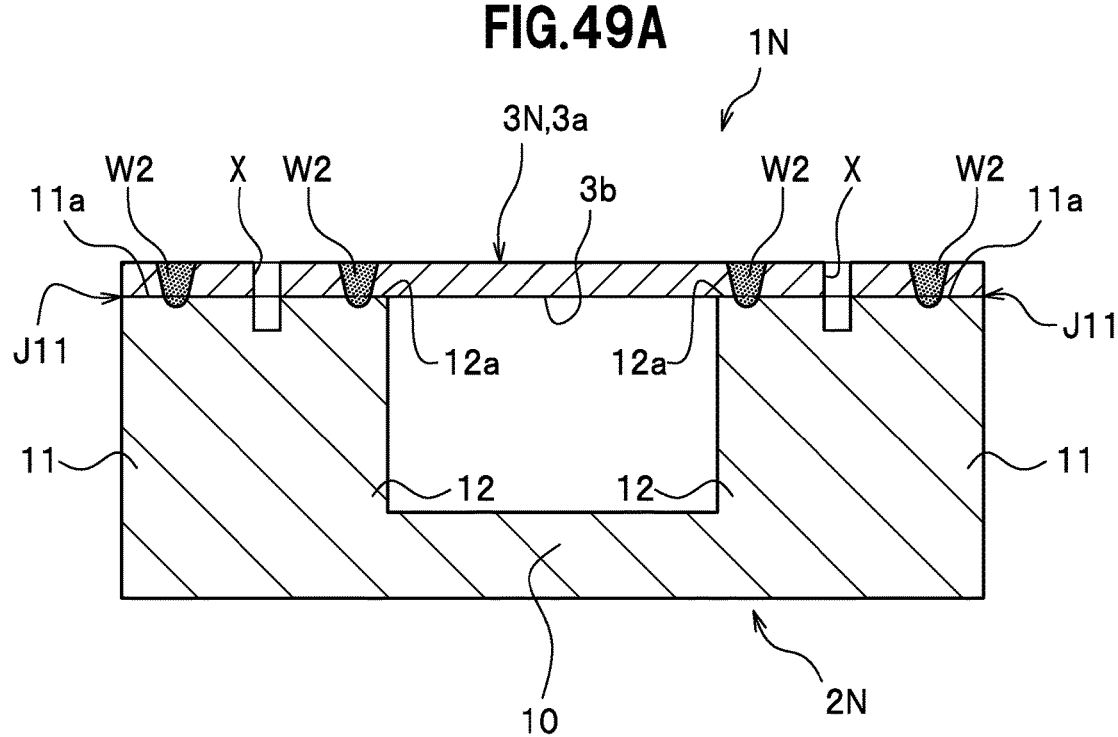
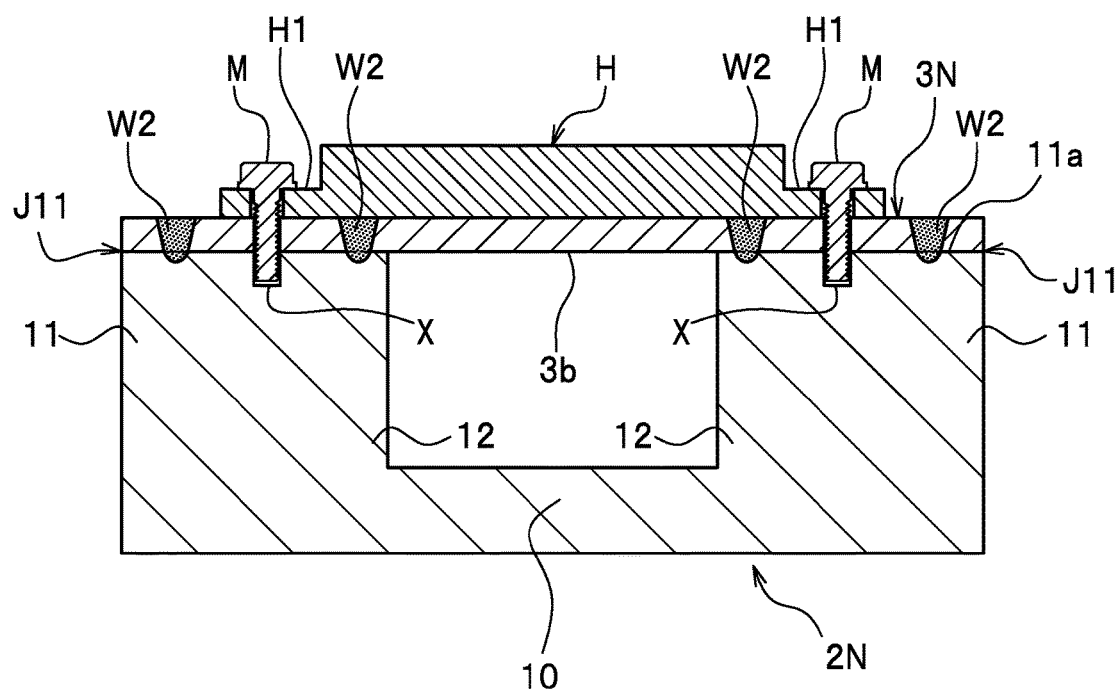

METHOD OF MANUFACTURING LIQUID-COOLED JACKET AND LIQUID-COOLED JACKET

CROSS-REFERENCE TO RELATED APPLICATION

This application is a U.S. National Stage Application under 35 U.S.C. § 371 of International Patent Application No. PCT/JP2015/078725 filed Oct. 9, 2015, which claims the benefit of priority to Japanese Patent Application No. 2014-225068, filed Nov. 5, 2014, and Japanese Patent Application No. 2014-225069, filed Nov. 5, 2014, the disclosures of all of which are hereby incorporated by reference in their entireties.

TECHNICAL FIELD

The present invention relates to a method of manufacturing a liquid-cooled jacket, and the liquid-cooled jacket.

BACKGROUND

In recent years, as an electronic device as typified by a personal computer has been improved in performance, a calorific value of a CPU (heat-generating element) installed therein has been increased in amount. Moreover, hybrid vehicles, electric vehicles, and high-speed railroad vehicles employ a power semiconductor with a large calorific value for a switching operation of a motor. To stably operate an electronic device with a large calorific value, a cooling device with a high reliability has been required.

In a conventional art, a heat sink of an air cooling fan system has been used to cool heat-generating elements, but problems such as noises caused by the fan and cooling limits by the air cooling system have gain prominent attention. Thus, a water-cooled plate of a water cooling system (liquid-cooled jacket) has gathered attention as a next-generation cooling system.

For example, Patent Literature 1 discloses a liquid-cooled jacket adapted to cool heat-generating elements. FIG. 50 is a cross-sectional view showing a conventional liquid-cooled jacket. As shown in FIG. 50, the conventional liquid-cooled jacket 300 is composed of a jacket body 310, and a sealing body 320 that covers recesses of the jacket body 310. The jacket body 310 has grooves 311 formed therein. The sealing body 320 is composed of a substrate 321, and a plurality of fins 322 formed perpendicularly to the substrate 321.

The jacket body 310 and the sealing body 320 are joined together by frictional stirring. A heat-generating element H has a flange H1 which is fixed to the grooves 311 with screws (fitting members) M.

CITATION LIST

Patent Literature

Patent Literature 1: Japanese Unexamined Patent Application Publication No. 2010-069503

SUMMARY OF THE INVENTION

Technical Problem

The liquid-cooled jacket 300 shown in FIG. 50 has a risk that heat leak arises in which heat of the heat-generating element H is transferred through the screws M and the grooves 311 to a wall part 312 of the jacket body 310 to allow the heat to be accumulated in the wall part 312. Also, a space for providing the grooves 311 in the wall part 312 must be secured, thus allowing the liquid-cooled jacket 300 to tend to increase in size. Moreover, the middle part of the sealing body 320 is not supported by the jacket body 320, thus leading to a problem that deformation resistance is lowered.

It is therefore an object of the present invention to provide a method of manufacturing a liquid-cooled jacket which has high thermal conductivity and deformation resistance and can be reduced in size, and the liquid-cooled jacket.

Solution to Problem

In order to solve the problems described above, the present invention (a first invention of this application) provides a method of manufacturing a liquid-cooled jacket which is composed of a jacket body that has a bottom part, a peripheral wall part rising from a peripheral edge of the bottom part, and a columnar support rising from the bottom part, the columnar support having a region into which a fitting member for fixing a heat-generating element to the liquid-cooled jacket is inserted, and a sealing body that is provided with a hole into which a head of the columnar support is inserted, and seals an opening of the jacket body, and in which the jacket body and the sealing body is joined together by frictional stirring, the method including: a preparation step which includes forming, on an inner peripheral edge of the peripheral wall part, a peripheral wall stepped portion having a step bottom surface and a step side surface rising from the step bottom surface, forming a columnar support end face of the columnar support at the same height position as a peripheral wall end face of the peripheral wall, and forming, on an outer periphery of the head of the columnar support, a columnar support stepped portion having a step bottom surface and a step side surface rising from the step bottom surface; a placing step of placing the sealing body on the jacket body; a first primary joining step which includes allowing a rotary tool to move one round along a first abutment portion in which the step side surface of the peripheral wall stepped portion and an outer peripheral side surface of the sealing body abut on each other, to perform frictional stirring; and a second primary joining step which includes allowing a rotary tool to move one round along a second abutment portion in which the step side surface of the columnar support stepped portion and a hole wall of the hole abut on each other, to perform frictional stirring.

Also, the present invention (a second invention of this application) provides a method of manufacturing a liquid-cooled jacket which is composed of a jacket body that has a bottom part, a peripheral wall part rising from a peripheral edge of the bottom part, and a columnar support rising from the bottom part, the columnar support having a region into which a fitting member for fixing a heat-generating element to the liquid-cooled jacket is inserted, and a sealing body that seals an opening of the jacket body, and in which the jacket body and the sealing body is joined together by frictional stirring, the method including: a preparation step which includes forming, on an inner peripheral edge of the peripheral wall part, a peripheral wall stepped portion having a step bottom surface and a step side surface rising from the step bottom surface, and forming a columnar support end face of the columnar support at the same height position as the step bottom surface of the peripheral wall stepped portion; a placing step of placing the sealing body on the jacket body; a first primary joining step which includes allowing a rotary tool to move one round along a first abutment portion in which the step side surface of the peripheral wall stepped portion and an outer peripheral side surface of the sealing body abut on each other, to perform frictional stirring; and a second primary joining step which includes allowing a rotary tool to move for an overlapped portion in which the columnar support end face of the columnar support and a back surface of the sealing body are overlapped each other, to perform frictional stirring.

According to the manufacturing method, since the sealing body is supported by the columnar support, and the sealing body and the columnar support are joined together by frictional stirring, the liquid-cooled jacket can be increased in deformation resistance. Also, since the columnar support is disposed within a hollow section of the liquid-cooled jacket, heat transport fluid is brought into contact with an outer peripheral surface of the columnar support. Therefore, heat transferred to the columnar support from the heat-generating element through the fitting member can be efficiently exhausted. In other words, heat leak can be prevented from arising through the fitting member that fixes the heat-generating element to the liquid-cooled jacket. Moreover, since the columnar support to which the heat-generating element is fixed is disposed inside the jacket body, the liquid-cooled jacket can be reduced in size.

Also, in the first invention of this application, it is preferable that the rotary tool is a primary joining rotary tool provided with a stirring pin a length of which is greater than a thickness of the sealing body, and the first primary joining step and the second primary joining step each include performing frictional stirring with only the stirring pin being brought into contact with the jacket body and the sealing body.

Moreover, in the second invention of this application, it is preferable that the rotary tool is a primary joining rotary tool provided with a stirring pin a length of which is greater than a thickness of the sealing body, the first primary joining step includes performing frictional stirring with only the stirring pin being brought into contact with the jacket body and the sealing body, and the second primary joining step includes performing frictional stirring with only the stirring pin being brought into contact with the jacket body and the sealing body, or performing frictional stirring with only the stirring pin being brought into contact with only the sealing body.

According to the manufacturing method, since a shoulder portion is not inserted into the sealing body, a width of a plasticized region can be decreased. This makes it possible to decrease a width of the step bottom surface of the peripheral wall stepped portion and a width of the step bottom surface of the columnar support stepped portion, thus improving a degree of freedom of designing. Also, since the shoulder portion is not inserted into the sealing body, a pressing force which acts on the jacket body and the sealing body can be reduced. This makes it possible, even if the width of each of the step bottom surfaces is decreased, to prevent the metal material from escaping from inner corner portions constituted by the peripheral wall part and the sealing body, and inner corner portions constituted by the columnar support and the sealing body. Moreover, since only the stirring pin is inserted into the jacket body and the sealing body, or into only the sealing body, a load exerted on a friction stirring apparatus can be reduced as compared to a case where the shoulder portion of the rotary tool is pressed into the jacket body and the sealing body. Furthermore, since the load exerted on the friction stirring apparatus can be reduced, the joining can be performed down to a deep location of the abutment portion, or the joining can be performed for the overlapped portion at a deep location, with no great load exerted on the friction stirring apparatus.

Also, in the first invention of this application, it is preferable that the method further includes a provisional joining step of performing provisional joining for at least one of the first abutment portion and the second abutment portion, prior to the first primary joining step and the second primary joining step.

Moreover, in the second invention of this application, it is preferable that the method further includes a provisional joining step of performing provisional joining for the first abutment portion, prior to the first primary joining step.

According to the manufacturing method, since the provisional joining is performed, gaps can be prevented from being formed in each of the abutment portions when performing the first primary joining step and the second primary joining step.

Also, the present invention (a third invention of this application) provides a method of manufacturing a liquid-cooled jacket which is composed of a jacket body that has a bottom part, a peripheral wall part rising from a peripheral edge of the bottom part, and a columnar support rising from the bottom part, the columnar support having a region into which a fitting member for fixing a heat-generating element to the liquid-cooled jacket is inserted, and a sealing body that seals an opening of the jacket body, and in which the jacket body and the sealing body is joined together by frictional stirring, the method including: a preparation step which includes forming a columnar support end face of the columnar support at the same height position as a peripheral wall end face of the peripheral wall part; a placing step of placing the sealing body on the jacket body; a first primary joining step which includes allowing a rotary tool to move one round for a first overlapped portion in which the peripheral wall end face of the peripheral wall part and a back surface of the sealing body are overlapped each other, to perform frictional stirring; and a second primary joining step which includes allowing a rotary tool to move for, while inserting the rotary tool from a front surface of the sealing body into, a second overlapped portion in which the columnar support end face of the columnar support and the back surface of the sealing body are overlapped each other, to perform frictional stirring.

Moreover, the present invention (a fourth invention of this application) provides a method of manufacturing a liquid-cooled jacket which is composed of a jacket body that has a bottom part, a peripheral wall part rising from a peripheral edge of the bottom part, and a columnar support rising from the bottom part, the columnar support having a region into which a fitting member for fixing a heat-generating element to the liquid-cooled jacket is inserted, and a sealing body that is provided with a hole into which a head of the columnar support is inserted, and seals an opening of the jacket body, and in which the jacket body and the sealing body is joined together by frictional stirring, the method including: a preparation step which includes forming, on an outer periphery of the head of the columnar support, a columnar support stepped portion having a step bottom surface and a step side surface rising from the step bottom surface, and forming the step bottom surface of the columnar support at the same height position as a peripheral wall end face of the peripheral wall; a placing step of placing the sealing body on the jacket body; a first primary joining step which includes allowing a rotary tool to move one round for an overlapped portion in which the peripheral wall end face of the peripheral wall part and a back surface of the sealing body are overlapped each other, to perform frictional stirring; and a second primary joining step which includes allowing a rotary tool to move one round for an abutment portion in which the step side surface of the columnar support and a hole wall of the hole abut on each other, to perform frictional stirring.

According to the manufacturing method, since the sealing body is supported by the columnar support, and the sealing body and the columnar support are joined together by frictional stirring, the liquid-cooled jacket can be increased in deformation resistance. Also, since the columnar support is disposed within a hollow section of the liquid-cooled jacket, heat transport fluid is brought into contact with an outer peripheral surface of the columnar support. Therefore, heat transferred to the columnar support from the heat-generating element through the fitting member can be efficiently exhausted. In other words, heat leak can be prevented from arising through the fitting member that fixes the heat-generating element to the liquid-cooled jacket. Moreover, since the columnar support to which the heat-generating element is fixed is disposed inside the jacket body, the liquid-cooled jacket can be reduced in size.

Also, in the third invention of this application, it is preferable that the rotary tool is a primary joining rotary tool provided with a stirring pin a length of which is greater than a thickness of the sealing body, and the first primary joining step and the second primary joining step each include performing frictional stirring with only the stirring pin being brought into contact with the jacket body and the sealing body, or performing frictional stirring with only the stirring pin being brought into contact with only the sealing body.

According to the manufacturing method, since a shoulder portion is not inserted into the sealing body, a width of a plasticized region can be decreased. This makes it possible to decrease a width of the peripheral wall end face, thus improving a degree of freedom of designing. Also, since the shoulder portion is not inserted into the sealing body, a pressing force which acts on the jacket body and the sealing body can be reduced. This makes it possible, even if the width of the peripheral wall part is decreased, to prevent the metal material from escaping from inner corner portions constituted by the peripheral wall part and the sealing body. Moreover, since only the stirring pin is inserted into the jacket body and the sealing body, or into only the sealing body, a load exerted on a friction stirring apparatus can be reduced as compared to a case where the shoulder portion of the rotary tool is pressed into the jacket body and the sealing body. Furthermore, since the load exerted on the friction stirring apparatus can be reduced, the joining can be performed for the first overlapped portion and the second overlapped portion at deep locations with no great load exerted on the friction stirring apparatus.

Also, in the fourth invention of this application, it is preferable that the rotary tool is a primary joining rotary tool provided with a stirring pin a length of which is greater than a thickness of the sealing body, the first primary joining step includes performing frictional stirring with only the stirring pin being brought into contact with the jacket body and the sealing body, or performing frictional stirring with only the stirring pin being brought into contact with only the sealing body, and the second primary joining step includes performing frictional stirring with only the stirring pin being brought into contact with the jacket body and the sealing body.

According to the manufacturing method, since a shoulder portion is not inserted into the sealing body, a width of a plasticized region can be decreased. This makes it possible to decrease a width of the peripheral wall end face and a width of the step bottom surface of the columnar support stepped portion, thus improving a degree of freedom of designing. Also, since the shoulder portion is not inserted into the sealing body, a pressing force which acts on the jacket body and the sealing body can be reduced. This makes it possible, even if the each width of the peripheral wall end face and the step bottom surface is decreased, to prevent the metal material from escaping from inner corner portions constituted by the peripheral wall part and the sealing body, and inner corner portions constituted by the columnar support and the sealing body. Moreover, since only the stirring pin is inserted into the jacket body and the sealing body, or into only the sealing body, a load exerted on a friction stirring apparatus can be reduced as compared to a case where the shoulder portion of the rotary tool is pressed into the jacket body and/or the sealing body. Furthermore, since the load exerted on the friction stirring apparatus can be reduced, the joining can be performed down to a deep location of the abutment portion, or the joining can be performed for the overlapped portion at a deep location, with no great load exerted on the friction stirring apparatus.

Also, in the third invention of this application, it is preferable that the method further includes a provisional joining step of performing provisional joining for at least one of the first overlapped portion and the second overlapped portion, prior to the first primary joining step and the second primary joining step.

Moreover, in the fourth invention of this application, it is preferable that the method further includes a provisional joining step of performing provisional joining for at least one of the abutment portion and the overlapped portion, prior to the first primary joining step and the second primary joining step.

According to the manufacturing method, since the provisional joining is performed beforehand, the first primary joining step and the second primary joining step can be stably performed.

Also, it is preferable that the preparation step includes forming the jacket body by die-casting to allow a front surface of the bottom part to be formed into a convex shape, and forming the sealing body to allow a front surface thereof to have a convex shape.

There is a risk that heat input at the time of friction stir welding causes heat contraction to be generated in a plasticized region and the sealing body side of the liquid-cooled jacket to be deformed into a concave shape. However, according to the above manufacturing method, the liquid-cooled jacket can be made flat by bringing the jacket body and the sealing body into a convex shape beforehand and making use of the heat contraction.

Also, it is preferable that the first primary joining step and the second primary joining step each include measuring beforehand an amount of deformation of the jacket body, and performing frictional stirring while adjusting an insertion depth of a stirring pin of the rotary tool according to the amount of deformation.

According to the manufacturing method, even where friction stir welding is performed with the jacket body and the sealing body being curved into a convex shape, the length and width of a plasticized region to be formed on the liquid-cooled jacket can be made constant.

Also, it is preferable that the first primary joining step and the second primary joining step each include providing a cooling plate in which a cooling medium flows, on a back surface side of the bottom part, and performing frictional stirring while cooling the jacket body and the sealing body through the cooling plate.

According to the manufacturing method, since frictional heat can be suppressed low, deformation of the liquid-cooled jacket due to heat contraction can be reduced.

Also, it is preferable that the first primary joining step and the second primary joining step each include allowing a front surface of the cooling plate to come into surface contact with the back surface of the bottom part.

Also, it is preferable that the cooling plate includes a cooling flow passage in which the cooling medium flows, and the cooling flow passage has a planar shape which follows a movement locus of the rotary tool in the first primary joining step.

According to the manufacturing method, since the portion for which the frictional stirring is performed can be intensively cooled, a cooling efficiency of the liquid-cooled jacket can be increased.

Also, it is preferable that a cooling flow passage in which the cooling medium flows is composed of a cooling pipe embedded in the cooling plate. According to the manufacturing method, control of the cooling medium can be easily performed.

Also, it is preferable that the first primary joining step and the second primary joining step each include allowing a cooling medium to flow in a hollow section constituted by the jacket body and the sealing body, and performing frictional stirring while cooling the jacket body and the sealing body.

According to the manufacturing method, since frictional heat can be suppressed low, deformation of the liquid-cooled jacket due to heat contraction can be reduced. Moreover, the jacket body per se can be utilized to cool the jacket body and the sealing body, without using a cooling plate or the like.

Also, the present invention provides a liquid-cooled jacket including: a jacket body that has a bottom part, a peripheral wall part rising from a peripheral edge of the bottom part, and a columnar support rising from the bottom part; and a sealing body that is provided with a hole into which a head of the columnar support is inserted, and seals an opening of the jacket body, wherein the columnar support has a region into which a fitting member for fixing a heat-generating element to the liquid-cooled jacket is inserted; the peripheral wall part has a peripheral wall stepped portion on an inner peripheral edge thereof, and the columnar support has a columnar support stepped portion on the head thereof; and a first abutment portion in which a step side surface of the peripheral wall stepped portion and an outer peripheral side surface of the sealing body abut on each other, and a second abutment portion in which a step side surface of the columnar support stepped portion and a hole wall of the hole abut on each other, are joined together by frictional stirring, respectively.

Further, the present invention provides a liquid-cooled jacket including: a jacket body that has a bottom part, a peripheral wall part rising from a peripheral edge of the bottom part, and a columnar support rising from the bottom part; and a sealing body that seals an opening of the jacket body, wherein the columnar support has a region into which a fitting member for fixing a heat-generating element to the liquid-cooled jacket is inserted; the peripheral wall part has a peripheral wall stepped portion on an inner peripheral edge thereof; and a first abutment portion in which a step side surface of the peripheral wall stepped portion and an outer peripheral side surface of the sealing body abut on each other, and an overlapped portion in which a columnar support end face of the columnar support and a back surface of the sealing body are overlapped each other, are joined together by frictional stirring, respectively.

Moreover, the present invention provides a liquid-cooled jacket including: a jacket body that has a bottom part, a peripheral wall part rising from a peripheral edge of the bottom part, and a columnar support rising from the bottom part; and a sealing body that seals an opening of the jacket body, wherein the columnar support has a region into which a fitting member for fixing a heat-generating element to the liquid-cooled jacket is inserted; and a first overlapped portion in which a peripheral wall end face of the peripheral wall part and a back surface of the sealing body are overlapped each other, and a second overlapped portion in which a columnar support end face of the columnar support and the back surface of the sealing body are overlapped each other, are joined together by frictional stirring, respectively.

Furthermore, the present invention provides a liquid-cooled jacket including: a jacket body that has a bottom part, a peripheral wall part rising from a peripheral edge of the bottom part, and a columnar support rising from the bottom part; and a sealing body that is provided with a hole into which a head of the columnar support is inserted, and seals an opening of the jacket body, wherein the columnar support has a region into which a fitting member for fixing a heat-generating element to the liquid-cooled jacket is inserted, and has a step bottom surface and a step side surface rising from the step bottom surface, on an outer periphery of the head thereof; and an overlapped portion in which a peripheral wall end face of the peripheral wall part and a back surface of the sealing body are overlapped each other, and an abutment portion in which the step side surface of the columnar support and a hole wall of the hole abut on each other, are joined together by frictional stirring, respectively.

According to the configuration, since the sealing body is supported by the columnar support, and the sealing body and the columnar support are joined together by frictional stirring, the liquid-cooled jacket can be increased in deformation resistance. Also, since the columnar support is disposed within a hollow section of the liquid-cooled jacket, heat transport fluid is brought into contact with an outer peripheral surface of the columnar support. Therefore, heat transferred to the columnar support from the heat-generating element through the fitting member can be efficiently exhausted. In other words, heat leak can be prevented from arising through the fitting member that fixes the heat-generating element to the liquid-cooled jacket. Moreover, since the columnar support on which the heat-generating element is mounted is disposed inside the jacket body, the liquid-cooled jacket can be reduced in size.

Advantageous Effects of the Invention

The method of manufacturing a liquid-cooled jacket according to the present invention makes it possible to increase thermal conductivity and deformation resistance of the liquid-cooled jacket and to achieve a reduction in size of the liquid-cooled jacket.

BRIEF DESCRIPTION OF DRAWINGS

FIGS. 6A and 6B are cross-sectional views showing a manufacturing method for the liquid-cooled jacket according to the first embodiment, in which FIG. 6A shows a state before a placing step, and FIG. 6B shows a state after the placing step.

FIGS. 8A and 8B are views showing a first primary joining step in the manufacturing method for the liquid-cooled jacket according to the first embodiment, in which FIG. 8A is a plan view, and FIG. 8B is a cross-sectional view in FIG. 8A.

FIGS. 9A and 9B are views showing a second primary joining step in the manufacturing method for the liquid-cooled jacket according to the first embodiment, in which FIG. 9A is a plan view, and FIG. 9B is a cross-sectional view taken along the line II-II in FIG. 9A.

FIGS. 10A and 10B are cross-sectional views showing the manufacturing method for the liquid-cooled jacket according to the first embodiment, in which FIG. 10A shows a boring step, and FIG. 10B shows a mounting step.

FIG. 11 is a perspective view showing a first modification of the manufacturing method for the liquid-cooled jacket according to the first embodiment.

FIGS. 12A and 12B are views showing a second modification of the manufacturing method for the liquid-cooled jacket according to the first embodiment, in which FIG. 12A is a perspective view showing a table, and FIG. 12B is a perspective view showing a state in which the jacket body and the sealing body are fixed on the table.

FIG. 13 is an exploded perspective view showing a third modification of the manufacturing method for the liquid-cooled jacket according to the first embodiment.

FIGS. 17A and 17B are cross-sectional views showing a manufacturing method for the liquid-cooled jacket according to the second embodiment, in which FIG. 17A shows a state before a placing step, and FIG. 17B shows a state after the placing step.

FIGS. 19A and 19B are views showing a first primary joining step in the manufacturing method for the liquid-cooled jacket according to the second embodiment, in which FIG. 19A is a plan view, and FIG. 19B is a cross-sectional view in FIG. 19A.

FIGS. 20A and 20B are views showing a second primary joining step in the manufacturing method for the liquid-cooled jacket according to the second embodiment, in which FIG. 20A is a plan view, and FIG. 20B is a cross-sectional view taken along the line in FIG. 20A.

FIGS. 21A and 21B are cross-sectional views showing the manufacturing method for the liquid-cooled jacket according to the second embodiment, in which FIG. 21A shows a boring step, and FIG. 21B shows a mounting step.

FIGS. 23A and 23B are views showing a placing step in a manufacturing method for the liquid-cooled jacket according to the third embodiment, in which FIG. 23A is a plan view, and FIG. 23B is a cross-sectional view.

FIGS. 24A and 24B are views showing a first primary joining step in the manufacturing method for the liquid-cooled jacket according to the third embodiment, in which FIG. 24A is a plan view, and FIG. 24B is a cross-sectional view in FIG. 24A.

FIGS. 25A and 25B are views showing a second primary joining step in the manufacturing method for the liquid-cooled jacket according to the third embodiment, in which FIG. 25A is a plan view, and FIG. 25B is a cross-sectional view taken along the line IV-IV in FIG. 25A.

FIGS. 26A and 26B are cross-sectional views showing the manufacturing method for the liquid-cooled jacket according to the third embodiment, in which FIG. 26A shows a boring step, and FIG. 26B shows a mounting step.

FIGS. 30A and 30B are cross-sectional views showing a manufacturing method for the liquid-cooled jacket according to the fourth embodiment, in which FIG. 30A shows a state before a placing step, and FIG. 30B shows a state after the placing step.

FIGS. 32A and 32B are views showing a first primary joining step in the manufacturing method for the liquid-cooled jacket according to the fourth embodiment, in which FIG. 32A is a plan view, and FIG. 32B is a cross-sectional view in FIG. 32A.

FIGS. 33A and 33B are views showing a second primary joining step in the manufacturing method for the liquid-cooled jacket according to the fourth embodiment, in which FIG. 33A is a plan view, and FIG. 33B is a cross-sectional view taken along the line II-II in FIG. 33A.

FIGS. 34A and 34B are cross-sectional views showing the manufacturing method for the liquid-cooled jacket according to the fourth embodiment, in which FIG. 34A shows a boring step, and FIG. 34B shows a mounting step.

FIGS. 36A and 36B are views showing a second modification of the manufacturing method for the liquid-cooled jacket according to the fourth embodiment, in which FIG. 36A is a perspective view showing a table, and FIG. 36B is a perspective view showing a state in which the jacket body and the sealing body are fixed on the table.

FIG. 37 is an exploded perspective view showing a third modification of the manufacturing method for the liquid-cooled jacket according to the fourth embodiment.

FIG. 38 is a perspective view showing a state in which the jacket body and the sealing body are fixed on the table in the third modification of the manufacturing method for the liquid-cooled jacket according to the fourth embodiment.

FIGS. 41A and 41B are cross-sectional views showing a manufacturing method for the liquid-cooled jacket according to the fifth embodiment, in which FIG. 41A shows a state before a placing step, and FIG. 41B shows a state after the placing step.

FIGS. 43A and 43B are views showing a first primary joining step in the manufacturing method for the liquid-cooled jacket according to the fifth embodiment, in which FIG. 43A is a plan view, and FIG. 43B is a cross-sectional view in FIG. 43A.

FIGS. 44A and 44B are views showing a second primary joining step in the manufacturing method for the liquid-cooled jacket according to the fifth embodiment, in which FIG. 44A is a plan view, and FIG. 44B is a cross-sectional view taken along the line III-III in FIG. 44A.

FIGS. 45A and 45B are cross-sectional views showing the manufacturing method for the liquid-cooled jacket according to the fifth embodiment, in which FIG. 45A shows a boring step, and FIG. 45B shows a mounting step.

FIGS. 47A and 47B are views showing a first primary joining step in a manufacturing method for the liquid-cooled jacket according to the sixth embodiment, in which FIG. 47A is a plan view, and FIG. 47B is a cross-sectional view.

FIGS. 48A and 48B are views showing a second primary joining step in the manufacturing method for the liquid-cooled jacket according to the sixth embodiment, in which FIG. 48A is a plan view, and FIG. 48B is a cross-sectional view taken along the line IV-IV in FIG. 48A.

FIGS. 49A and 49B are cross-sectional views showing the manufacturing method for the liquid-cooled jacket according to the sixth embodiment, in which FIG. 49A shows a boring step, and FIG. 49B shows a mounting step.

DESCRIPTION OF EMBODIMENTS

First Embodiment

A liquid-cooled jacket and a method of manufacturing the liquid-cooled jacket according to a first embodiment of the present invention will be described in detail with reference to the drawings. First, description will be given of a primary joining rotary tool and a provisional joining rotary tool used in the present embodiment.

Figure 1A:
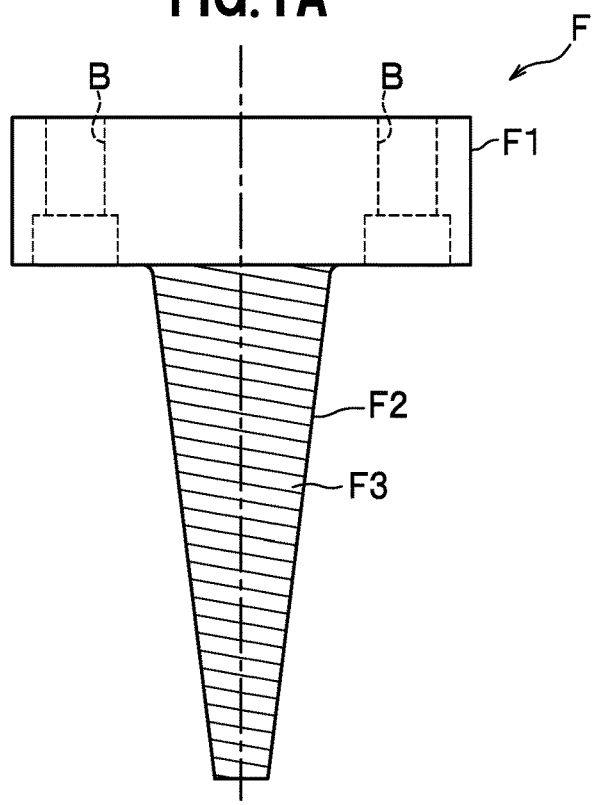
FIG. 1A is a side view showing a primary joining rotary tool used in embodiments of the present invention.

As shown in FIG. 1A, the primary joining rotary tool F is composed of a connection portion F1 and a stirring pin F2. The primary joining rotary tool F is formed of, for example, a tool steel. The connection portion F1 is a portion to be connected to a rotary shaft D of a friction stirring apparatus shown in FIG. 1B. The connection portion F1 has a cylindrical shape, and includes bolt holes B, B formed therein, to which bolts are fastened.

The stirring pin F2 hangs down from the connection portion F1, and is coaxial with the connection portion F1. The stirring pin F2 tapers off as it is away from the connection portion F1. The stirring pin F2 has a length greater than a plate thickness of a sealing body 3 to be described later. A spiral groove F3 is engraved on the outer circumferential surface of the stirring pin F2. In the present embodiment, the primary joining rotary tool F is adapted to be rotated clockwise, and thus the spiral groove F3 is formed counterclockwise from the base end toward the tip of the stirring pin F2. In other words, when tracing the spiral groove F3 from the base end to the tip, the spiral groove F3 is formed counterclockwise as viewed from above.

Note that, where the primary joining rotary tool F is rotated counterclockwise, the spiral groove F3 is preferably formed clockwise from the base end toward the tip of the stirring pin F2. In other words, when tracing the spiral groove F3 in this case from the base end to the tip, the spiral groove F3 is formed clockwise as viewed from above. The spiral groove F3 is set in this way to allow metal which is plasticized and fluidized during frictional stirring, to be introduced through the spiral groove F3 to the tip side of the stirring pin F2. This makes it possible to reduce the amount of metal spilling out of metal members to be joined together (a jacket body 2 to be described later and the sealing body 3).

Figure 1B:
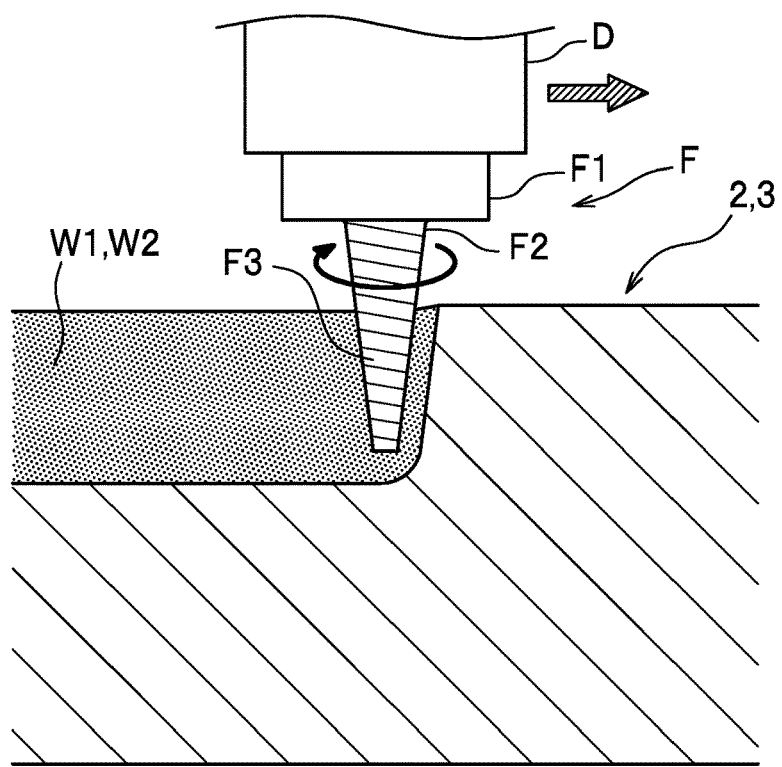
FIG. 1B is a schematic cross-sectional view showing the manner of joining by the primary joining rotary tool.

As shown in FIG. 1B, when friction stir welding is performed by means of the primary joining rotary tool F, the primary joining rotary tool F is moved in such a manner that only the stirring pin F2 in a rotating state is inserted into the metal members to be joined together and the connection portion F1 is kept away from the metal members to be joined together. In other words, the friction stir welding is performed with the base end portion of the stirring pin F2 being exposed. On a movement locus of the primary joining rotary tool F, a plasticized region W1 (or a plasticized region W2) is formed in which metal stirred by friction becomes hardened.

Figure 2A:
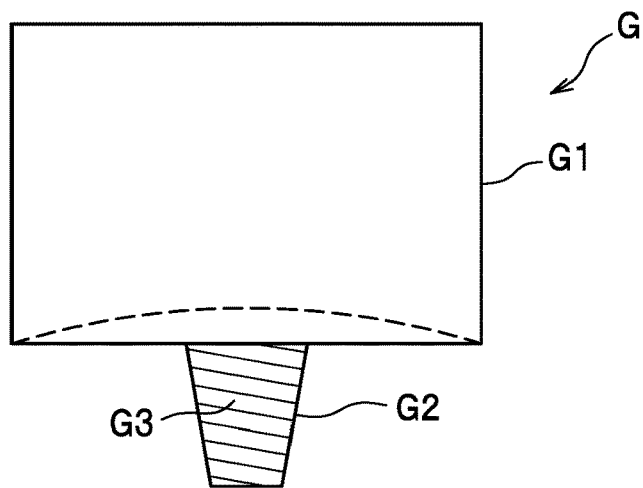
FIG. 2A is a side view showing a provisional joining rotary tool used in embodiments of the present invention.
Figure 2B:
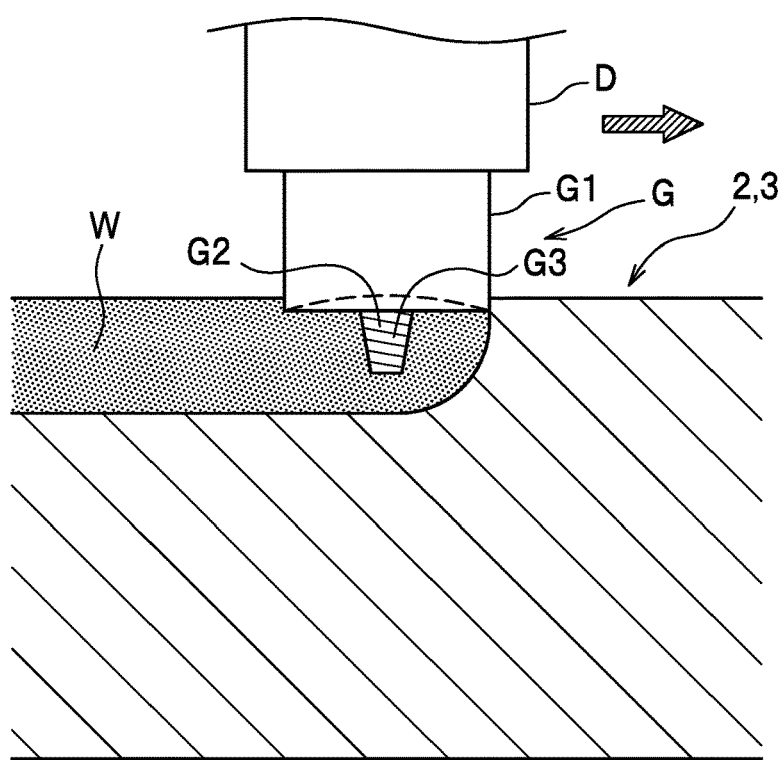
FIG. 2B is a schematic cross-sectional view showing the manner of joining by the provisional joining rotary tool.

As shown in FIG. 2A, the provisional joining rotary tool G is composed of a shoulder portion G1 and a stirring pin G2. The provisional joining rotary tool G is formed, for example, of a tool steel. As shown in FIG. 2B, the shoulder portion G1 is a portion to be connected to the rotary shaft D of the friction stirring apparatus, and is a portion to press the metal which is plasticized and fluidized. The shoulder portion G1 has a cylindrical shape. The shoulder portion G1 has a lower end surface which is concaved to prevent the fluidized metal from flowing outward.

The stirring pin G2 hangs down from the shoulder portion G1, and is coaxial with the shoulder portion G1. The stirring pin G2 tapers off as it is away from the shoulder portion G1. The stirring pin G2 has a spiral groove G3 engraved on the outer circumferential surface thereof.

As shown in FIG. 2B, when friction stir welding is performed by means of the provisional joining rotary tool G, the provisional joining rotary tool G is moved in such a manner that the stirring pin G2 and a lower end of the shoulder portion G1, which are in a rotating state, are inserted into the metal members to be joined together. On a movement locus of the provisional joining rotary tool G, a plasticized region W is formed in which metal stirred by friction becomes hardened.

Figure 3:
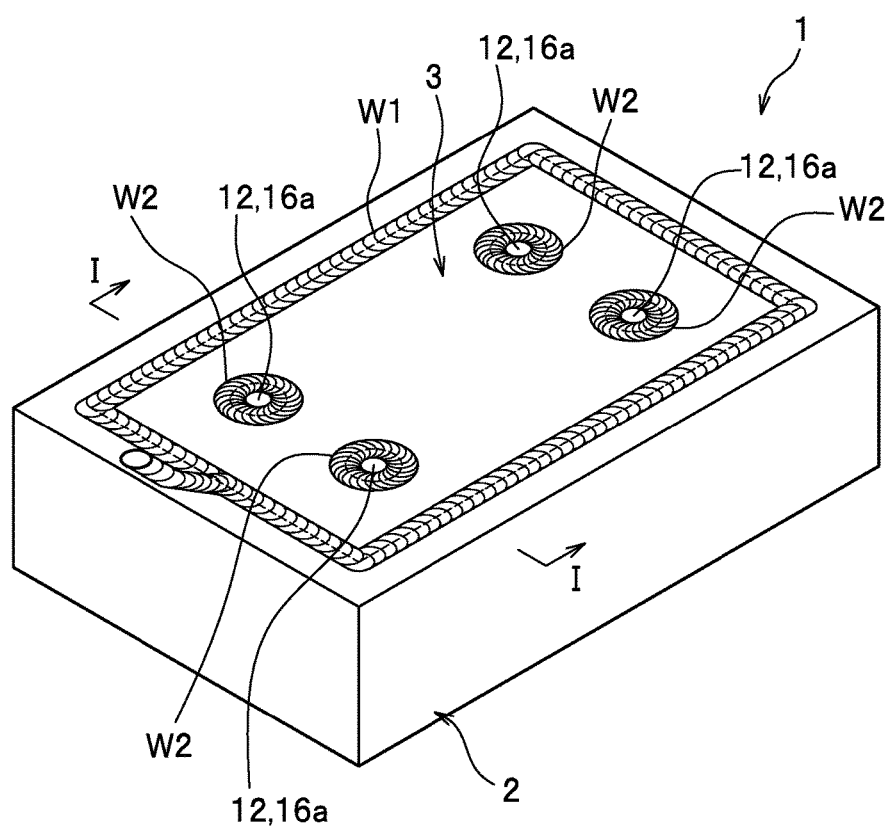
FIG. 3 is a perspective view of a liquid-cooled jacket according to a first embodiment of the present invention.

Next, description will be given of the liquid-cooled jacket according to the present embodiment. As shown in FIG. 3, a liquid-cooled jacket 1 according to the present embodiment is composed of the jacket body 2 and the sealing body 3, and has the form of a rectangular parallelepiped. The jacket body 2 and the sealing body 3 are integrated with each other by friction stir welding. The liquid-cooled jacket 1 has a hollow section formed therein, and heat transport fluid such as water is allowed to flow in the hollow section. The liquid-cooled jacket 1 allows heat transport fluid to flow in the hollow section, thereby making it possible to cool, for example, a heat-generating element mounted on the liquid-cooled jacket 1.

Figure 4:
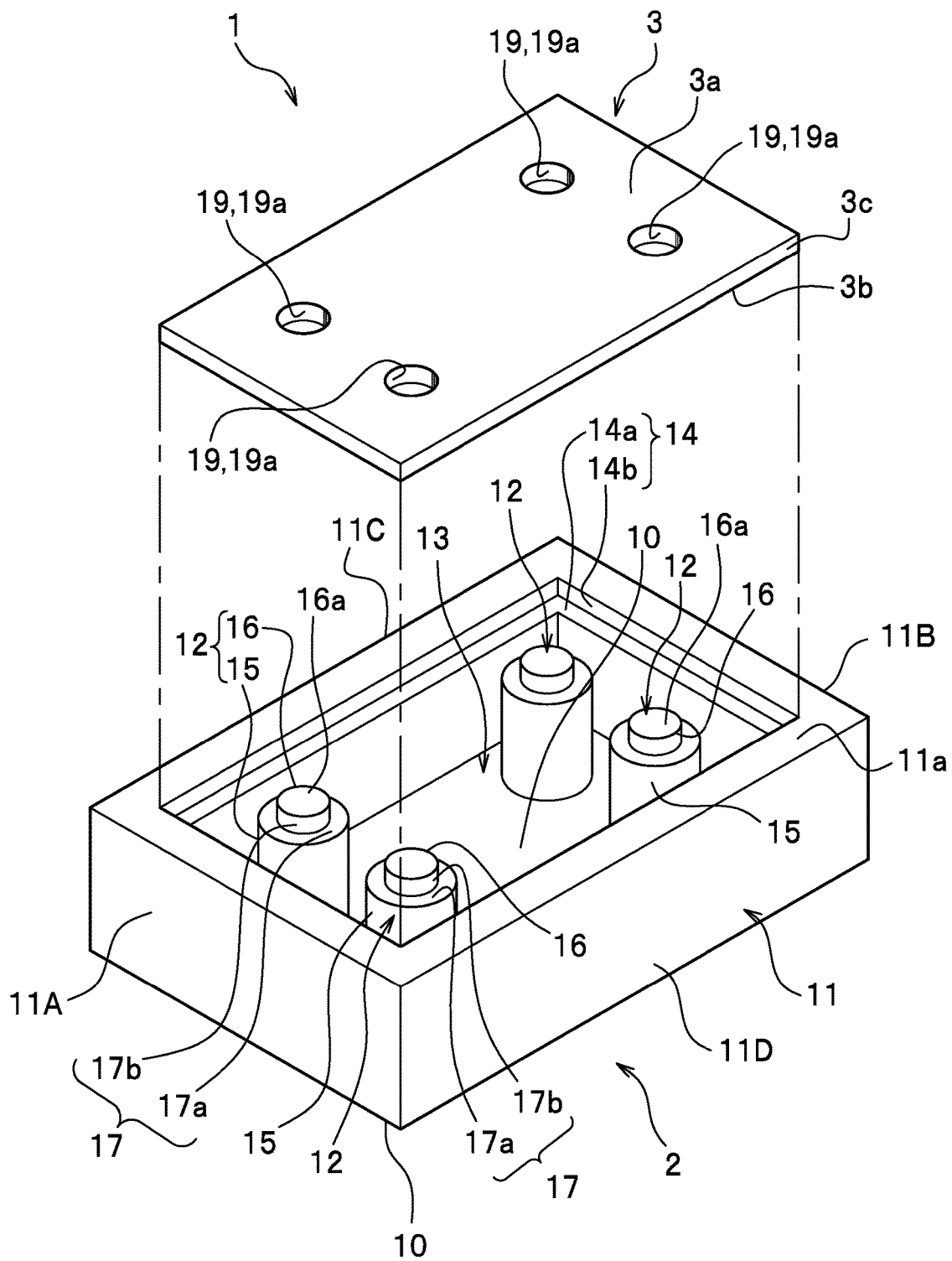
FIG. 4 is an exploded perspective view showing the liquid-cooled jacket according to the first embodiment of the present invention.

As shown in FIG. 4, the jacket body 2 is a box-shaped body which opens upward. The jacket body 2 includes a bottom part 10, a peripheral wall part 11, and a plurality of columnar supports 12. The jacket body 2 is formed of metal suitably selected from among metals capable of being stirred by friction, and aluminum or aluminum alloy is used as the metal in the present embodiment.

The bottom part 10 has the form of a rectangular plate in planar view. The peripheral wall part 11 is provided to stand on a peripheral edge of the bottom part 10, and has the form of a rectangular frame in planar view. The peripheral wall part 11 is composed of wall parts 11A, 11B, 11C and 11D, each having the same plate thickness. The wall parts 11A and 11B each form a short side part and face each other. Also, the wall parts 11C and 11D each form a long side part and face each other. The bottom part 10 and the peripheral wall part 11 defines a recess 13 formed inside.

The peripheral wall part 11 has a peripheral wall end face 11a on which a peripheral wall stepped portion 14 is formed along an inner peripheral edge of the peripheral wall part 11 of the jacket body 2. The peripheral wall stepped portion 14 is composed of a step bottom surface 14a, and a step side surface 14b rising from the step bottom surface 14a. The step bottom surface 14a is formed at a position below by one step from the peripheral wall end face 11a.

The columnar supports 12 are provided to stand on the bottom part 10 and have the form of a column. The number of the columnar supports 12 is not particularly limited as long as it is one or more, but four columnar supports 12 are formed in the present embodiment. The columnar supports 12 have the same shape, respectively. The columnar supports 12 are each composed of a large-diameter part 15, and a small-diameter part 16 provided to protrude from the top of the large-diameter part 15. The large-diameter part 15 and the small-diameter part 16 each have the form of a cylinder. A step between the large-diameter part 15 and the small-diameter part 16 forms a columnar support stepped portion 17.

The columnar support stepped portion 17 is composed of a step bottom surface 17a, and a step side surface 17b rising from the step bottom surface 17a. The small-diameter part 16 has an end face which forms a columnar support end face 16a. The step bottom surface 17a is formed at the same height position as the step bottom surface 14a of the peripheral wall stepped portion 14. Moreover, the columnar support end face 16a is formed at the same height position as the peripheral wall end face 11a.

The sealing body 3 is a plate-like member having the form of a rectangle in planar view, which seals the opening of the jacket body 2. Materials for the sealing body 3 are not particularly limited, but in the present embodiment, the sealing body 3 is formed of the same material as the jacket body 2. The sealing body 3 is formed with a size such that it can be placed on the peripheral wall stepped portion 14 with no substantial gap. A plate thickness dimension of the sealing body 3 is substantially the same as a height dimension of the step side surface 14b. The sealing body 3 has four holes 19 formed therein, which correspond to the columnar supports 12. The hole 19 has a circular form in planar view, into which the small-diameter part 16 is inserted.

Figure 5:
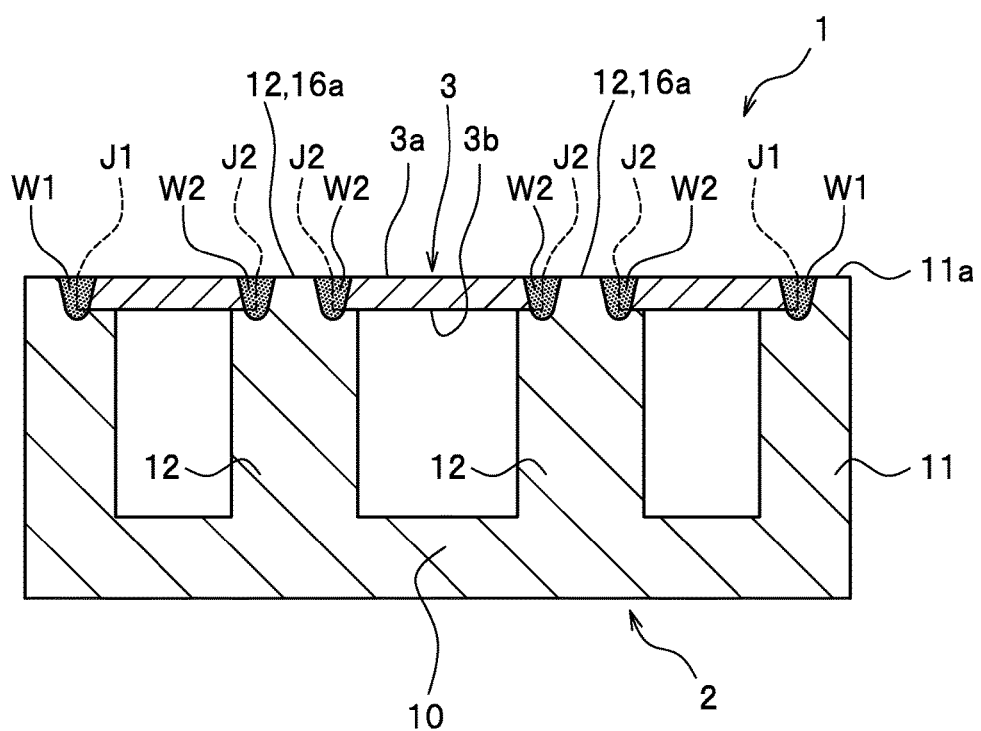
FIG. 5 is a cross-sectional view taken along the line I-I in FIG. 3.

As shown in FIG. 5, the liquid-cooled jacket 1 is one obtained by joining together the jacket body 2 and the sealing body 3 by frictional stirring to be integrated with each other. In the liquid-cooled jacket 1, a first abutment portion J1 in which the step side surface 14b of the peripheral wall stepped portion 14 and an outer peripheral side surface 3c of the sealing body 3 abut on each other, and four second abutment portions J2 in each of which the step side surface 17b of the columnar support stepped portion 17 and a hole wall 19a of the hole 19 abut on each other, are joined together by frictional stirring, respectively. The plasticized region W1 is formed on the first abutment portion J1, and the plasticized region W2 is formed on the second abutment portion J2. The liquid-cooled jacket 1 has a hollow section formed therein, in which heat transport fluid flows for transporting heat to the outside.

Next, description will be given of a manufacturing method for the liquid-cooled jacket according to the first embodiment (a manufacturing method for the liquid-cooled jacket with a heat-generating element). The manufacturing method for the liquid-cooled jacket includes a preparation step, a placing step, a fixing step, a provisional joining step, a first primary joining step, a second primary joining step, a boring step, a burring step, and a mounting step.

As shown in FIG. 4, the preparation step is a step of forming the jacket body 2 and the sealing body 3. The jacket body 2 is formed, for example, by die-casting.

Figure 6A:
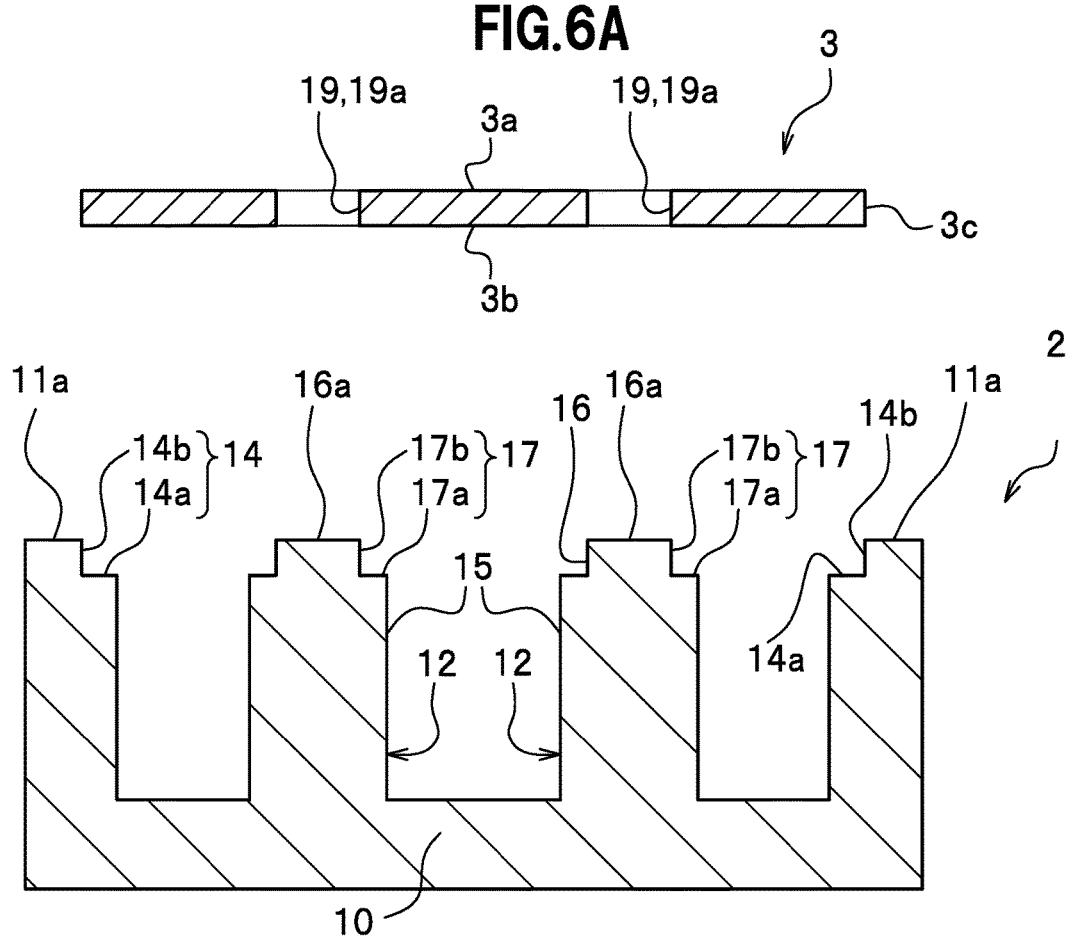
Figure 6B:
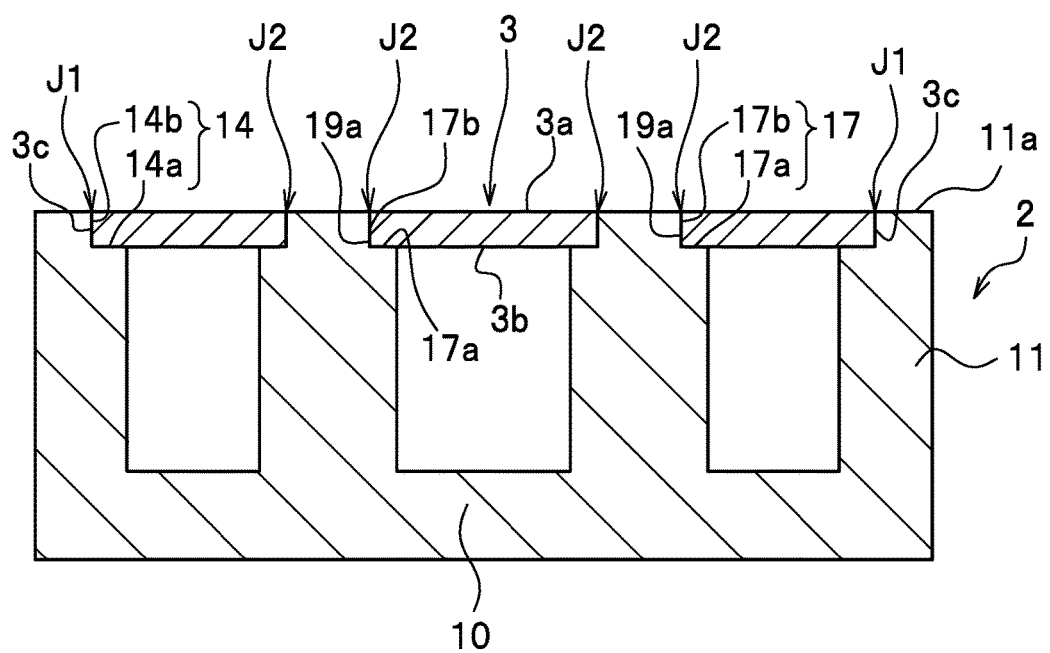

As shown in FIGS. 6A and 6B, the placing step is a step of placing the sealing body 3 on the jacket body 2 while allowing the small-diameter parts 16 of the columnar supports 12 to be inserted into the holes 19 of the sealing body 3. A back surface 3b of the sealing body 3 comes into surface contact with the step bottom surface 14a of the peripheral wall stepped portion 14 and the step bottom surface 17a of the columnar support stepped portion 17, respectively. The placing step allows the step side surface 14b of the peripheral wall stepped portion 14 and the outer peripheral side surface 3c of the sealing body 3 to abut on each other to form the first abutment portion J1. The first abutment portion J1 has a rectangular shape in planar view. Also, the placing step allows the step side surfaces 17b of the columnar support stepped portions 17 and the hole walls 19a of the holes 19 to abut on each other to form the second abutment portions J2. The second abutment portions J2 each have a circular shape in planar view.

In the fixing step, the jacket body 2 and the sealing body 3 are fixed on a table (not shown). The jacket body 2 and the sealing body 3 are immovably fixed on the table by means of a fixing tool such as a clamp.

Figure 7:
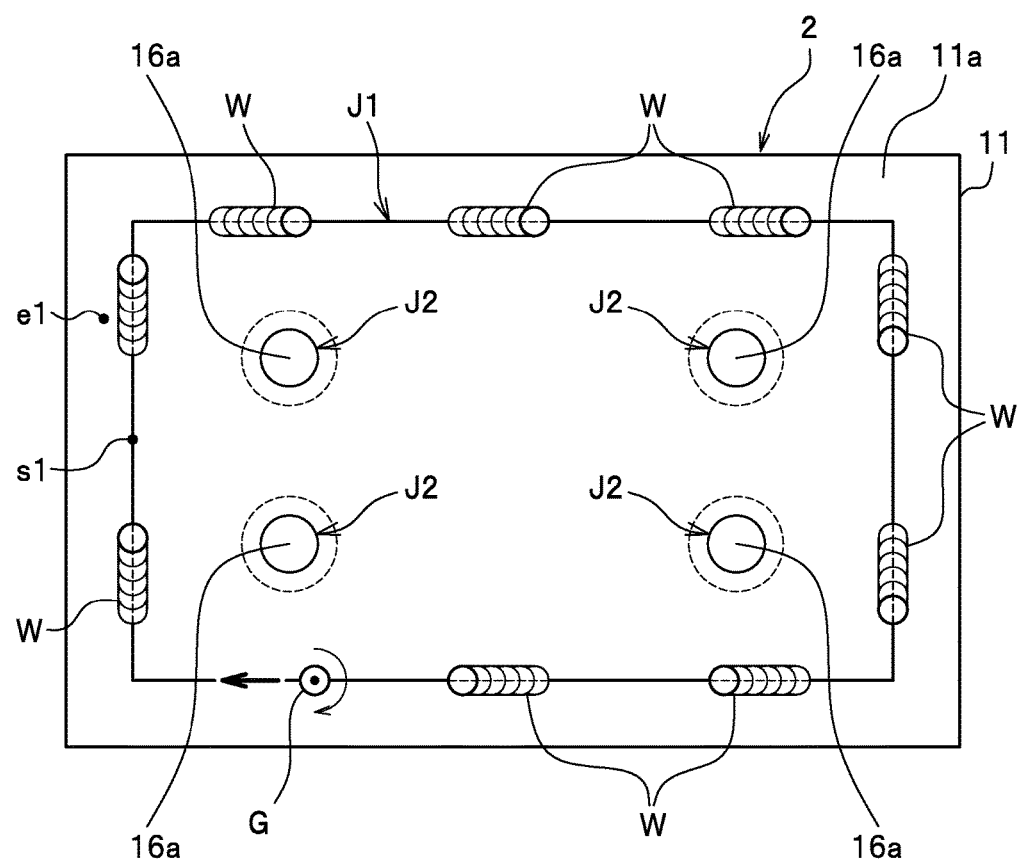
FIG. 7 is a plan view showing a provisional joining step in the manufacturing method for the liquid-cooled jacket according to the first embodiment.

As shown in FIG. 7, the provisional joining step is a step of provisionally joining the jacket body 2 and the sealing body 3 together. In the provisional joining step, friction stir welding is performed for the abutment portion J1 by means of the provisional joining rotary tool G. The plasticized region W is formed on the movement locus of the provisional joining rotary tool G. The provisional joining may be continuously performed, or may be intermittently performed as shown in FIG. 7. The provisional joining rotary tool G is of a compact size, thus allowing thermal deformation of the jacket body 2 and the sealing body 3 during the provisional joining to be decreased.

Figure 8A:
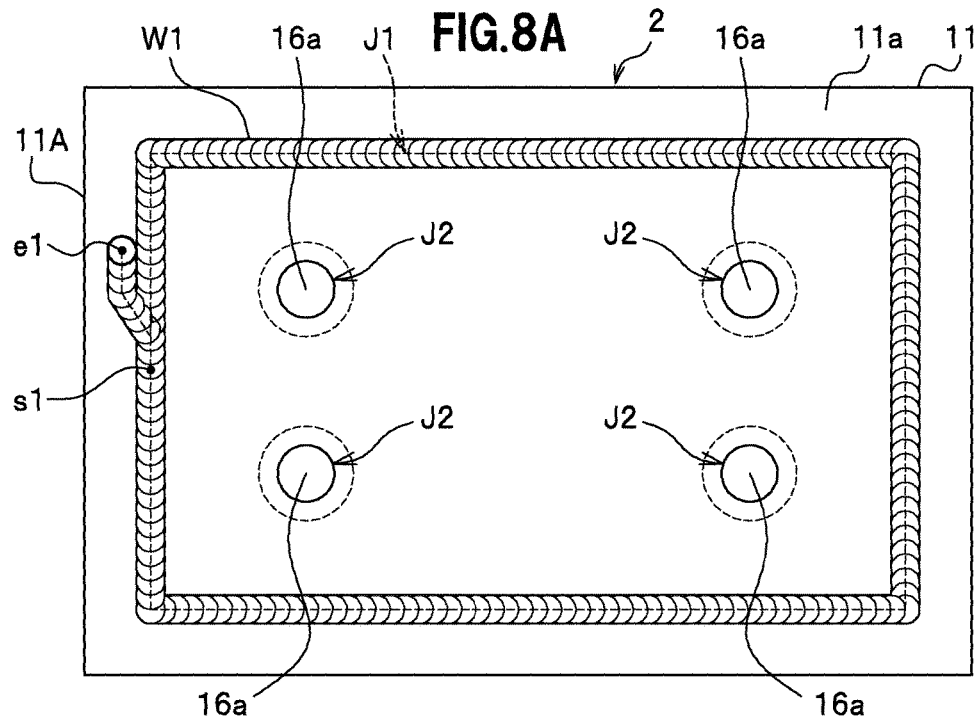
Figure 8B:
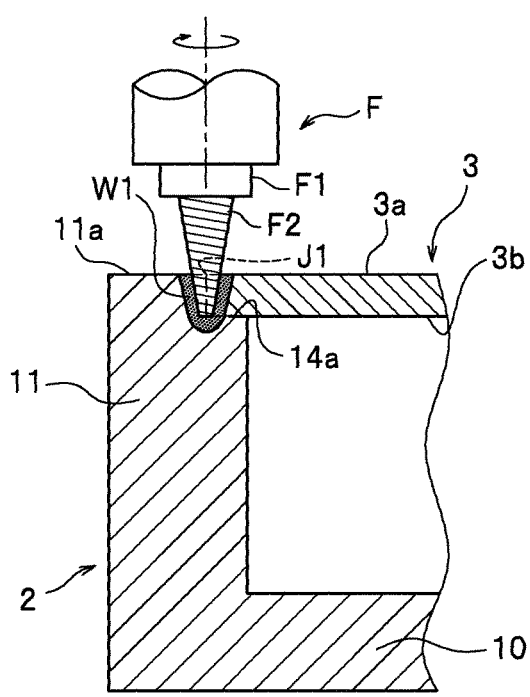

As shown in FIGS. 8A and 8B, the first primary joining step is a step of performing friction stir welding for the first abutment portion J1 by means of the primary joining rotary tool F. In the first primary joining step, the primary joining rotary tool F being rotated clockwise is inserted into an arbitrary starting position s1 set on the first abutment portion J1 and the primary joining rotary tool F is moved clockwise along the first abutment portion J1. That is, the primary joining rotary tool F is allowed to move one round clockwise along the peripheral edge of the sealing body 3.

As shown in FIG. 8B, an insertion depth of the stirring pin F2 is set to allow the tip of the stirring pin F2 to reach the step bottom surface 14a of the peripheral wall stepped portion 14, and set to allow only the stirring pin F2 to contact with the sealing body 3 and the peripheral wall part 11. Then, the primary joining rotary tool F is moved to trace the first abutment portion J1 with a constant height thereof being kept.

Where the primary joining rotary tool F is moved clockwise around the sealing body 3 as in the present embodiment, the primary joining rotary tool F is preferably rotated clockwise. On the other hand, where the primary joining rotary tool F is moved counterclockwise around the sealing body 3, the primary joining rotary tool F is preferably rotated counterclockwise.

There is a possibility that joining defects are generated on the left side in the direction of forward movement of a rotary tool when rotated clockwise, or on the right side in the direction of forward movement of the rotary tool when rotated counterclockwise. When such joining defects are formed in the sealing body 3 having a thin plate thickness, there is a risk that water-tightness and air-tightness are decreased. However, the movement direction and rotation direction of the primary joining rotary tool F are set as described above, allowing joining defects caused by the friction stir welding to be formed in the jacket body 2 having a relatively great thickness and to be formed at a position away from the hollow section of the liquid-cooled jacket 1, thus making it possible to suppress a decrease in water-tightness and air-tightness.

As shown in FIG. 8A, after the primary joining rotary tool F is allowed to move one round along the first abutment portion J1, it is allowed to pass through the starting position s1. Then, the primary joining rotary tool F is moved to an ending position e1 set on the peripheral wall end face 11a of the wall part 11A while shifting the primary joining rotary tool F to the outside. When reaching the ending position e1, the primary joining rotary tool F is moved upward to allow the primary joining rotary tool F to be pulled out from the wall part 11A.

Where a pull-out trace of the primary joining rotary tool F remains on the peripheral wall end face 11a of the wall part 11A after pulled out from the wall part 11A, a repairing step for repairing the pull-out trace may be performed. For the repairing step, for example, weld metal can be filled by buildup welding in the pull-out trace for the repairing. This allows the peripheral wall end face 11a to be made flat.

Note that, where the primary joining rotary tool F is pulled out from the peripheral wall part 11, for example, the primary joining rotary tool F may be gradually moved upward while moving the primary joining rotary tool F on the peripheral wall end face 11a of the peripheral wall part 11, to allow the insertion depth of the primary joining rotary tool F to be gradually reduced. This makes it possible to allow no pull-out trace after the first primary joining step to remain on the peripheral wall end face 11a, or if any, to reduce the pull-out trace.

Figure 9A:
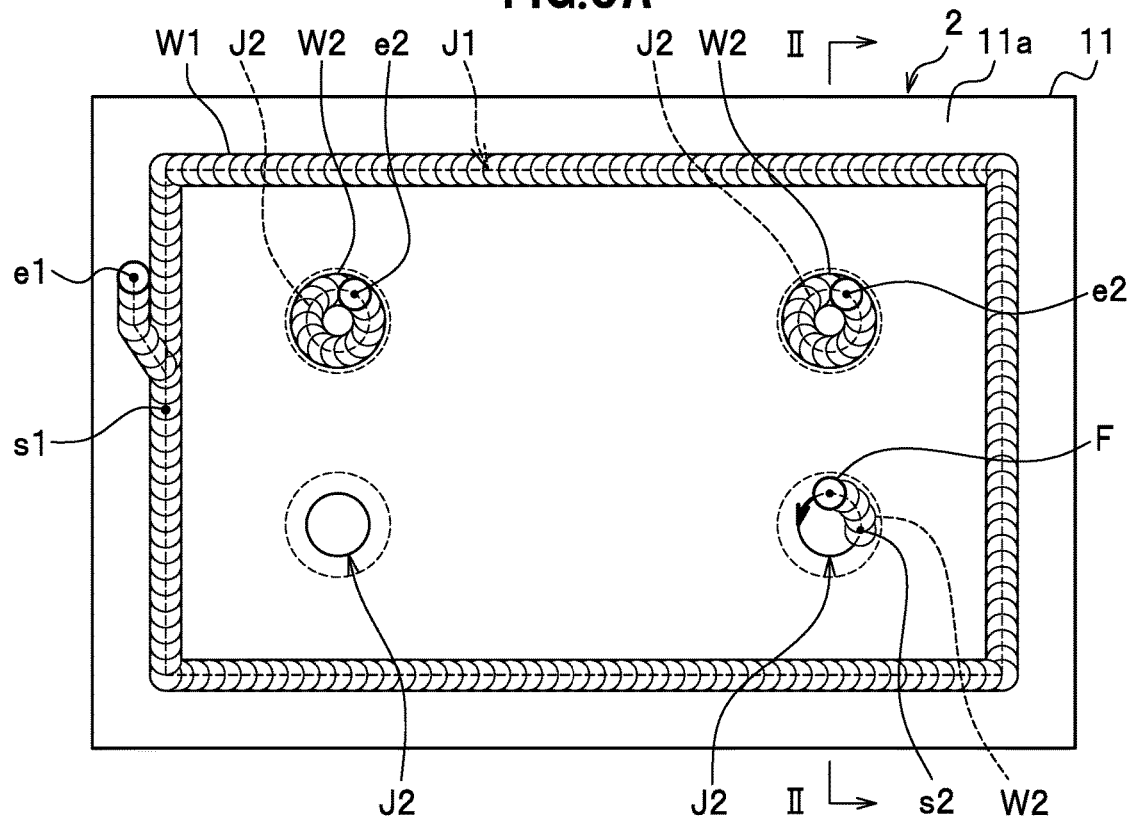
Figure 9B:
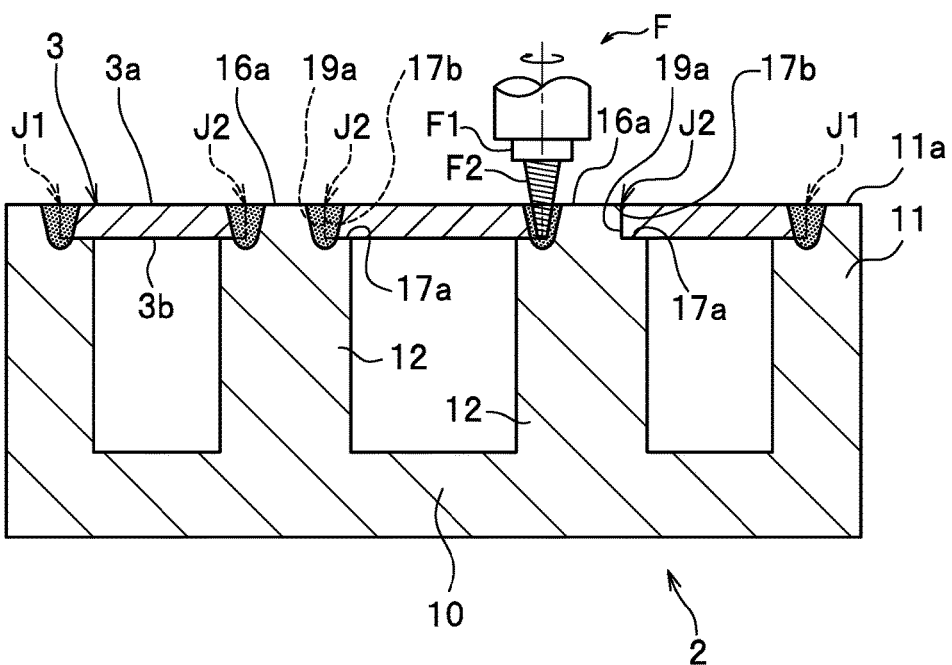

As shown in FIGS. 9A and 9B, the second primary joining step is a step of performing friction stir welding for each of the second abutment portions J2 by means of the primary joining rotary tool F. In the second primary joining step, the primary joining rotary tool F being rotated clockwise is inserted into an arbitrary starting position s2 set on the second abutment portion J2 and the primary joining rotary tool F is moved counterclockwise along the second abutment portion J2. The second primary joining step allows the plasticized region W2 to be formed on each of the second abutment portions J2.

As shown in FIG. 9B, an insertion depth of the stirring pin F2 is set to allow the tip of the stirring pin F2 to reach the step bottom surface 17a of the columnar support stepped portion 17, and set to allow only the stirring pin F2 to contact with the sealing body 3 and the columnar support 12. Then, the primary joining rotary tool F is moved to trace each of the second abutment portions J2 with a constant depth thereof being kept.

In the second primary joining step, where the primary joining rotary tool F is moved counterclockwise for the columnar support 12 as in the present embodiment, the primary joining rotary tool F is preferably rotated clockwise. On the other hand, where the primary joining rotary tool F is moved clockwise for the columnar support 12, the primary joining rotary tool F is preferably rotated counterclockwise. The movement direction and rotation direction of the primary joining rotary tool F are set as described above, allowing joining defects caused by the friction stir welding to be formed in the columnar support 12 having a relatively great thickness and to be formed at a position away from the hollow section of the liquid-cooled jacket 1, thus making it possible to suppress a decrease in water-tightness and air-tightness.

As shown in FIG. 9A, after the primary joining rotary tool F is allowed to move one round along the second abutment portion J2, it is allowed to pass through the starting position s2 as it is. Then, the primary joining rotary tool F is moved to an ending position e2 set on the second abutment portion J2, and when reaching the ending position e2, the primary joining rotary tool F is moved upward to allow the primary joining rotary tool F to be pulled out from the second abutment portion J2.

Where a pull-out trace of the primary joining rotary tool F remains on the second abutment portion J2 after pulled out from the second abutment portion J2, a repairing step for repairing the pull-out trace may be performed. For the repairing step, for example, weld metal can be filled by buildup welding in the pull-out trace for the repairing. This allows a front surface 3a of the sealing body 3 and the columnar support end face 16a of the columnar support 12 to be made flat.

Note that, where the primary joining rotary tool F is pulled out from the second abutment portion J2, the primary joining rotary tool F may be shifted to the center side of the columnar support 12 to be pulled out from the columnar support 12. Also, where the primary joining rotary tool F is pulled out from the second abutment portion J2, for example, the primary joining rotary tool F may be gradually moved upward while moving the primary joining rotary tool F on the second abutment portion J2 or on the columnar support end face 16a, to allow the insertion depth of the primary joining rotary tool F to be gradually reduced. This makes it possible to allow no pull-out trace after the second primary joining step to remain on the front surface 3a of the sealing body 3 and the columnar support end face 16a of the columnar support 12, or if any, to reduce the pull-out trace.

Figure 10A:
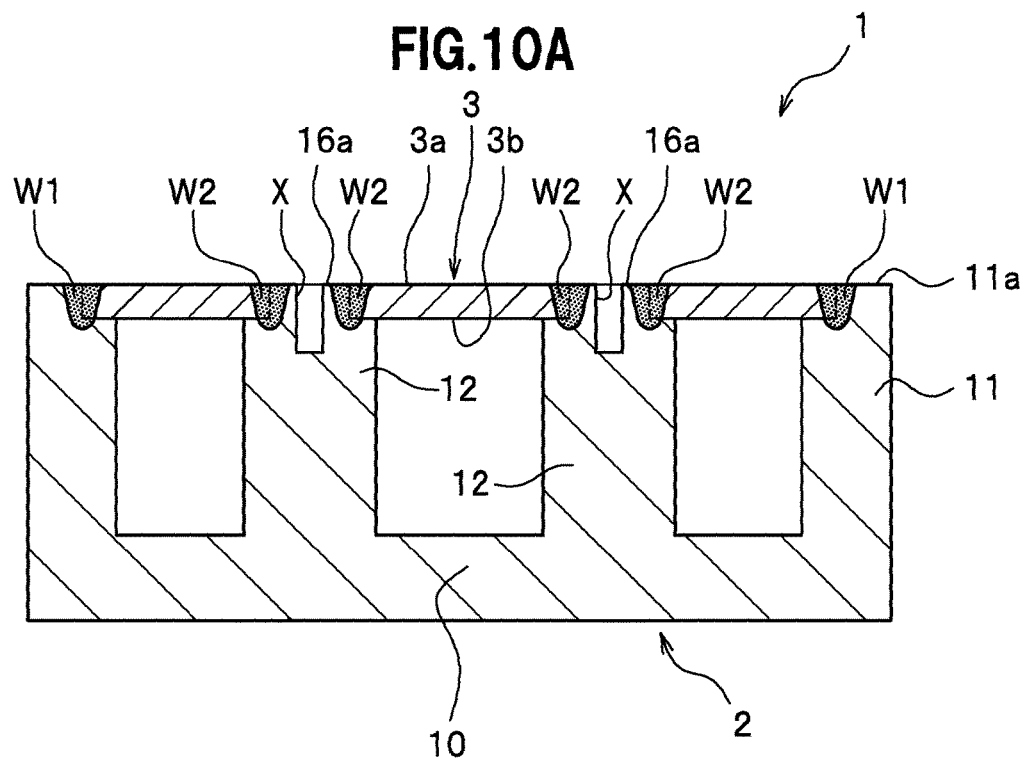

As shown in FIG. 10A, the boring step is a step of forming a fixing hole X for use in mounting a heat-generating element H, in each of the columnar supports 12. The fixing hole X is formed to reach the columnar support 12.

In the burring step, burrs are removed, which have been exposed on the surfaces of the jacket body 2 and the sealing body 3 in the first primary joining step, the second primary joining step, and the boring step. This allows the surfaces of the jacket body 2 and the sealing body 3 to be cleanly finished.

Figure 10B:
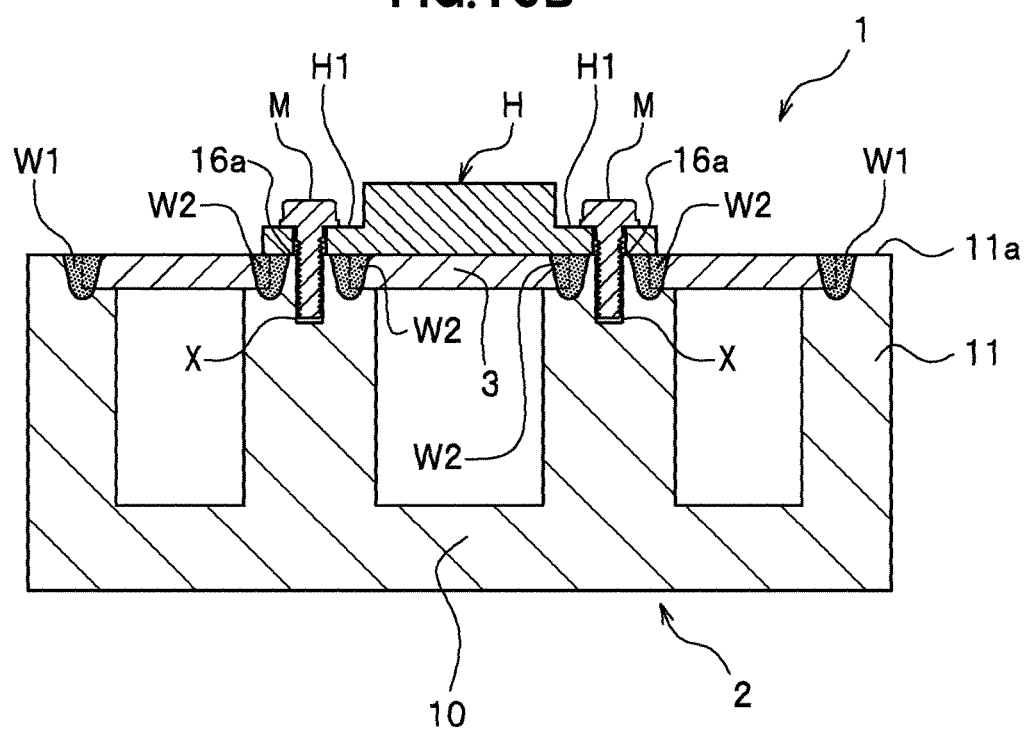

As shown in FIG. 10B, the mounting step is a step of mounting the heat-generating element H through fitting members M. When the heat-generating element H is mounted, it is fixed with the fitting members M such as screws while allowing through-holes formed in a flange H1 of the heat-generating element H to be communicated with the fixing holes X. The fitting member M is inserted to a position at which the columnar support 12 is reached.

Note that, although in the present embodiment, the fixing hole X is formed on the columnar support end face 16a to mount the heat-generating element H on the sealing body 3, a fixing hole that reaches the columnar support 12 may be formed in the bottom part 10 to mount the heat-generating element H on the bottom part 10. The heat-generating element H only needs to be mounted on at least one of the sealing body 3 and the bottom part 10. Also, although the fixing holes X are formed in the present embodiment, the heat-generating element H may be fixed with the fitting members M without forming the fixing holes X.

According to the manufacturing method for the liquid-cooled jacket described above, the sealing body 3 is supported by the columnar supports 12, and the sealing body 3 and the columnar supports 12 are joined together by frictional stirring, thus making it possible to increase deformation resistance of the liquid-cooled jacket 1. Also, according to the present embodiment, the columnar supports 12 are disposed in the hollow section within the liquid-cooled jacket 1, thus allowing heat transport fluid to be brought into contact with outer peripheral surfaces of the columnar supports 12. Therefore, heat transferred to the columnar supports 12 from the heat-generating element H through the fitting members M can be efficiently exhausted. In other words, heat leak can be prevented from arising through the fitting members M that fix the heat-generating element H to the liquid-cooled jacket 1. Moreover, since the columnar supports 12 to which the heat-generating element H is fixed are disposed inside the jacket body 2, the liquid-cooled jacket 1 can be reduced in size.

Moreover, in the first primary joining step and the second primary joining step, since the shoulder portion of the rotary tool is not inserted into the jacket body 2 and the sealing body 3, widths of the plasticized regions W1, W2 can be decreased as compared to the conventional art, and a pressing force which acts on the jacket body 2 and the sealing body 3 can be reduced. The conventional manufacturing method has required the width of the step bottom surface 14a of the peripheral wall stepped portion 14 to be set to be greater than at least the radius of the shoulder portion of the rotary tool. However, according to the present embodiment, even if the width of the step bottom surface 14a of the peripheral wall stepped portion 14 and the width of the step bottom surface 17a of the columnar support stepped portion 17 are decreased, the metal material can be prevented from escaping from inner corner portions constituted by the sealing body 3 and the peripheral wall part 11, or by the sealing body 3 and the columnar supports 12, thus improving a degree of freedom of designing.

Moreover, according to the manufacturing method for the liquid-cooled jacket according to the present embodiment, since only the stirring pin F2 is inserted into the jacket body 2 and the sealing body 3, a load exerted on the friction stirring apparatus can be reduced as compared to a case where the shoulder portion of the rotary tool is pressed into the jacket body and the sealing body, and operability of the primary joining rotary tool F is bettered. Also, since the load exerted on the friction stirring apparatus can be reduced, the joining can be performed down to a deep location of the first abutment portion J1 and the second abutment portion J2, with no great load exerted on the friction stirring apparatus.

Moreover, where the primary joining rotary tool F is pulled out on the sealing body 3 having a relatively small thickness, a problem occurs in that repairing for the pull-out trace is difficult and work for pulling out the rotary tool is not stabilized to generate defects in the sealing body 3. However, according to the manufacturing method for the liquid-cooled jacket according to the present embodiment, such a problem can be solved by pulling out the primary joining rotary tool F on the peripheral wall part 11 or the columnar support 12 having a great thickness as compared to the sealing body 3.

Moreover, according to the manufacturing method for the liquid-cooled jacket according to the present embodiment, the provisional joining step is performed prior to the first primary joining step, thereby making it possible to prevent gaps from being formed in the first abutment portion J1 and the second abutment portion J2 when performing the first primary joining step and the second primary joining step.

Also, the columnar supports 12 (columnar support end faces 16a) are exposed on the front surface 3a of the sealing body 3 in the present embodiment, thus making it possible to easily perform the boring step for boring the fixing holes X, and the mounting step for mounting the heat-generating element H. Moreover, since the columnar supports 12 and the heat-generating element H can be allowed to come into direct contact with each other, a cooling efficiency of the liquid-cooled jacket can be increased.

Although the manufacturing method for the liquid-cooled jacket according to the first embodiment of the present invention is described above, appropriate design changes or modification are possible within the scope not departing from the gist of the present invention. Although in the present embodiment the primary joining step is performed for the first abutment portion J1 and the second abutment portion J2 in this order, for example, the friction stir welding may be performed initially for the second abutment portion J2. Moreover, in the first primary joining step and the second primary joining step, the friction stir welding may be performed while allowing a cooling medium to flow within the jacket body 2 to cool the jacket body 2 and the sealing body 3. This makes it possible to suppress the frictional heat, thus reducing deformation of the liquid-cooled jacket 1 due to heat contraction. Also, this method makes it possible to utilize the jacket body 2 and the sealing body 3 per se to cool the jacket body 2 and the sealing body 3, without additionally using a cooling plate or a cooling unit.

Also, although the cross-sectional shape in planar view of the columnar support 12 is a circular shape in the present embodiment, it may be an elliptical shape or other polygonal shapes.

Moreover, although the provisional joining rotary tool G is used to perform the provisional joining in the first embodiment, the primary joining rotary tool F may be used to perform the provisional joining. This makes it possible to save time and effort for exchanging one rotary tool for another. Also, the provisional joining step only needs to be performed for at least one of the first abutment portion J1 and the second abutment portion J2. Further, the provisional joining step may be performed by welding.

[First Modification]

Next, description will be given of a manufacturing method for a liquid-cooled jacket according to a first modification of the first embodiment. As shown in FIG. 11, the first modification of the first embodiment is different from the first embodiment in that the provisional joining step, the first primary joining step and the second primary joining step are performed using a cooling plate. The first modification of the first embodiment will be described with a focus on configurations different from the first embodiment.

As shown in FIG. 11, in the first modification of the first embodiment, the jacket body 2 is fixed on a table K when performing the fixing step. The table K is composed of a substrate K1 having the form of a rectangular parallelepiped, clamps K3 each formed in four corners of the substrate K1, and a cooling pipe WP disposed within the substrate K1. The table K is a member that immovably fixes the jacket body 2 thereon and serves as a "cooling plate" set forth in the claims.

The cooling pipe WP is a tubular member embedded within the substrate K1. The cooling pipe WP is adapted to allow a cooling medium for cooling the substrate K1 to flow therein. A location of the cooling pipe WP, namely the form of a cooling flow passage allowing the cooling medium to flow therein, is not particularly limited, but in the first modification of the first embodiment, is of a planar shape which follows the movement locus of the primary joining rotary tool F in the first primary joining step. More specifically, the cooling pipe WP is disposed so that the cooling pipe WP and the first abutment portion J1 are nearly overlapped each other in planar view.

In the provisional joining step, the first primary joining step and the second primary joining step in the first modification of the first embodiment, the jacket body 2 is first fixed on the table K and friction stir welding is then performed while allowing a cooling medium to flow in the cooling pipe WP. This allows frictional heat generated in the frictional stirring to be suppressed low, thus making it possible to reduce deformation of the liquid-cooled jacket 1 due to heat contraction. Also, in the first modification of the first embodiment, since the cooling flow passage is disposed to overlap with the first abutment portion J1 (the movement locus of the provisional joining rotary tool G and the primary joining rotary tool F) in planar view, the portion in which the frictional heat is generated can be intensively cooled. This makes it possible to increase a cooling efficiency of the liquid-cooled jacket. Moreover, since the cooling pipe WP is disposed to allow a cooling medium to flow therein, control of the cooling medium can be easily performed. Furthermore, since the table K (cooling plate) and the jacket body 2 come into surface contact with each other, the cooling efficiency can be further increased.

Note that, in addition to cooling the jacket body 2 and the sealing body 3 using the table K (cooling plate), the friction stir welding may be performed while allowing a cooling medium to flow within the jacket body 2.

[Second Modification]

Figure 12A:
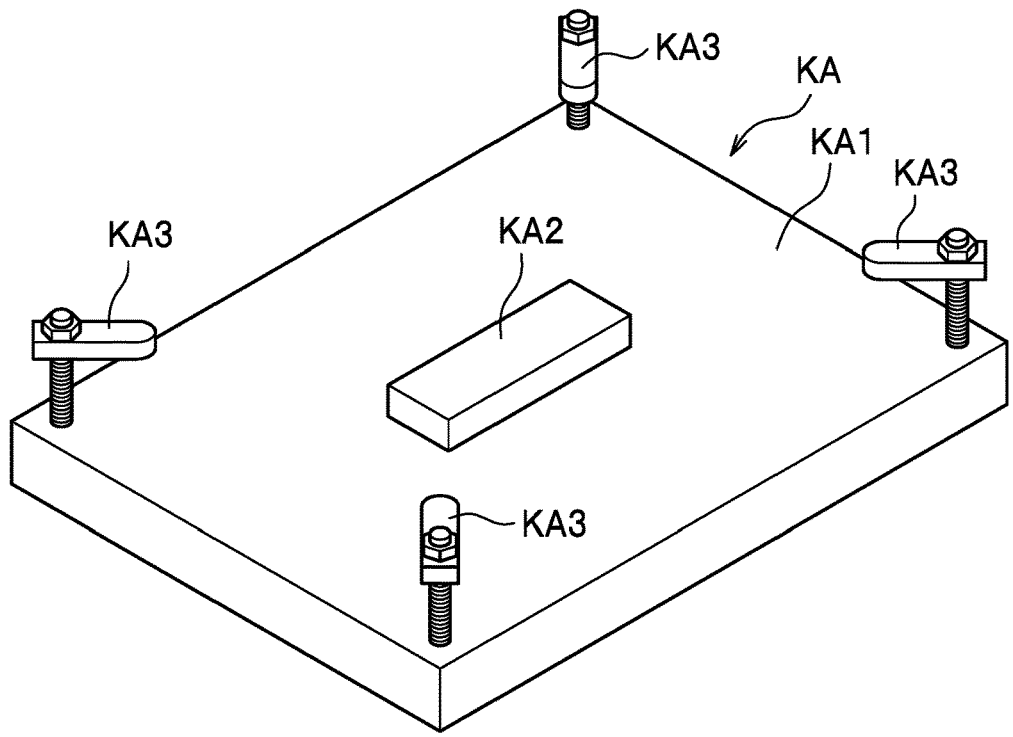
Figure 12B:
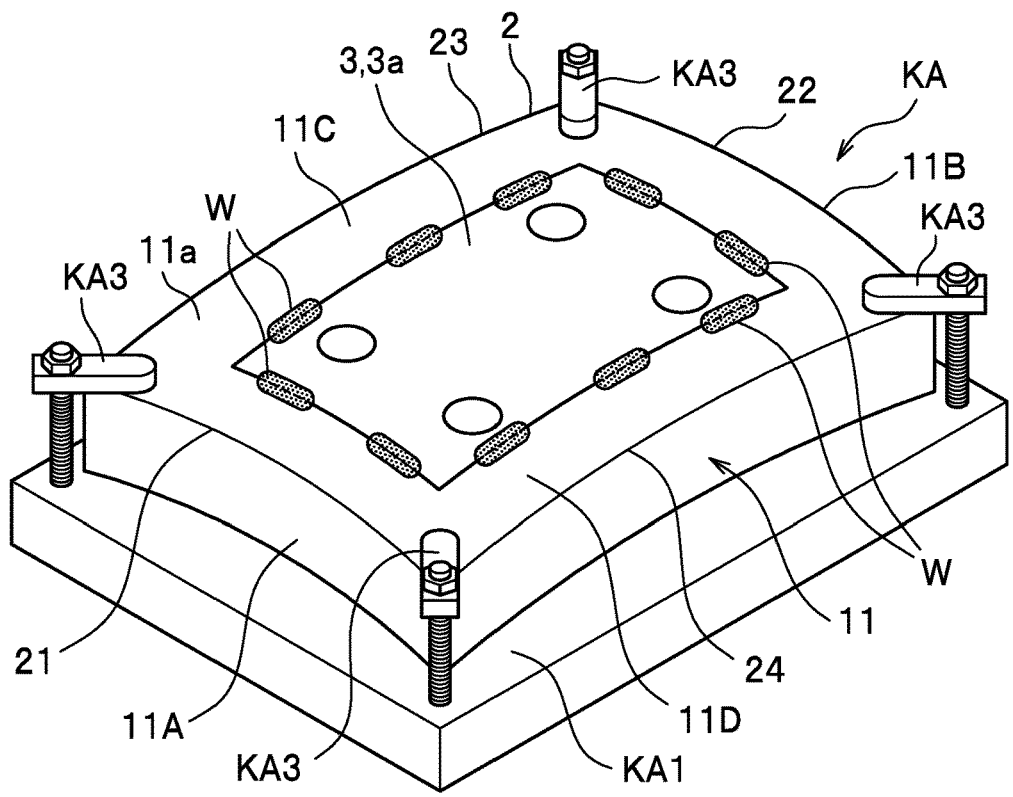

Next, description will be given of a manufacturing method for a liquid-cooled jacket according to a second modification of the first embodiment. As shown in FIGS. 12A and 12B, the second modification of the first embodiment is different from the first embodiment in that the first primary joining step and the second primary joining step are performed in a state in which the front surface side of the jacket body 2 and the front surface 3a of the sealing body 3 are curved to have a convex shape. The second modification of the first embodiment will be described with a focus on configurations different from the first embodiment.

As shown in FIGS. 12A and 12B, a table KA is employed in the second modification of the first embodiment. The table KA is composed of a substrate KA1 having the form of a rectangular parallelepiped, a spacer KA2 formed in the center of the substrate KA1, and clamps KA3 each formed in four corners of the substrate KA1. The spacer KA2 may be formed integrally with or separately from the substrate KA1.

In the fixing step in the second modification of the first embodiment, the jacket body 2 and the sealing body 3 integrated with each other in the provisional joining step are fixed on the table KA by means of the clamps KA3. As shown in FIG. 12B, when the jacket body 2 and the sealing body 3 are fixed on the table KA, they are curved to allow the bottom part 10 and the peripheral wall end face 11a of the jacket body 2 and the front surface 3a of the sealing body 3 to have an upwardly convex shape. More specifically, the jacket body 2 and the sealing body 3 are curved to allow a first side portion 21 of the wall part 11A of the jacket body 2, a second side portion 22 of the wall part 11B, a third side portion 23 of the wall part 11C, and a fourth side portion 24 of the wall part 11D to exhibit a curved line.

In the first primary joining step and the second primary joining step in the second modification of the first embodiment, the friction stir welding is performed by means of the primary joining rotary tool F. In the first primary joining step and the second primary joining step, the amount of deformation of at least one of the jacket body 2 and the sealing body 3 is measured beforehand and the friction stir welding is then performed while adjusting the insertion depth of the stirring pin F2 according to the amount of deformation. More specifically, the primary joining rotary tool F is moved to allow the movement locus thereof to trace a curved line along the curved surfaces of the peripheral wall end face 11a of the jacket body 2 and the front surface 3a of the sealing body 3. This makes it possible to keep the depth and width of the plasticized region W1, W2 constant.

There is a risk that heat input at the time of friction stir welding causes heat contraction to be generated in the plasticized region W1, W2 and the sealing body 3 of the liquid-cooled jacket 1 to be deformed into a concave shape. However, according to the first primary joining step and the second primary joining step in the second modification of the first embodiment, since the jacket body 2 and the sealing body 3 are fixed in the form of a convex shape beforehand so as to allow a tensile stress to act on the peripheral wall end face 11a and the front surface 3a, the liquid-cooled jacket 1 can be made flat by making use of the heat contraction after the friction stir welding. Moreover, where the primary joining step is performed by means of the conventional rotary tool, a problem occurs in that, when the jacket body 2 and the sealing body 3 are warped in the form of a convex shape, the shoulder portion of the rotary tool comes in contact with the jacket body 2 and the sealing body 3 and thus operability of the rotary tool is decreased. However, according to the second modification of the first embodiment, since the primary joining rotary tool F has no shoulder portion, operability of the primary joining rotary tool F is bettered even if the jacket body 2 and the sealing body 3 are warped in the form of a convex shape.

Note that the measurement of the amount of deformation of the jacket body 2 and the sealing body 3 can be made using a known height detecting device. Also, a friction stirring apparatus equipped with, for example, a detecting device that detects a height from the table KA to at least one of the jacket body 2 and the sealing body 3, may be used to perform the first primary joining step and the second primary joining step while detecting the amount of deformation of the jacket body 2 or the sealing body 3.

Moreover, although the jacket body 2 and the sealing body 3 are curved to allow all of the first to fourth side portions 21 to 24 to exhibit a curved line in the second modification of the first embodiment, the form of curves is not limited to this example. For example, the jacket body 2 and the sealing body 3 may be curved to allow the first side portion 21 and the second side portion 22 to exhibit a straight line and to allow the third side portion 23 and the fourth side portion 24 to exhibit a curved line. Also, for example, the jacket body 2 and the sealing body 3 may be curved to allow the first side portion 21 and the second side portion 22 to exhibit a curved line and to allow the third side portion 23 and the fourth side portion 24 to exhibit a straight line.

Moreover, although the position of height of the stirring pin F2 is changed according to the amount of deformation of the jacket body 2 or the sealing body 3 in the second modification of the first embodiment, the primary joining step may be performed with the height of the stirring pin F2 relative to the table KA being kept constant.

Moreover, the spacer KA2 may have any shape or form as long as the jacket body 2 and the sealing body 3 can be fixed to allow the front surface sides thereof to have a convex shape. Also, the spacer KA2 may be omitted as long as the jacket body 2 and the sealing body 3 can be fixed to allow the front surface sides thereof to have a convex shape. Further, the primary joining rotary tool F may be attached on, for example, a robot arm having a spindle unit or the like provided at a head thereof. According to the configuration, the central rotation axis of the primary joining rotary tool F can be easily changed with various angles.

[Third Modification]

Next, description will be given of a manufacturing method for a liquid-cooled jacket according to a third modification of the first embodiment. As shown in FIG. 13, the third modification of the first embodiment is different from the first embodiment in that the jacket body 2 and the sealing body 3 are formed to allow the front surface sides thereof to be curved into a convex shape beforehand in the preparation step. The third modification of the first embodiment will be described with a focus on configurations different from the first embodiment.

In the preparation step according to the third modification of the first embodiment, the jacket body 2 and the sealing body 3 are formed by die-casting to allow the front surface sides thereof to be curved into a convex shape. This allows the jacket body 2 to be formed to allow the bottom part 10 and the peripheral wall part 11 to have an upwardly convex shape, respectively. Also, the sealing body 3 is formed to allow the front surface 3a thereof to have an upwardly convex shape.

Figure 14:
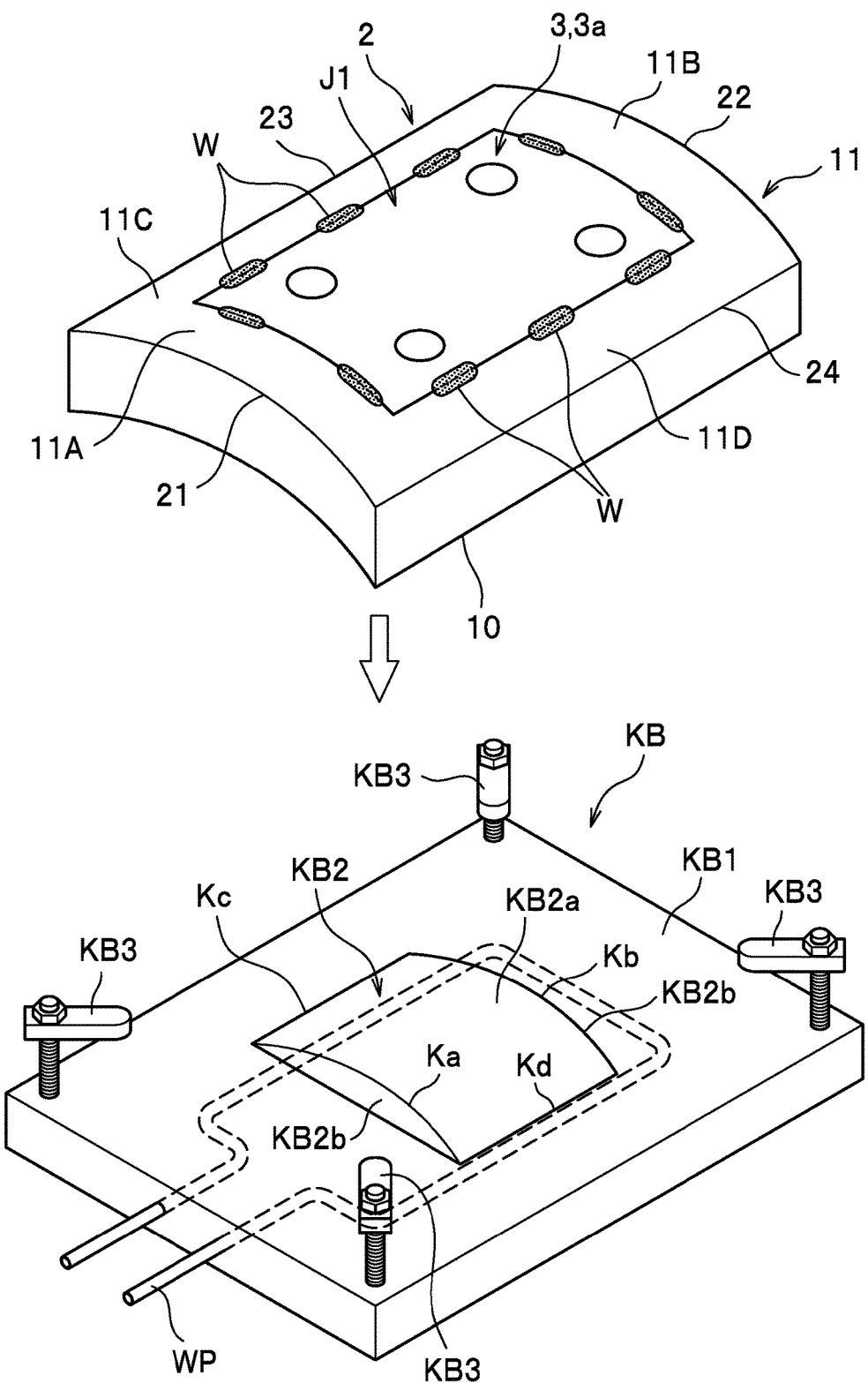
FIG. 14 is a perspective view showing a state in which the jacket body and the sealing body are fixed on the table in the third modification of the manufacturing method for the liquid-cooled jacket according to the first embodiment.

As shown in FIG. 14, in the third modification of the first embodiment, the jacket body 2 and the sealing body 3 provisionally joined together are fixed on a table KB when performing the fixing step. The table KB is composed of a substrate KB1 in the form of a rectangular parallelepiped, a spacer KB2 disposed in the center of the substrate KB1, clamps KB3 each formed in four corners of the substrate KB1, and a cooling pipe WP embedded inside the substrate KB1. The table KB is a member that immovably fixes the jacket body 2 thereon and serves as a "cooling plate" set forth in the claims.

The spacer KB2 is composed of a curved surface KB2a curved to have an upwardly convex shape, and elevation surfaces KB2b, KB2b formed at both ends of the curved surface KB2a and rising from the substrate KB1. The spacer KB2 has a first side portion Ka and a second side portion Kb which exhibit a curved line, and a third side portion Kc and a fourth side portion Kd which exhibit a straight line.

The cooling pipe WP is a tubular member embedded within the substrate KB1. The cooling pipe WP is adapted to allow a cooling medium for cooling the substrate KB1 to flow therein. A location of the cooling pipe WP, namely the form of a cooling flow passage allowing the cooling medium to flow therein, is not particularly limited, but in the third modification of the first embodiment, is of a planar shape which follows the movement locus of the primary joining rotary tool F in the first primary joining step. More specifically, the cooling pipe WP is disposed so that the cooling pipe WP and the first abutment portion J1 are nearly overlapped each other in planar view.

In the fixing step according to the third modification of the first embodiment, the jacket body 2 and the sealing body 3 integrated with each other in the provisional joining step are fixed on the table KB by means of the clamps KB3. More specifically, the jacket body 2 and the sealing body 3 are fixed on the table KB to allow the back surface of the bottom part 10 of the jacket body 2 to come into surface contact with the curved surface KB2a. When the jacket body 2 and the sealing body 3 are fixed on the table KB, they are curved to allow the first side portion 21 of the wall part 11A of the jacket body 2 and the second side portion 22 of the wall part 11B to exhibit a curved line, and to allow the third side portion 23 of the wall part 11C and the fourth side portion 24 of the wall part 11D to exhibit a straight line.

In the first primary joining step and the second primary joining step in the third modification of the first embodiment, the friction stir welding is performed for the first abutment portion J1 and the second abutment portion J2, respectively, by means of the primary joining rotary tool F. In the first primary joining step and the second primary joining step, the amount of deformation of at least one of the jacket body 2 and the sealing body 3 is measured beforehand and the friction stir welding is then performed while adjusting the insertion depth of the stirring pin F2 according to the amount of deformation. More specifically, the primary joining rotary tool F is moved to allow the movement locus thereof to trace a curved line or a straight line along the peripheral wall end face 11a of the jacket body 2 and the front surface 3a of the sealing body 3. This makes it possible to keep the depth and width of the plasticized region W1 constant.

There is a risk that heat input at the time of friction stir welding causes heat contraction to be generated in the plasticized region W1, W2 and the sealing body 3 of the liquid-cooled jacket 1 to be deformed into a concave shape. However, according to the first primary joining step and the second primary joining step in the third modification of the first embodiment, since the jacket body 2 and the sealing body 3 are formed into a convex shape beforehand, the liquid-cooled jacket 1 can be made flat by making use of the heat contraction after the friction stir welding.

Moreover, in the third modification of the first embodiment, the curved surface KB2a of the spacer KB2 is allowed to come into surface contact with the back surface which is in a concave shape, of the bottom part 10 of the jacket body 2. This makes it possible to perform the friction stir welding while cooling the jacket body 2 and the sealing body 3 more effectively. Since the frictional heat generated in the friction stir welding can be suppressed low, deformation of the liquid-cooled jacket due to heat contraction can be reduced. This makes it possible to reduce a curvature of the jacket body 2 and the sealing body 3 when the jacket body 2 and the sealing body 3 are formed into a convex shape in the preparation step.

Note that the measurement of the amount of deformation of the jacket body 2 and the sealing body 3 can be made using a known height detecting device. Also, a friction stirring apparatus equipped with, for example, a detecting device that detects a height from the table KB to at least one of the jacket body 2 and the sealing body 3, may be used to perform the primary joining step while detecting the amount of deformation of the jacket body 2 or the sealing body 3.

Moreover, although the jacket body 2 and the sealing body 3 are curved to allow the first side portion 21 and the second side portion 22 to exhibit a curved line in the third modification of the first embodiment, the form of curves is not limited to this example. For example, the spacer KB2 having a spherical surface may be formed to allow the back surface of the bottom part 10 of the jacket body 2 to come into surface contact with the spherical surface. In this case, when the jacket body 2 is fixed on the table KB, all of the first to fourth side portions 21 to 24 exhibit a curved line.

Moreover, although the position of height of the stirring pin F2 is changed according to the amount of deformation of the jacket body 2 or the sealing body 3 in the third modification of the first embodiment, the primary joining step may be performed with the height of the stirring pin F2 relative to the table KB being kept constant.

Second Embodiment

Figure 15:
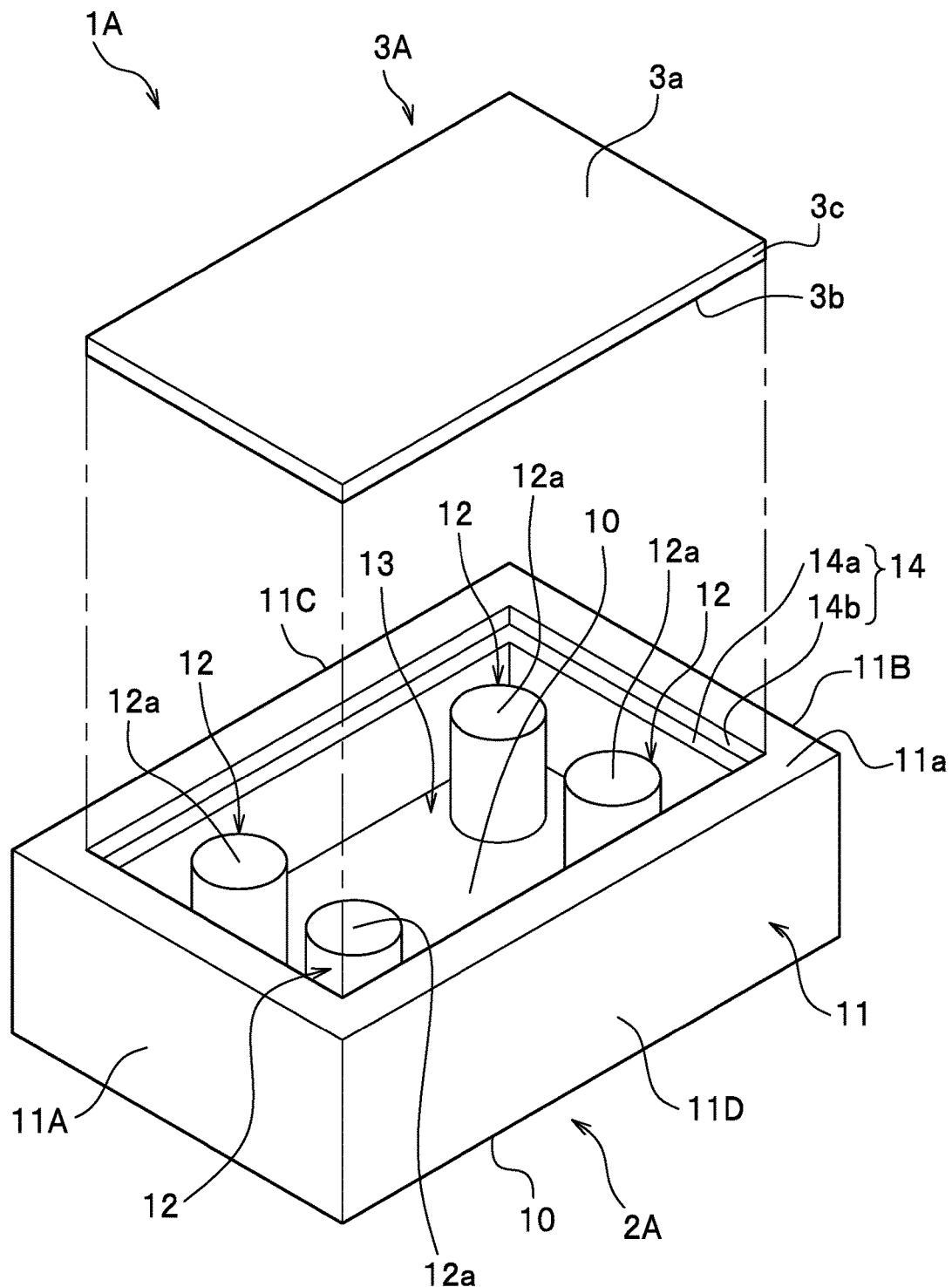
FIG. 15 is an exploded perspective view showing a liquid-cooled jacket according to a second embodiment.

Next, description will be given of a method of manufacturing a liquid-cooled jacket according to a second embodiment of the present invention. As shown in FIG. 15, the second embodiment is different from the first embodiment in that the columnar support 12 has no columnar support stepped portion formed thereon. The method of manufacturing the liquid-cooled jacket according to the second embodiment will be described with a focus on configurations different from the first embodiment.

A liquid-cooled jacket 1A according to the second embodiment is composed of a jacket body 2A and a sealing body 3A. The jacket body 2A is a box-shaped body which opens upward. The jacket body 2A includes a bottom part 10, a peripheral wall part 11, and a plurality of columnar supports 12. The bottom part 10 has the form of a rectangle in planar view. The peripheral wall part 11 is composed of wall parts 11A, 11B, 11C and 11D, each having the same plate thickness.

The peripheral wall part 11 has a peripheral wall end face 11a on which a peripheral wall stepped portion 14 is formed along a peripheral edge of the opening of the jacket body 2A. The peripheral wall stepped portion 14 is composed of a step bottom surface 14a, and a step side surface 14b rising from the step bottom surface 14a. The step bottom surface 14a is formed at a position below by one step from the peripheral wall end face 11a.

The columnar supports 12 are provided to stand on the bottom part 10 and have the form of a column. The number of the columnar supports 12 is not particularly limited as long as it is one or more, but four columnar supports 12 are formed in the present embodiment. The columnar supports 12 have the same shape, respectively. The columnar support 12 has a columnar support end face 12a which is formed at the same height position as the step bottom surface 14a of the peripheral wall stepped portion 14.

The sealing body 3A is a plate-like member having the form of a rectangle in planar view. Materials for the sealing body 3A are not particularly limited, but in the present embodiment, the sealing body 3A is formed of the same material as the jacket body 2A. The sealing body 3A is formed with a size such that it can be placed on the peripheral wall stepped portion 14 with no substantial gap. A plate thickness dimension of the sealing body 3A is substantially the same as a height dimension of the step side surface 14b.

Figure 16:
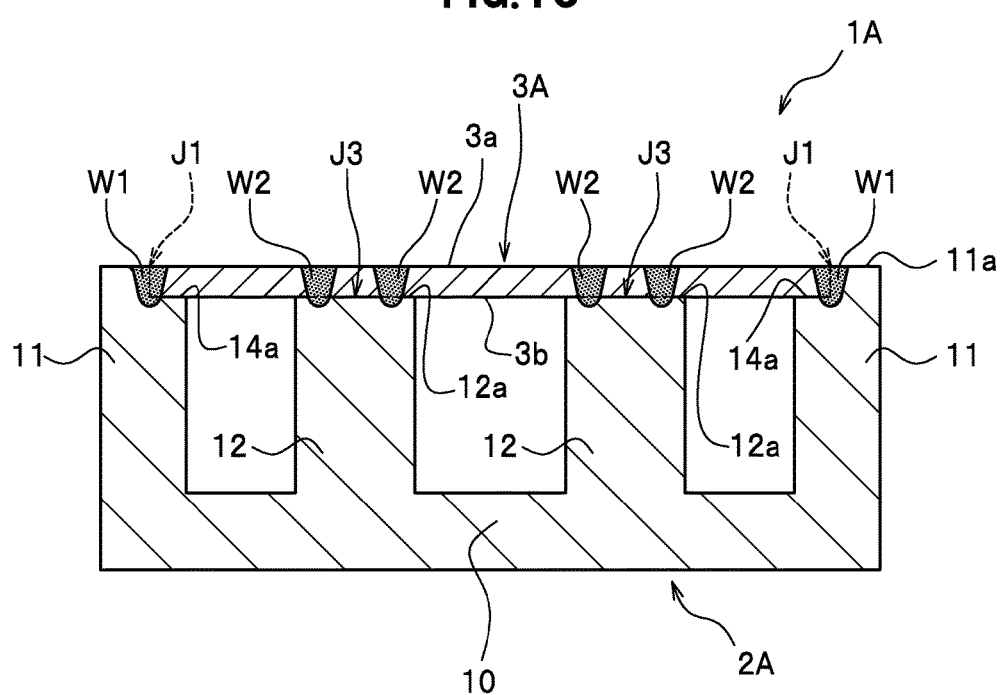
FIG. 16 is a cross-sectional view showing the liquid-cooled jacket according to the second embodiment.

As shown in FIG. 16, the liquid-cooled jacket 1A is one obtained by joining together the jacket body 2A and the sealing body 3A by frictional stirring to be integrated with each other. In the liquid-cooled jacket 1A, a first abutment portion J1 in which the step side surface 14b (see FIG. 15) of the peripheral wall stepped portion 14 and an outer peripheral side surface 3c of the sealing body 3A abut on each other, and four overlapped portions J3 in each of which the back surface 3b of the sealing body 3A and the columnar support end face 12a of the columnar support 12 are overlapped each other, are joined together by frictional stirring, respectively. The plasticized region W1 is formed on the first abutment portion J1, and the plasticized region W2 is formed on the overlapped portion J3. The liquid-cooled jacket 1A has a hollow section formed therein, in which heat transport fluid flows for transporting heat to the outside.

Next, description will be given of a manufacturing method for the liquid-cooled jacket according to the second embodiment (a manufacturing method for the liquid-cooled jacket with a heat-generating element). The manufacturing method for the liquid-cooled jacket includes a preparation step, a placing step, a fixing step, a provisional joining step, a first primary joining step, a second primary joining step, a boring step, a burring step, and a mounting step.

As shown in FIG. 15, the preparation step is a step of forming the jacket body 2A and the sealing body 3A. The jacket body 2A is formed, for example, by die-casting.

As shown in FIGS. 17A and 17B, the placing step is a step of placing the sealing body 3A on the jacket body 2A. The back surface 3b of the sealing body 3A comes into surface contact with the step bottom surface 14a of the peripheral wall stepped portion 14 and the columnar support end face 12a of the columnar support 12, respectively. The placing step allows the step side surface 14b of the peripheral wall stepped portion 14 and the outer peripheral side surface 3c of the sealing body 3A to abut on each other to form the first abutment portion J1. The first abutment portion J1 has a rectangular shape in planar view. Also, the placing step allows the back surface 3b of the sealing body 3A and the columnar support end faces 12a of the columnar supports 12 to be overlapped each other to form the overlapped portions J3. The overlapped portions J3 each have a circular shape in planar view.

In the fixing step, the jacket body 2A is fixed on a table (not shown). The jacket body 2A is immovably fixed on the table by means of a fixing tool such as a clamp.

Figure 18:
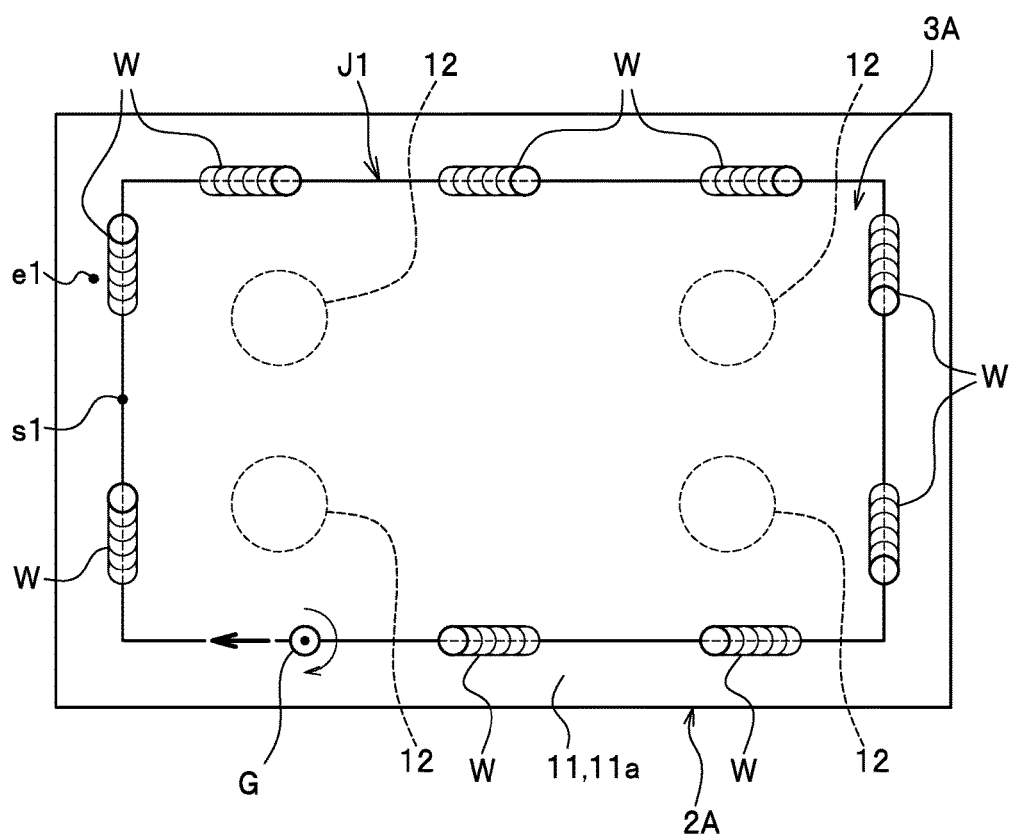
FIG. 18 is a plan view showing a provisional joining step in the manufacturing method for the liquid-cooled jacket according to the second embodiment.

As shown in FIG. 18, the provisional joining step is a step of provisionally joining the jacket body 2A and the sealing body 3A together. The provisional joining step is the same as that in the first embodiment, and thus explanation thereof is omitted.

Figure 19A:
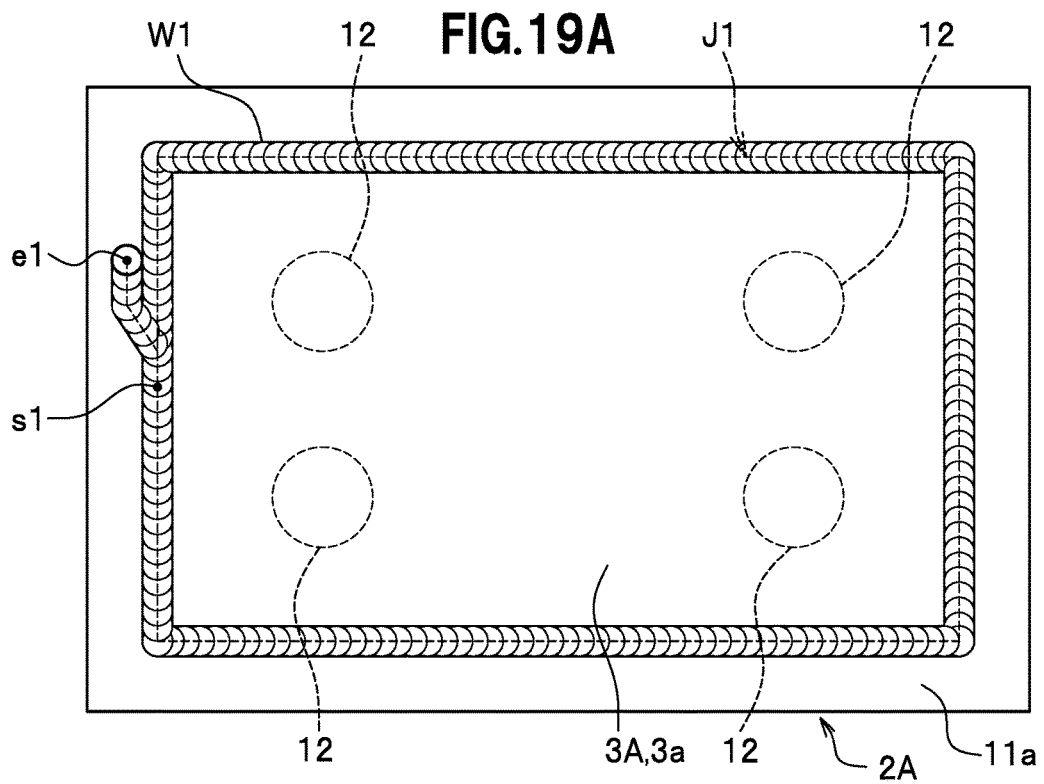
Figure 19B:
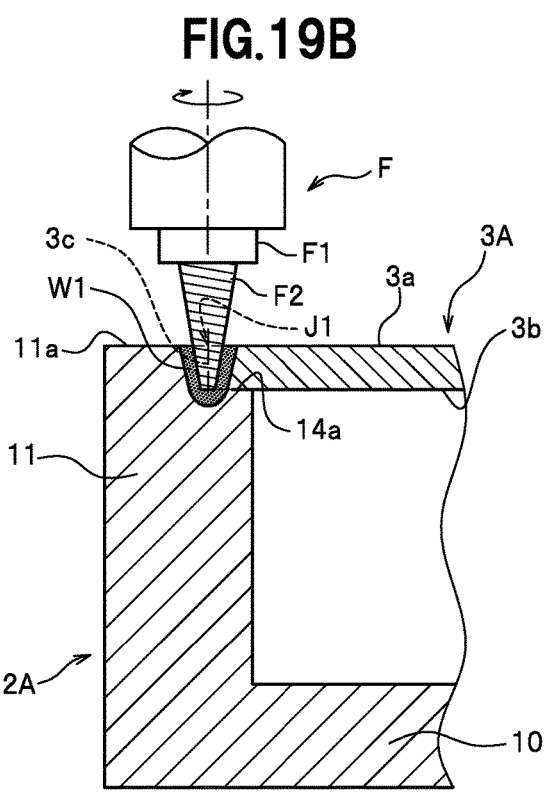

As shown in FIGS. 19A and 19B, the first primary joining step is a step of performing friction stir welding for the first abutment portion J1 by means of the primary joining rotary tool F. The first primary joining step is the same as that in the first embodiment, and thus explanation thereof is omitted.

As shown in FIGS. 20A and 20B, the second primary joining step is a step of performing friction stir welding for each of the overlapped portions J3 by means of the primary joining rotary tool F. In the second primary joining step, the primary joining rotary tool F being rotated clockwise is inserted into a starting position s2 on the front surface 3a of the sealing body 3A and the primary joining rotary tool F is relatively moved counterclockwise along the inside of the outer peripheral edge of the columnar support 12.

As shown in FIG. 20B, an insertion depth of the stirring pin F2 is set to allow the tip of the stirring pin F2 to reach the columnar support end face 12a of the columnar support 12, and set to allow only the stirring pin F2 to contact with the sealing body 3A and the columnar support 12. Then, the primary joining rotary tool F is moved circularly in planar view with a constant depth thereof being kept. Note that the insertion depth of the stirring pin F2 may be set to allow the tip of the stirring pin F2 not to reach the columnar support 12, namely, to allow the stirring pin F2 to contact with only the sealing body 3A. In this case, heat generated by friction between the sealing body 3A and the stirring pin F2 causes the sealing body 3A and the columnar support 12 to be plasticized and fluidized, allowing the overlapped portion J3 to be joined together.

In the second primary joining step, where the primary joining rotary tool F is moved counterclockwise for the columnar support 12 as in the present embodiment, the primary joining rotary tool F is preferably rotated clockwise. On the other hand, where the primary joining rotary tool F is moved clockwise for the columnar support 12, the primary joining rotary tool F is preferably rotated counterclockwise. The movement direction and rotation direction of the primary joining rotary tool F are set as described above, allowing joining defects caused by the friction stir welding to be formed in the columnar support 12 having a relatively great thickness and to be formed at a position away from the hollow section of the liquid-cooled jacket 1A, thus making it possible to suppress a decrease in water-tightness and air-tightness.

As shown in FIG. 20A, after the primary joining rotary tool F is allowed to move one round along the overlapped portion J3, it is allowed to pass through the starting position s2. Then, the primary joining rotary tool F is moved to an ending position e2 set on the sealing body 3A, and when reaching the ending position e2, the primary joining rotary tool F is moved upward to allow the primary joining rotary tool F to be pulled out from the sealing body 3A.

Where a pull-out trace of the primary joining rotary tool F remains on the sealing body 3A after pulled out from the overlapped portion J3, a repairing step for repairing the pull-out trace may be performed. For the repairing step, for example, weld metal can be filled by buildup welding in the pull-out trace for the repairing. This allows the front surface 3a of the sealing body 3A to be made flat.

Note that, where the primary joining rotary tool F is pulled out from the sealing body 3A, the primary joining rotary tool F may be shifted to the center side of the columnar support 12 to be pulled out from the sealing body 3A. Also, where the primary joining rotary tool F is pulled out from the sealing body 3A, for example, the primary joining rotary tool F may be gradually moved upward while moving the primary joining rotary tool F on the sealing body 3A, to allow the insertion depth of the primary joining rotary tool F to be gradually reduced. This makes it possible to allow no pull-out trace after the second primary joining step to remain on the sealing body 3A, or if any, to reduce the pull-out trace.

Figure 21A:
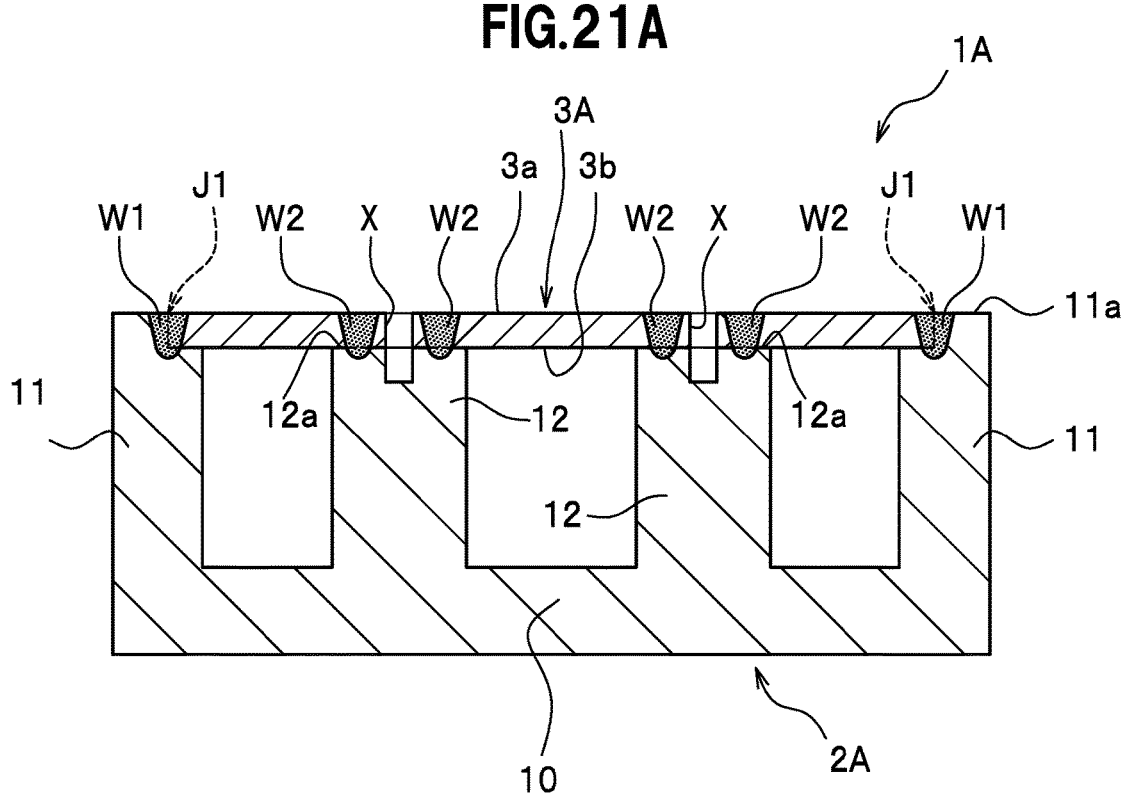

As shown in FIG. 21A, the boring step is a step of forming a fixing hole X which is communicated with the sealing body 3A and the columnar support 12 and used in fixing a heat-generating element H. The fixing hole X is formed to reach the columnar support 12.

In the burring step, burrs are removed, which have been exposed on the surfaces of the jacket body 2A and the sealing body 3A in the first primary joining step, the second primary joining step, and the boring step. This allows the surfaces of the jacket body 2A and the sealing body 3A to be cleanly finished.

Figure 21B:
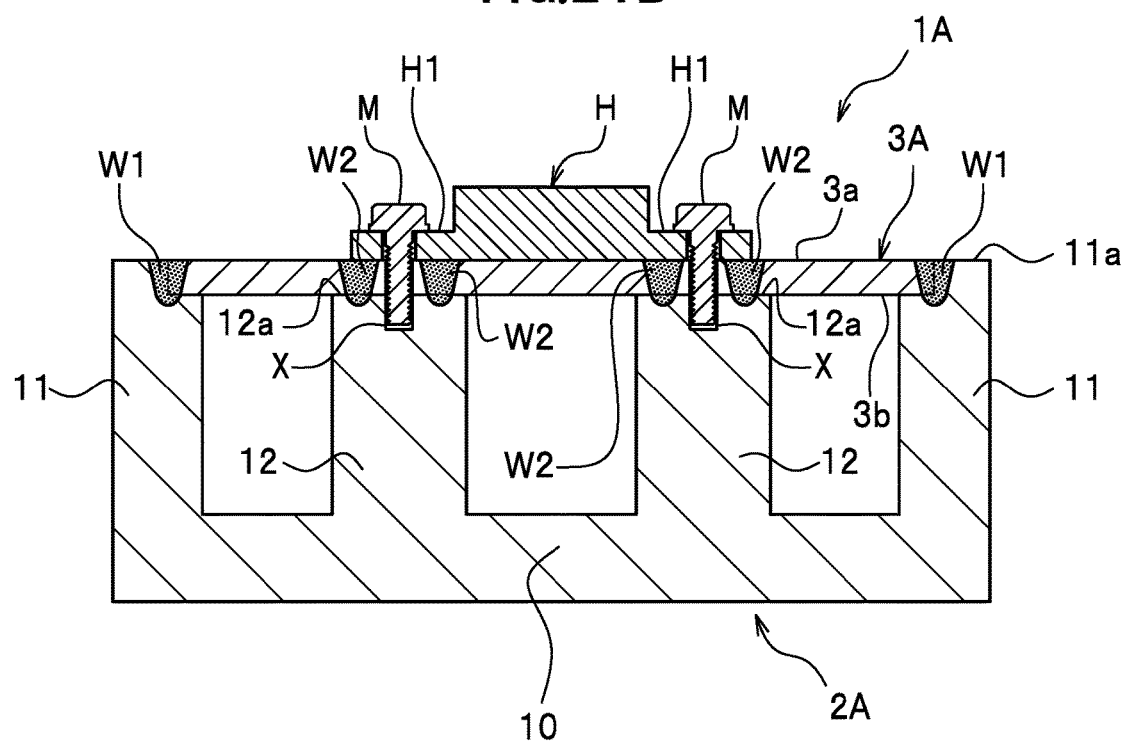

As shown in FIG. 21B, the mounting step is a step of mounting the heat-generating element H through fitting members M. When the heat-generating element H is mounted, it is fixed with the fitting members M such as screws while allowing through-holes formed in a flange H1 of the heat-generating element H to be communicated with the fixing holes X. The fitting member M is inserted to a position at which the columnar support 12 is reached.

Note that, although in the present embodiment, the fixing hole X is formed on the sealing body 3A to fix the heat-generating element H to the sealing body 3A, a fixing hole communicated with the bottom part 10 and the columnar support 12 may be formed in the bottom part 10 to fix the heat-generating element H to the bottom part 10. The heat-generating element H only needs to be mounted on at least one of the sealing body 3A and the bottom part 10. Also, although the fixing holes X are formed in the present embodiment, the heat-generating element H may be fixed with the fitting members M without forming the fixing holes X.

The manufacturing method for the liquid-cooled jacket described above can also produce nearly the same advantageous effects as those in the first embodiment. Although the first embodiment allows the second abutment portions J2 (see FIGS. 8A and 8B) to be exposed on the sealing body 3, the second embodiment has the form such that the abutment portion is not exposed. However, the second embodiment allows the frictional stirring to be performed for the overlapped portions J3 from the front surface of the sealing body 3A, thus making it possible to join the sealing body 3A and the columnar supports 12 together. Moreover, the second embodiment allows no hole to be provided in the sealing body 3A and no columnar support stepped portion to be formed on each of the columnar supports 12, thus making it possible to easily manufacture the liquid-cooled jacket.

Moreover, according to the manufacturing method for the liquid-cooled jacket according to the present embodiment, since only the stirring pin F2 is inserted into the jacket body 2A and the sealing body 3A, or into only the sealing body 3A, a load exerted on the friction stirring apparatus can be reduced as compared to a case where the shoulder portion of the rotary tool is pressed into the jacket body and the sealing body, and operability of the primary joining rotary tool F is bettered. Also, since the load exerted on the friction stirring apparatus can be reduced, the joining can be performed down to a deep location of the first abutment portion J1, or the joining can be performed for the overlapped portion J3 at a deep location, with no great load exerted on the friction stirring apparatus.

Further, the second primary joining step allows the frictional stirring to be performed one or more rounds for the inside of the outer peripheral edge of the columnar support 12 as in the present embodiment, thus making it possible to increase water-tightness and air-tightness. Note that the primary joining rotary tool F is not necessarily moved one or more rounds for the columnar support 12, and the movement route of the primary joining rotary tool F in the second primary joining step may be set to allow the plastically fluidized material not to leak into the liquid-cooled jacket 1A and set to allow the friction stir welding to be performed for at least a portion of the overlapped portion J3.

Although the second embodiment of the present invention is described above, appropriate design changes or modification are possible within the scope not departing from the gist of the present invention. For example, the manufacturing method according to the first to third modifications of the first embodiment described above may be adopted to manufacture the liquid-cooled jacket in the second embodiment.

Third Embodiment

Figure 22:
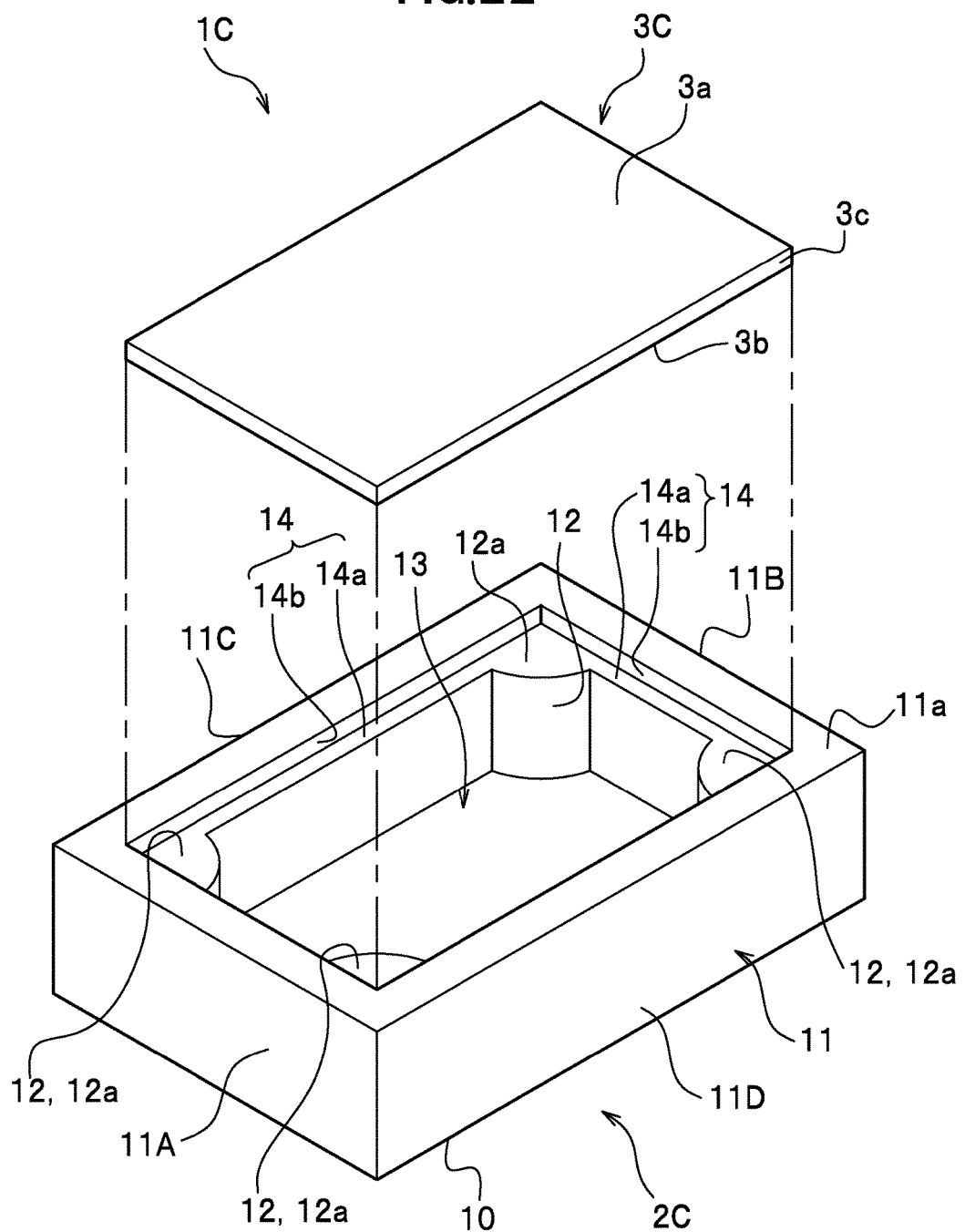
FIG. 22 is an exploded perspective view showing a liquid-cooled jacket according to a third embodiment.

Next, description will be given of a method of manufacturing a liquid-cooled jacket according to a third embodiment of the present invention. As shown in FIG. 22, the third embodiment is different from the second embodiment in that the columnar supports 12 are continuously formed on the peripheral wall part 11. The method of manufacturing the liquid-cooled jacket according to the third embodiment will be described with a focus on configurations different from the second embodiment.

A liquid-cooled jacket 1C according to the third embodiment is composed of a jacket body 2C and a sealing body 3C. The jacket body 2C is a box-shaped body which opens upward. The jacket body 2C includes a bottom part 10, a peripheral wall part 11, and a plurality of columnar supports 12.

The peripheral wall part 11 has a peripheral wall end face 11a on which a peripheral wall stepped portion 14 is formed along a peripheral edge of the opening of the jacket body 2C. The peripheral wall stepped portion 14 is composed of a step bottom surface 14a, and a step side surface 14b rising from the step bottom surface 14a. The step bottom surface 14a is formed at a position below by one step from the peripheral wall end face 11a.

The columnar supports 12 are provided to stand on the bottom part 10 and continuously formed on the peripheral wall part 11. The number of the columnar supports 12 is not particularly limited as long as it is one or more, but in the present embodiment, one columnar support 12 for each of four corners of the peripheral wall part 11, i.e., a total of four columnar supports 12 are formed. The columnar supports 12 each have the form of a sector in planar view. The columnar supports 12 have the same shape, respectively. The columnar support 12 has a columnar support end face 12a which is flush with the step bottom surface 14a of the peripheral wall stepped portion 14.

The sealing body 3C is a plate-like member having the form of a rectangle in planar view. Materials for the sealing body 3C are not particularly limited, but in the present embodiment, the sealing body 3C is formed of the same material as the jacket body 2C. The sealing body 3C is formed with a size such that it can be placed on the peripheral wall stepped portion 14 with no substantial gap. A plate thickness dimension of the sealing body 3C is substantially the same as a height dimension of the step side surface 14b.

Next, description will be given of a manufacturing method for the liquid-cooled jacket according to the third embodiment (a manufacturing method for the liquid-cooled jacket with a heat-generating element). The manufacturing method for the liquid-cooled jacket includes a preparation step, a placing step, a fixing step, a provisional joining step, a first primary joining step, a second primary joining step, a boring step, a burring step, and a mounting step.

As shown in FIG. 22, the preparation step is a step of forming the jacket body 2C and the sealing body 3C. The jacket body 2C is formed, for example, by die-casting.

Figure 23A:
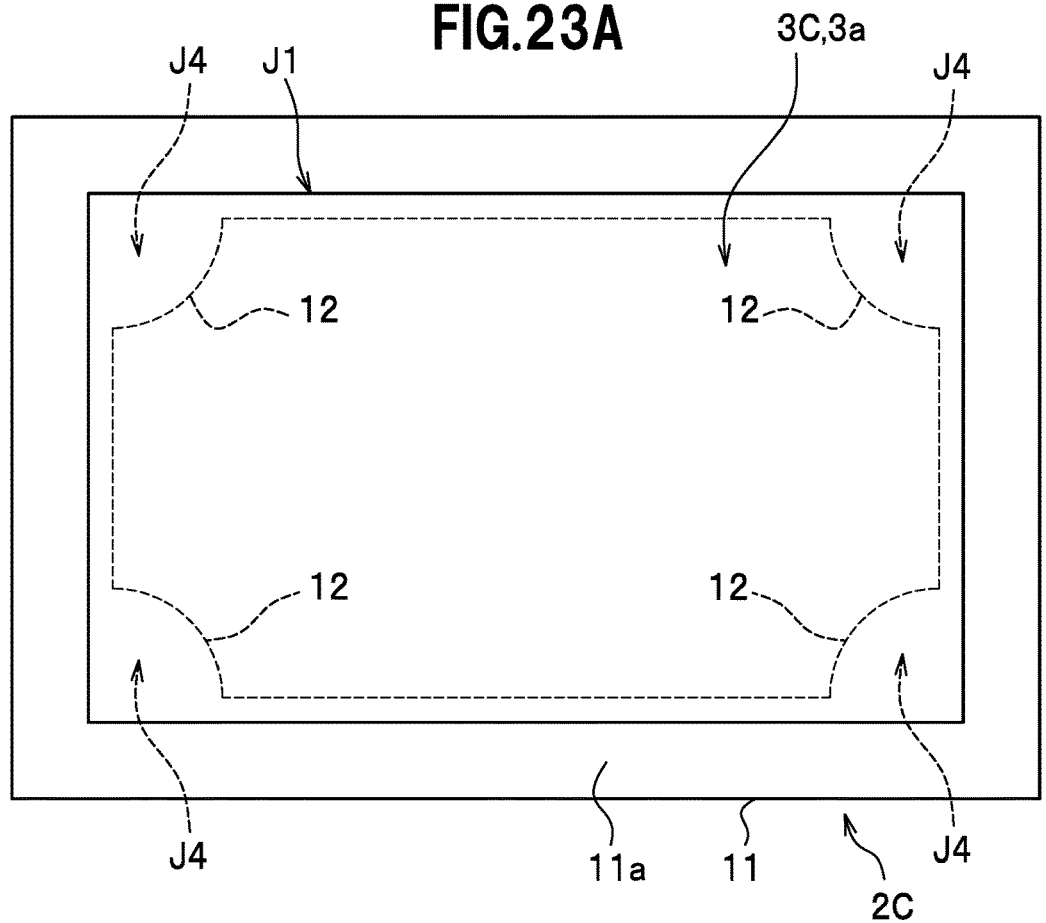
Figure 23B:
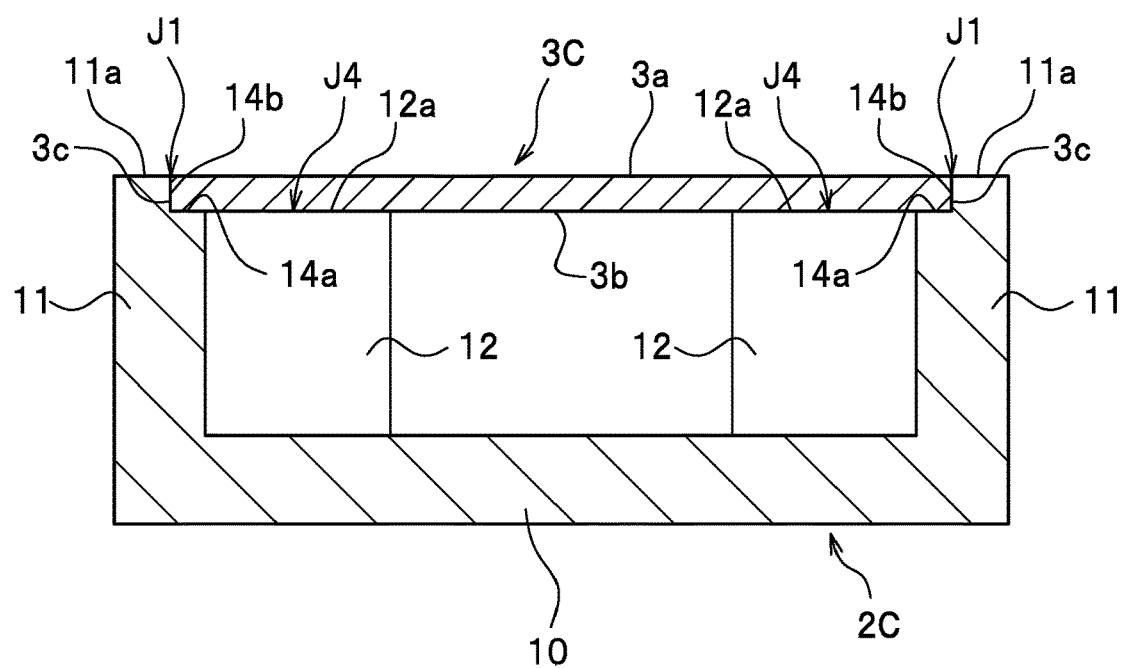

As shown in FIGS. 22, 23A and 23B, the placing step is a step of placing the sealing body 3C on the jacket body 2C. The back surface 3b of the sealing body 3C comes into surface contact with the step bottom surface 14a of the peripheral wall stepped portion 14 and the columnar support end face 12a of the columnar support 12, respectively. The placing step allows the step side surface 14b of the peripheral wall stepped portion 14 and the outer peripheral side surface 3c of the sealing body 3C to abut on each other to form the first abutment portion J1. The first abutment portion J1 has a rectangular shape in planar view. Also, the placing step allows the back surface 3b of the sealing body 3C and the columnar support end faces 12a of the columnar supports 12 to be overlapped each other to form the overlapped portions J4. The overlapped portions J4 each have a sectoral shape in planar view.

In the fixing step, the jacket body 2C is fixed on a table (not shown). The jacket body 2C is immovably fixed on the table by means of a fixing tool such as a clamp.

The provisional joining step is a step of provisionally joining the jacket body 2C and the sealing body 3C together. The provisional joining step is the same as that in the first embodiment, and thus explanation thereof is omitted.

Figure 24A:
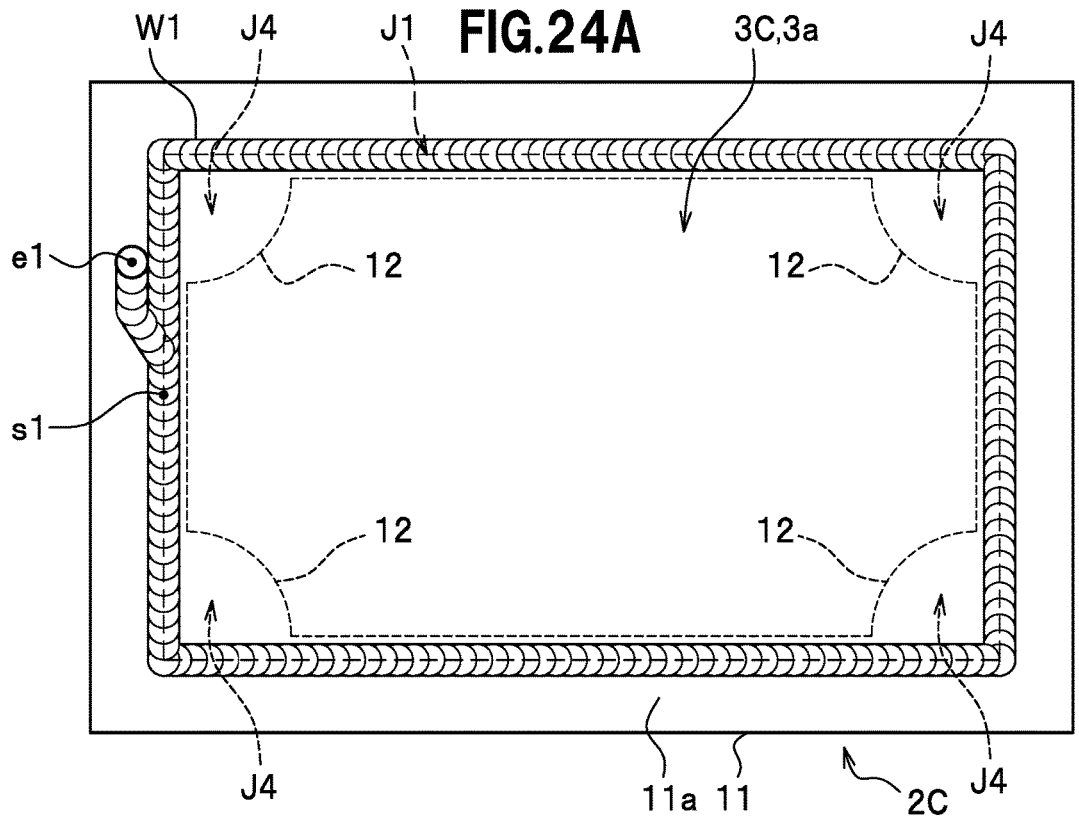
Figure 24B:
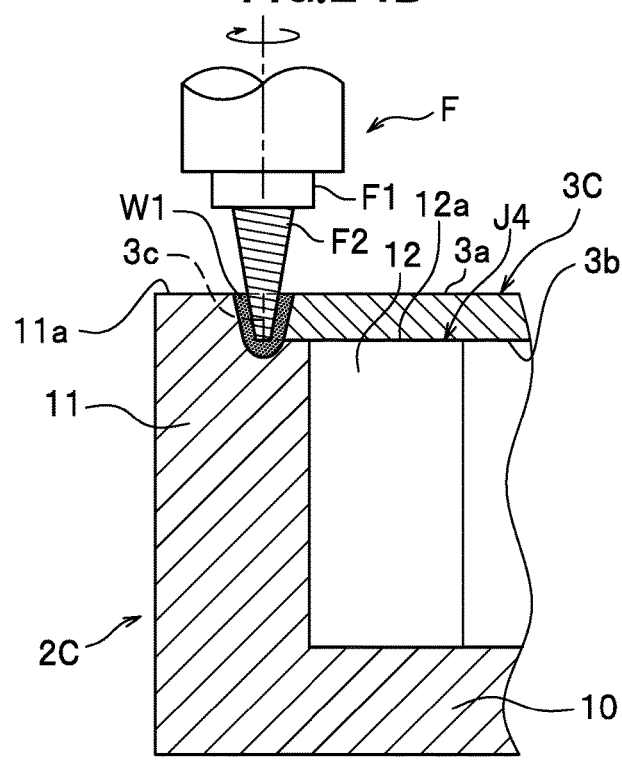

As shown in FIGS. 24A and 24B, the first primary joining step is a step of performing friction stir welding for the first abutment portion J1 by means of the primary joining rotary tool F. The first primary joining step is the same as that in the first embodiment, and thus explanation thereof is omitted.

Figure 25A:
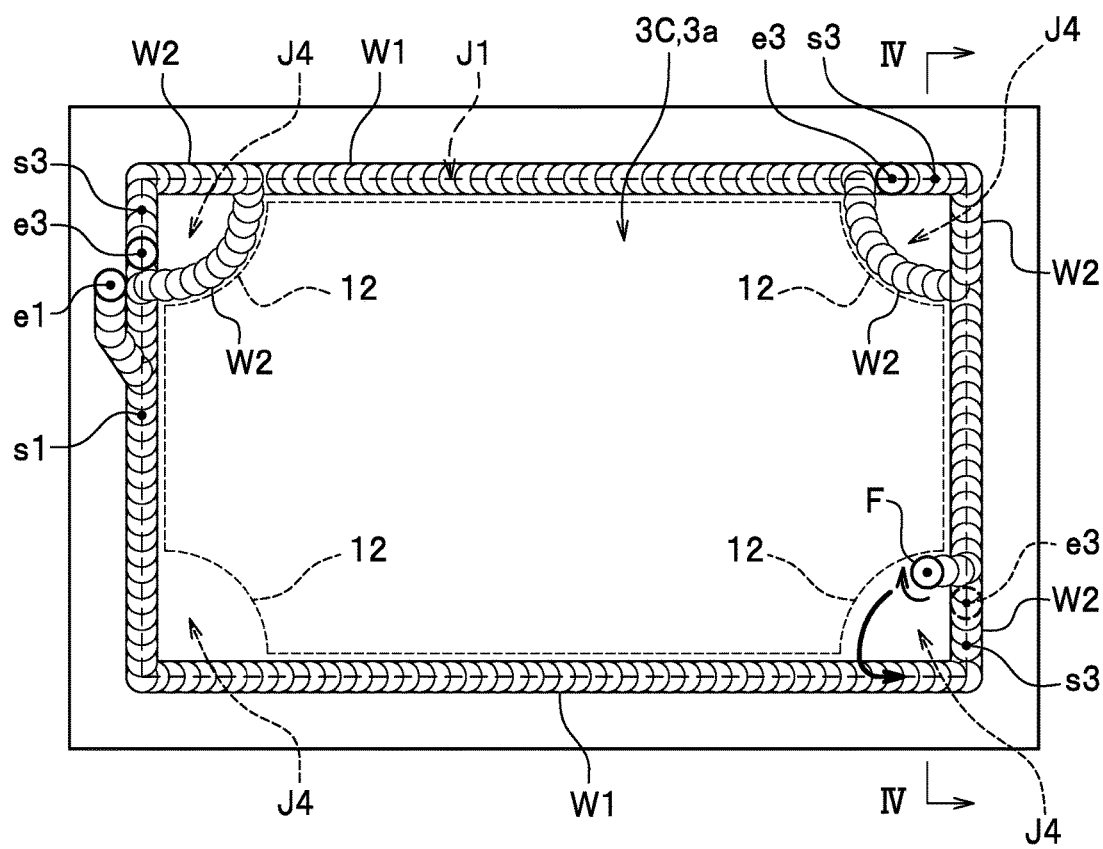
Figure 25B:
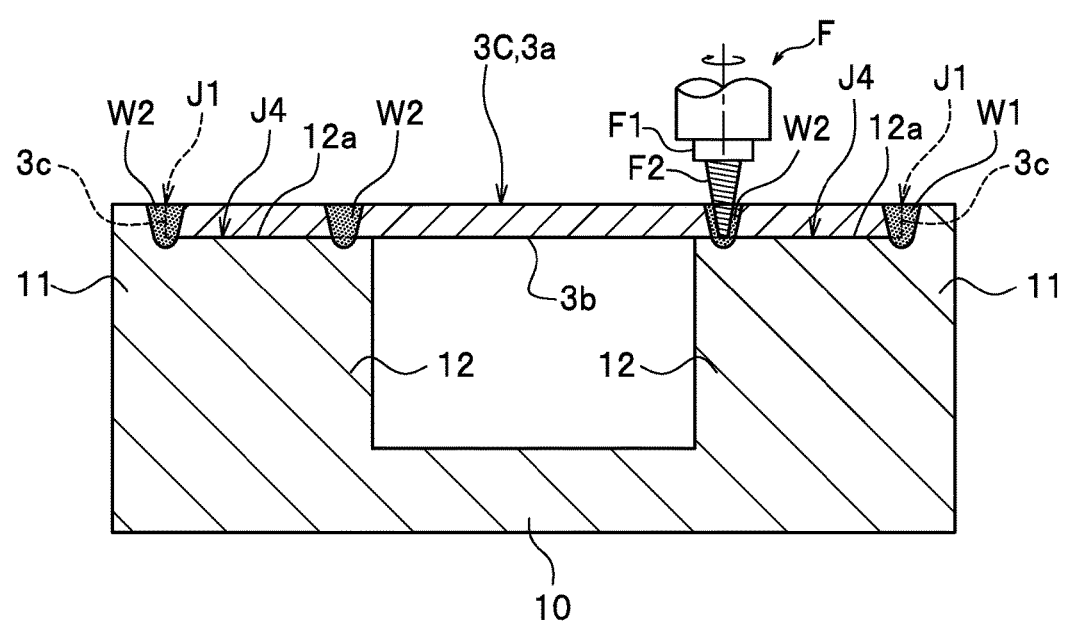

As shown in FIGS. 25A and 25B, the second primary joining step is a step of performing friction stir welding for each of the overlapped portions J4 by means of the primary joining rotary tool F. In the second primary joining step, the primary joining rotary tool F being rotated clockwise is inserted into a starting position s3 on the front surface 3a of the sealing body 3C. Then, the primary joining rotary tool F is relatively moved to trace the plasticized region W1 and the primary joining rotary tool F is relatively moved counterclockwise along the inside of the outer peripheral edge of the columnar support 12. The starting position s3 is suitably set, and in the present embodiment, it is set near each of corners on the first abutment portion J1. The insertion depth of the stirring pin F2 is the same as that in the second embodiment. The plasticized region W2 is formed on the movement locus of the primary joining rotary tool F.

As shown in FIG. 25A, after the primary joining rotary tool F is allowed to move a quarter of one round along the outer peripheral edge of the columnar support 12, the primary joining rotary tool F is relatively moved again to trace the plasticized region W1 and allowed to pass through the starting position s3. Then, when reaching an ending position e3, the primary joining rotary tool F is moved upward to allow the primary joining rotary tool F to be pulled out from the sealing body 3C. Measures to be taken for a pull-out trace of the primary joining rotary tool F, which is generated when pulled out, are the same as those in the second embodiment.

Figure 26A:
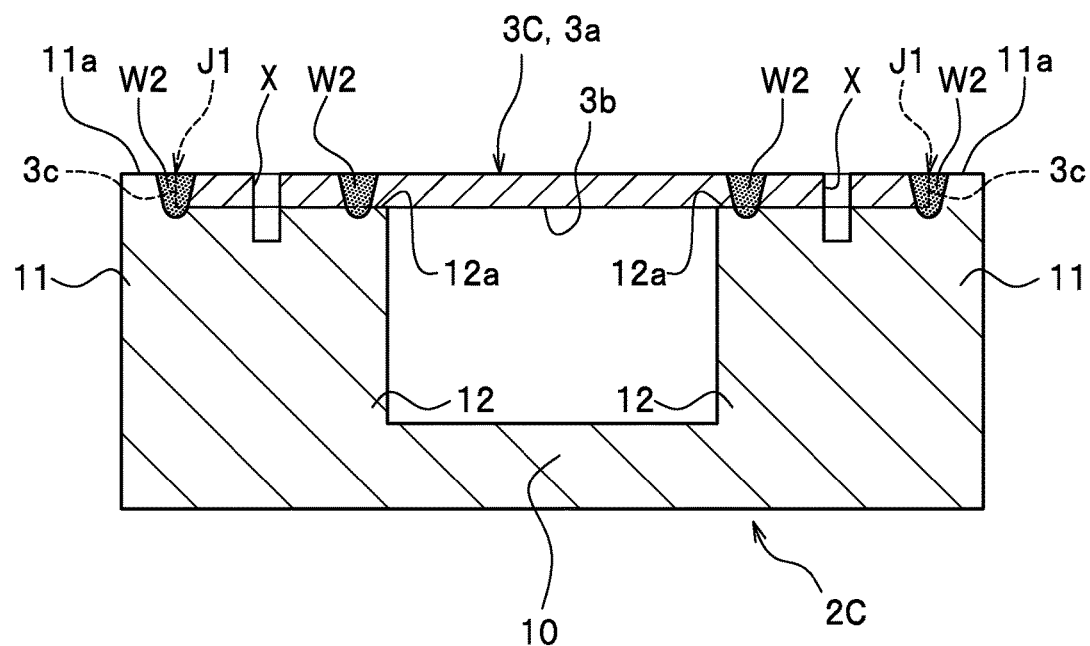

As shown in FIG. 26A, the boring step is a step of forming a fixing hole X which is communicated with the sealing body 3C and the columnar support 12 and used in fixing a heat-generating element H. The fixing hole X is formed to reach the columnar support 12.

In the burring step, burrs are removed, which have been exposed on the surfaces of the jacket body 2C and the sealing body 3C in the first primary joining step, the second primary joining step, and the boring step. This allows the surfaces of the jacket body 2C and the sealing body 3C to be cleanly finished.

Figure 26B:
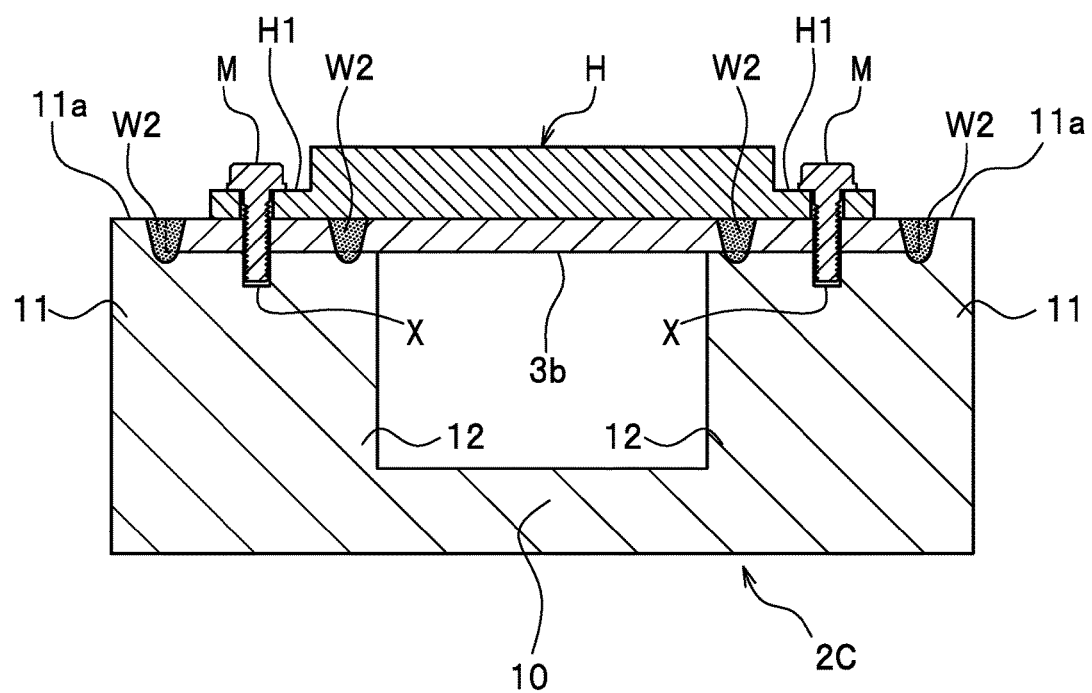

As shown in FIG. 26B, the mounting step is a step of mounting the heat-generating element H through fitting members M. When the heat-generating element H is mounted, it is fixed with the fitting members M such as screws while allowing through-holes formed in a flange H1 of the heat-generating element H to be communicated with the fixing holes X. The fitting member M is inserted to a position at which the columnar support 12 is reached.

The manufacturing method for the liquid-cooled jacket described above can also produce nearly the same advantageous effects as those in the second embodiment. The columnar supports 12 may be formed to be extended from the peripheral wall part 11 as in the third embodiment. Also, although the columnar supports 12 are each formed at each corner of the peripheral wall part 11 in the present embodiment, the columnar supports may be formed to be extended from locations which are not the corners of the peripheral wall part 11.

Moreover, for example, the manufacturing method according to the first to third modifications of the first embodiment described above may be adopted to manufacture the liquid-cooled jacket in the third embodiment. Further, when proceeding to the second primary joining step from the first primary joining step in the third embodiment, the friction stir welding may be performed in succession without pulling out the primary joining rotary tool F.

Although the embodiments and modifications of the present invention are described above, appropriate design changes or modification are possible. For example, fins may be formed on at least one of the jacket body and the sealing body. Also, in the first primary joining step, the primary joining rotary tool F may be allowed to move two rounds along the first abutment portion J1. Moreover, although in the embodiments, the first primary joining step and the second primary joining step are performed by means of the primary joining rotary tool F, the frictional stirring may be performed by means of a rotary tool provided with a shoulder portion and a stirring pin while pressing the shoulder portion into the jacket body and the sealing body. Furthermore, different rotary tools may be used in the first primary joining step and the second primary joining step.

Fourth Embodiment

Figure 27:
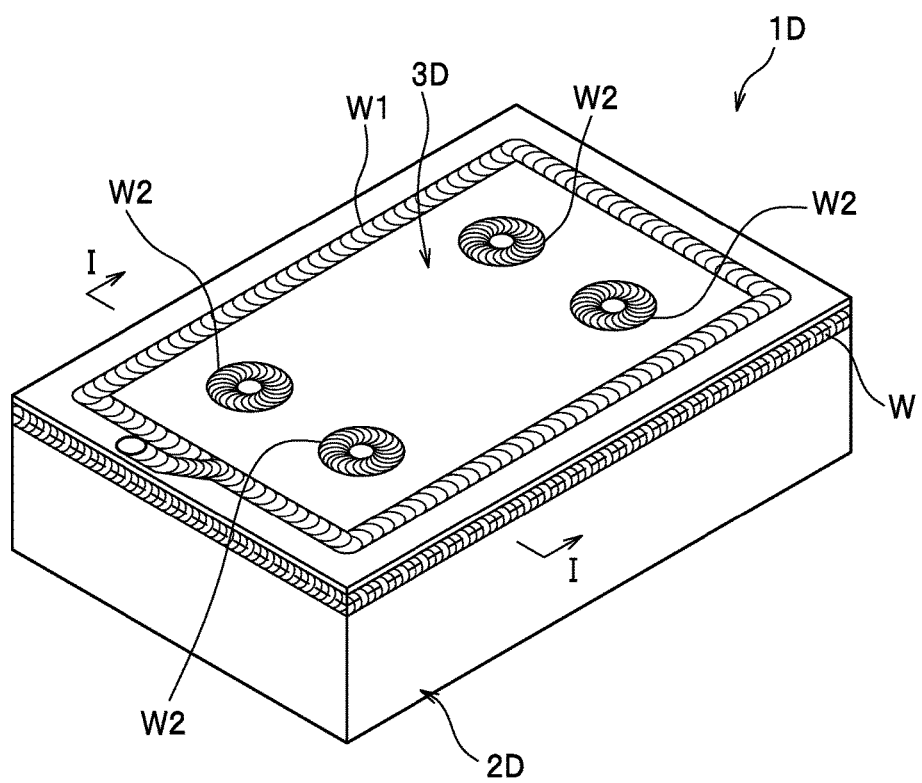
FIG. 27 is a perspective view of a liquid-cooled jacket according to a fourth embodiment of the present invention.

A liquid-cooled jacket and a method of manufacturing the liquid-cooled jacket according to a fourth embodiment of the present invention will be described in detail with reference to the drawings. First, description will be given of a liquid-cooled jacket according to the present embodiment. As shown in FIG. 27, a liquid-cooled jacket 1D according to the present embodiment is composed of a jacket body 2D and a sealing body 3D, and has the form of a rectangular parallelepiped. The jacket body 2D and the sealing body 3D are integrated with each other by friction stir welding. The liquid-cooled jacket 1D has a hollow section formed therein, and heat transport fluid such as water is allowed to flow in the hollow section. The liquid-cooled jacket 1D allows heat transport fluid to flow in the hollow section, thereby making it possible to cool, for example, a heat-generating element mounted on the liquid-cooled jacket 1D.

Figure 28:
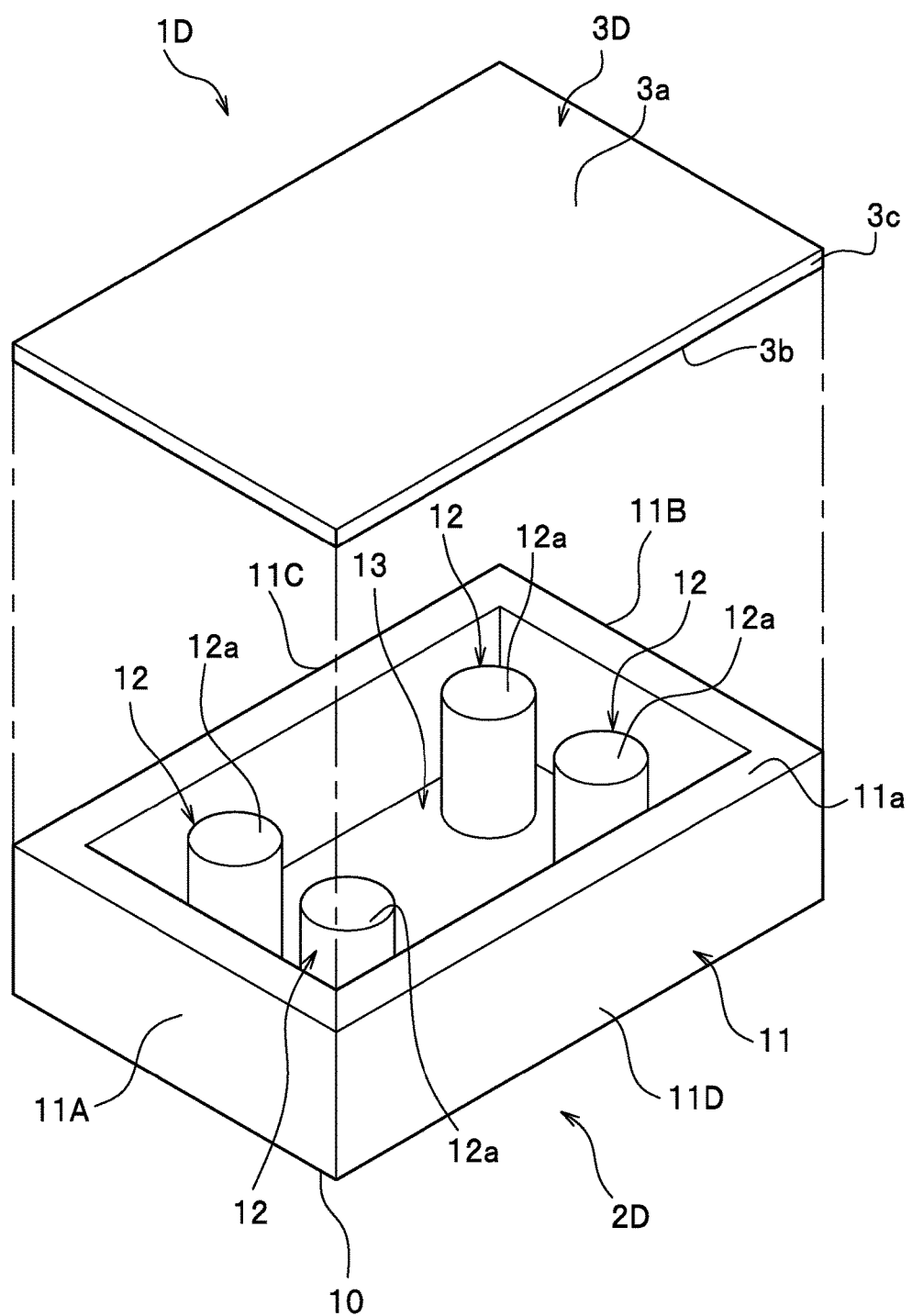
FIG. 28 is an exploded perspective view showing the liquid-cooled jacket according to the fourth embodiment of the present invention.

As shown in FIG. 28, the jacket body 2D is a box-shaped body which opens upward. The jacket body 2D includes a bottom part 10, a peripheral wall part 11, and a plurality of columnar supports 12. The jacket body 2D is formed of metal suitably selected from among metals capable of being stirred by friction, and aluminum or aluminum alloy is used as the metal in the present embodiment.

The bottom part 10 has the form of a rectangular plate in planar view. The peripheral wall part 11 is provided to stand on a peripheral edge of the bottom part 10, and has the form of a rectangular frame in planar view. The peripheral wall part 11 is composed of wall parts 11A, 11B, 11C and 11D, each having the same plate thickness. The wall parts 11A and 11B each form a short side part and face each other. Also, the wall parts 11C and 11D each form a long side part and face each other. The bottom part 10 and the peripheral wall part 11 defines a recess 13 formed inside.

The columnar supports 12 are provided to stand on the bottom part 10 and have the form of a column. The number of the columnar supports 12 is not particularly limited as long as it is one or more, but four columnar supports 12 are formed in the present embodiment. The columnar supports 12 have the same shape, respectively. A columnar support end face 12a forming an end face of each columnar support 12 is formed at the same height position as the peripheral wall end face 11a forming the end face of the peripheral wall part 11.

The sealing body 3D is a plate-like member having the form of a rectangle in planar view, which seals the opening of the jacket body 2D. Materials for the sealing body 3D are not particularly limited, but in the present embodiment, the sealing body 3D is formed of the same material as the jacket body 2D. A planar shape of the sealing body 3D is the same as a planar shape of the jacket body 2D.

Figure 29:
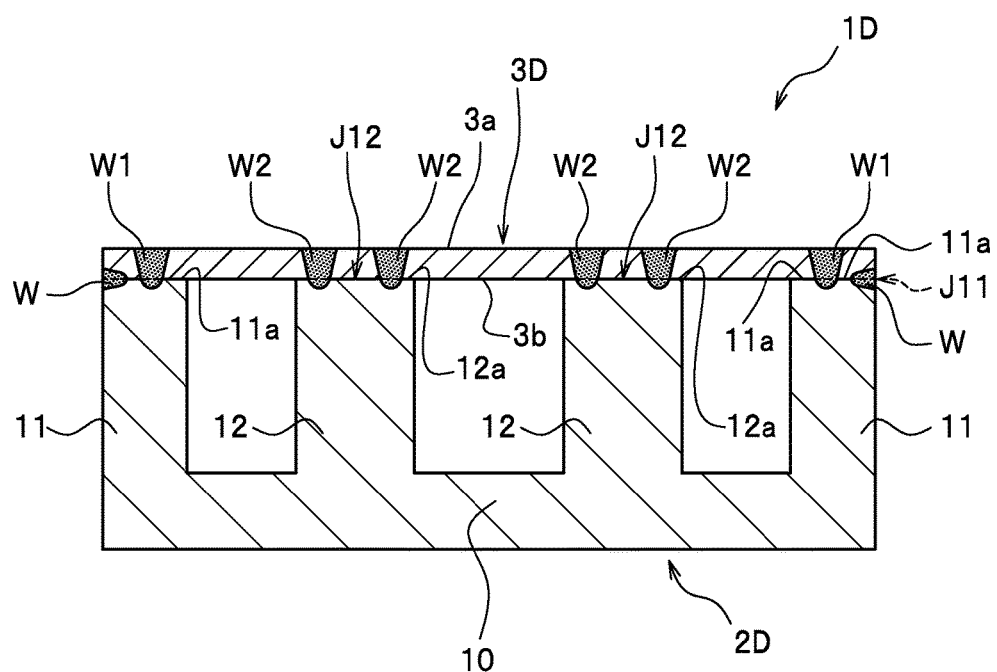
FIG. 29 is a cross-sectional view taken along the line I-I in FIG. 27.

As shown in FIG. 29, the liquid-cooled jacket 1D is one obtained by joining together the jacket body 2D and the sealing body 3D by frictional stirring to be integrated with each other. In the liquid-cooled jacket 1D, a first overlapped portion J11 in which the back surface 3b of the sealing body 3D and the peripheral wall end face 11a of the peripheral wall part 11 are overlapped each other, and second overlapped portions J12 in each of which the back surface 3b of the sealing body 3D and the columnar support end face 12a of the columnar support 12 are overlapped each other, are joined together by frictional stirring, respectively. Also, the first overlapped portion J11 is joined together by frictional stirring from the side over the entire circumference of the liquid-cooled jacket 1D. The plasticized region W and the plasticized region W1 are formed on the first overlapped portion J11, and the plasticized region W2 is formed on the second overlapped portion J12. The liquid-cooled jacket 1D has a hollow section formed therein, in which heat transport fluid flows for transporting heat to the outside.

Next, description will be given of a manufacturing method for the liquid-cooled jacket according to the fourth embodiment (a manufacturing method for the liquid-cooled jacket with a heat-generating element). The manufacturing method for the liquid-cooled jacket includes a preparation step, a placing step, a fixing step, a provisional joining step, a first primary joining step, a second primary joining step, a boring step, a burring step, and a mounting step.

As shown in FIG. 28, the preparation step is a step of forming the jacket body 2D and the sealing body 3D. The jacket body 2D is formed, for example, by die-casting.

Figure 30A:
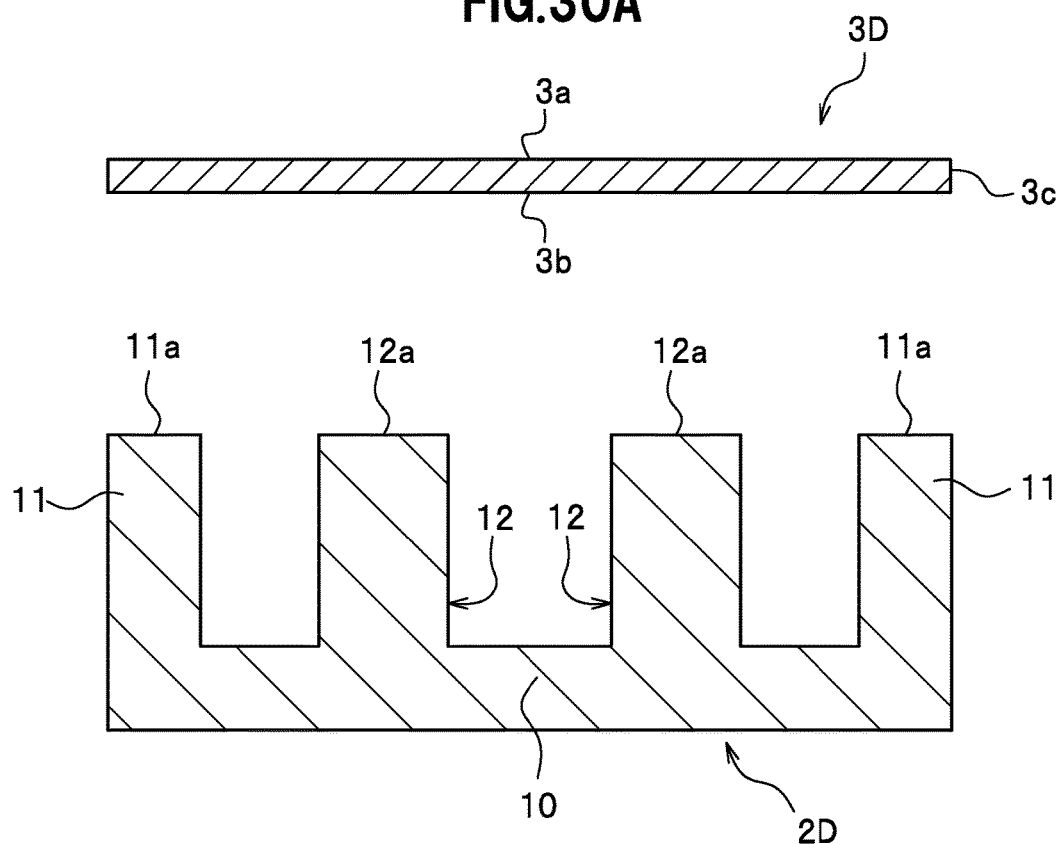
Figure 30B:
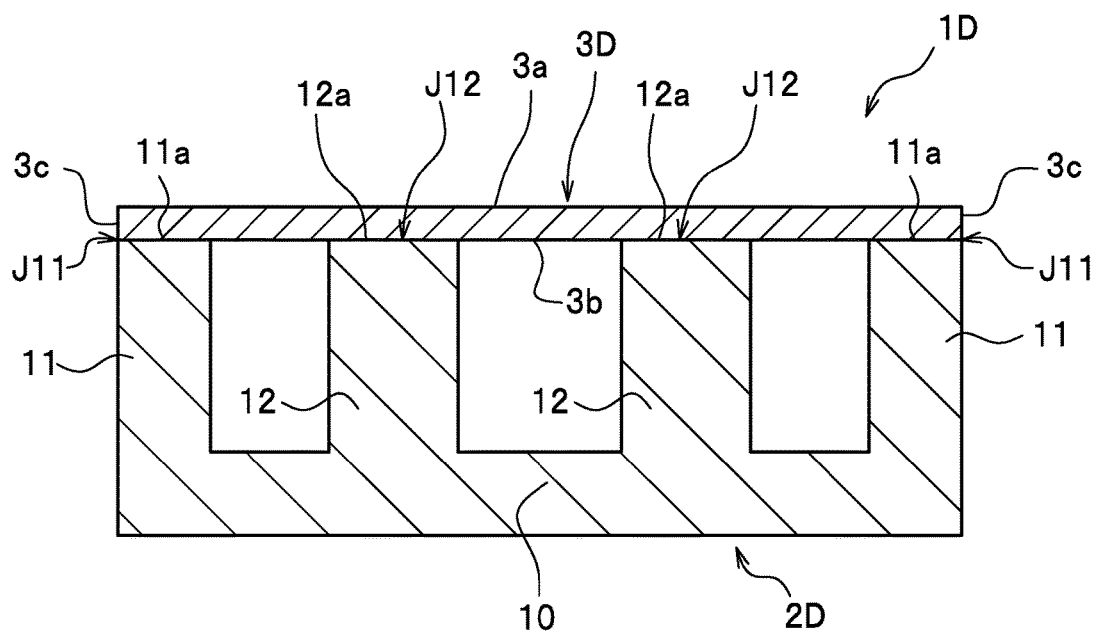

As shown in FIGS. 30A and 30B, the placing step is a step of placing the sealing body 3D on the jacket body 2D. A back surface 3b of the sealing body 3D comes into surface contact with the peripheral wall end face 11a of the peripheral wall part 11 and the columnar support end faces 12a of the columnar supports 12, respectively. The placing step allows the back surface 3b of the sealing body 3D and the peripheral wall end face 11a of the peripheral wall part 11 to be overlapped each other to form the first overlapped portion J11. The first overlapped portion J11 has the form of a rectangular frame in planar view. Also, the placing step allows the back surface 3b of the sealing body 3D and the columnar support end face 12a of the columnar support 12 to be overlapped each other to form the second overlapped portion J12. The second overlapped portion J12 has a circular shape in planar view.

In the fixing step, the jacket body 2D and the sealing body 3D are fixed on a table (not shown). The jacket body 2D and the sealing body 3D are immovably fixed on the table by means of a fixing tool such as a clamp.

Figure 31:
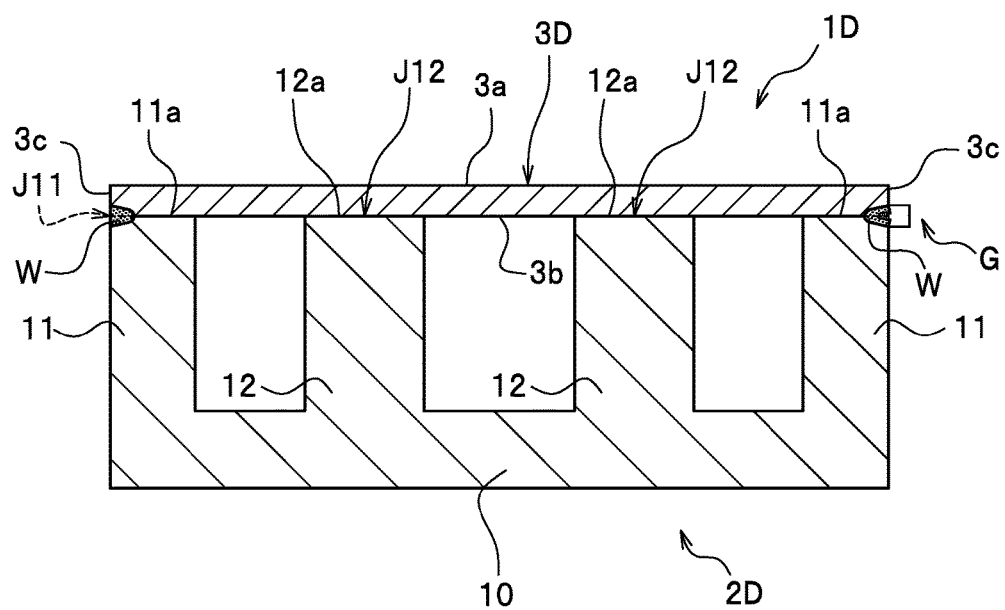
FIG. 31 is a cross-sectional view showing a provisional joining step in the manufacturing method for the liquid-cooled jacket according to the fourth embodiment.

As shown in FIG. 31, the provisional joining step is a step of provisionally joining the jacket body 2D and the sealing body 3D together. In the provisional joining step, the provisional joining rotary tool G is inserted into the first overlapped portion J11 from the side of the jacket body 2D and the provisional joining rotary tool G is relatively moved over the entire circumference of the jacket body 2D. The plasticized region W is formed on the movement locus of the provisional joining rotary tool G. The provisional joining may be continuously performed, or may be intermittently performed. The provisional joining rotary tool G is of a compact size, thus allowing thermal deformation of the jacket body 2D and the sealing body 3D during the provisional joining to be decreased.

Figure 32A:
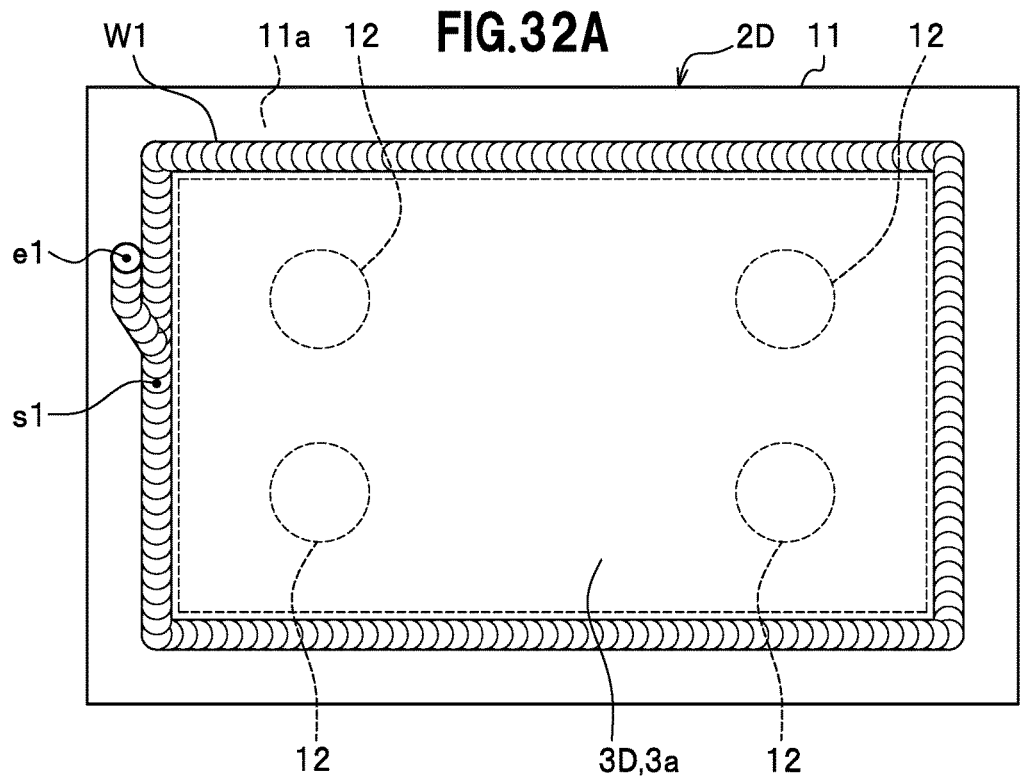
Figure 32B:
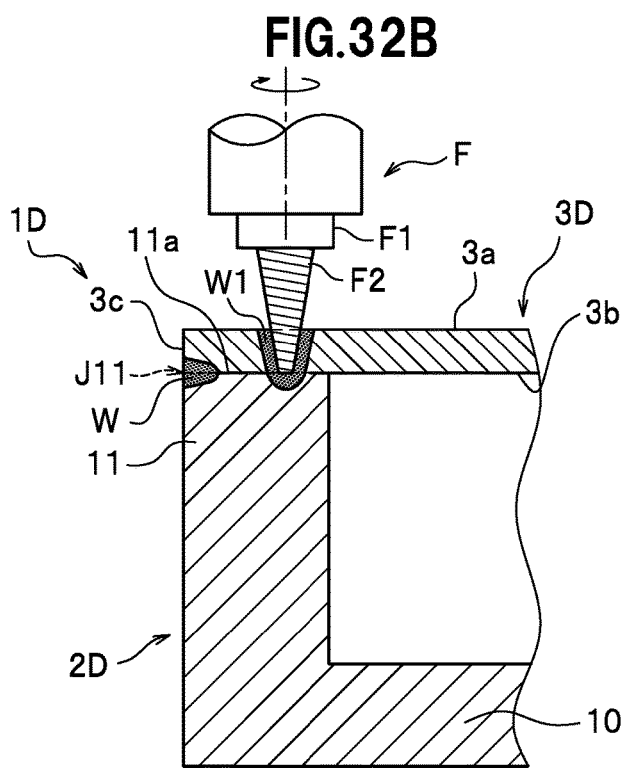

As shown in FIGS. 32A and 32B, the first primary joining step is a step of performing friction stir welding for the first overlapped portion J11 by means of the primary joining rotary tool F. In the first primary joining step, the primary joining rotary tool F being rotated clockwise is inserted into a starting position s1 set on the front surface 3a of the sealing body 3D and the primary joining rotary tool F is moved clockwise along the first overlapped portion J11. That is, the primary joining rotary tool F is allowed to move one round clockwise along the peripheral edge of the sealing body 3D.

As shown in FIG. 32B, an insertion depth of the stirring pin F2 is set to allow the tip of the stirring pin F2 to reach the peripheral wall end face 11a of the peripheral wall part 11, and set to allow only the stirring pin F2 to contact with the sealing body 3D and the peripheral wall part 11. Then, the primary joining rotary tool F is relatively moved to trace the peripheral wall part 11 with a constant height thereof being kept.

Where the primary joining rotary tool F is moved clockwise around the sealing body 3D as in the present embodiment, the primary joining rotary tool F is preferably rotated clockwise. On the other hand, where the primary joining rotary tool F is moved counterclockwise around the sealing body 3D, the primary joining rotary tool F is preferably rotated counterclockwise.

There is a possibility that joining defects are generated on the left side in the direction of forward movement of a rotary tool when rotated clockwise, or on the right side in the direction of forward movement of the rotary tool when rotated counterclockwise. When such joining defects are formed at a position near the hollow section of the liquid-cooled jacket 1D, there is a risk that water-tightness and air-tightness are decreased. However, the movement direction and rotation direction of the primary joining rotary tool F are set as described above, allowing joining defects caused by the friction stir welding to be formed at a position away from the hollow section of the liquid-cooled jacket 1D, thus making it possible to suppress a decrease in water-tightness and air-tightness.

As shown in FIG. 32A, after the primary joining rotary tool F is allowed to move one round along the first overlapped portion J11, it is allowed to pass through the starting position s1. Then, the primary joining rotary tool F is moved to an ending position e1 while shifting the primary joining rotary tool F to the outside. When reaching the ending position e1, the primary joining rotary tool F is moved upward to allow the primary joining rotary tool F to be pulled out from the sealing body 3D.

Where a pull-out trace of the primary joining rotary tool F remains on the sealing body 3D after pulled out from the sealing body 3D, a repairing step for repairing the pull-out trace may be performed. For the repairing step, for example, weld metal can be filled by buildup welding in the pull-out trace for the repairing. This allows the front surface 3a of the sealing body 3D to be made flat.

Note that, where the primary joining rotary tool F is pulled out from the sealing body 3D, for example, the primary joining rotary tool F may be gradually moved upward while moving the primary joining rotary tool F on the front surface 3a of the sealing body 3D, to allow the insertion depth of the primary joining rotary tool F to be gradually reduced. This makes it possible to allow no pull-out trace after the first primary joining step to remain on the front surface 3a of the sealing body 3D, or if any, to reduce the pull-out trace.

Figure 33A:
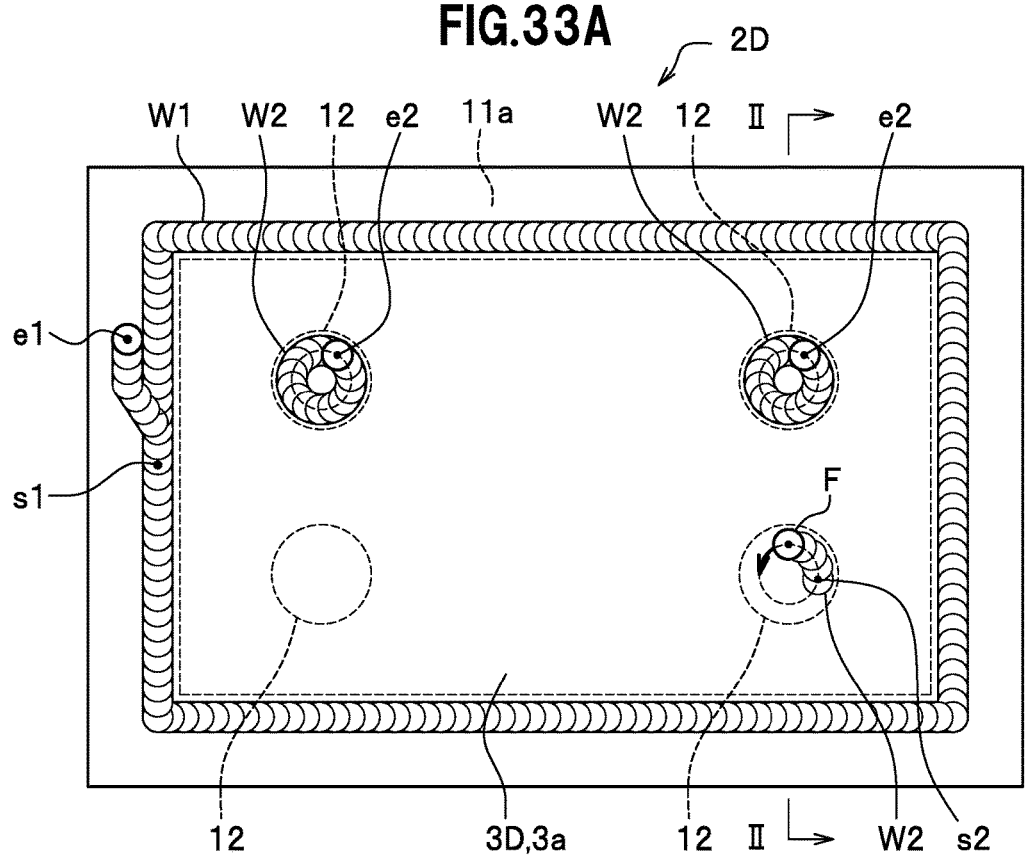
Figure 33B:
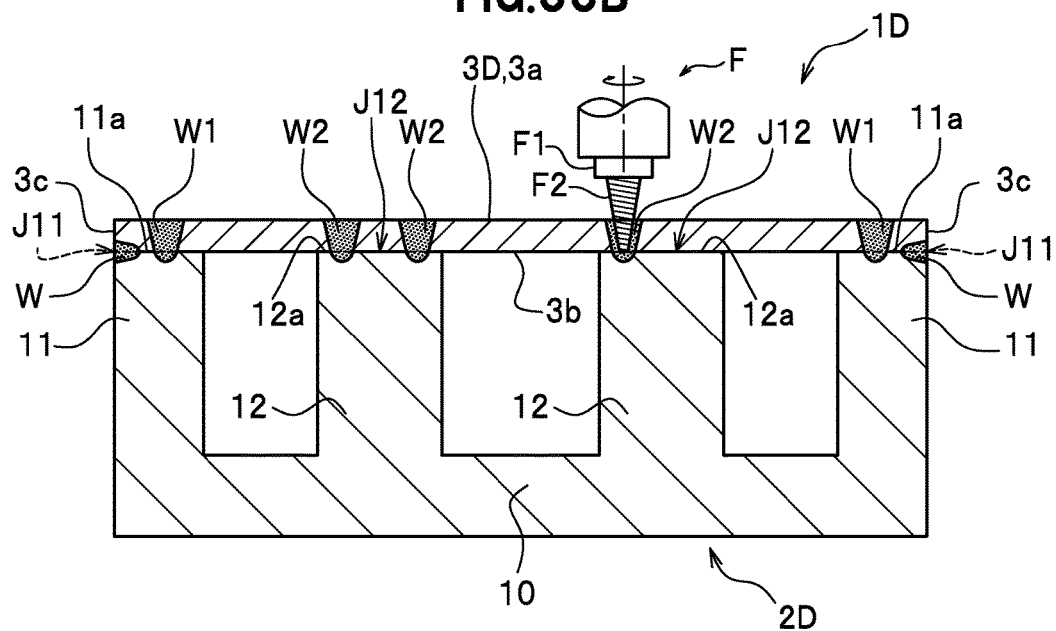

As shown in FIGS. 33A and 33B, the second primary joining step is a step of performing friction stir welding for each of the second overlapped portions J12 by means of the primary joining rotary tool F. In the second primary joining step, the primary joining rotary tool F being rotated clockwise is inserted into a starting position s2 set on the front surface 3a of the sealing body 3D. The starting position s2 is set at a position corresponding to the columnar support 12. In the second primary joining step, the primary joining rotary tool F is moved counterclockwise along the second overlapped portion J12. The second primary joining step allows the plasticized region W2 to be formed on each of the second overlapped portions J12.

As shown in FIG. 33B, an insertion depth of the stirring pin F2 is set to allow the tip of the stirring pin F2 to reach the columnar support 12, and set to allow only the stirring pin F2 to contact with the sealing body 3D and the columnar support 12. Then, the primary joining rotary tool F is relatively moved to trace the inside of the outer peripheral edge of the columnar support 12 with a constant depth thereof being kept.

In the second primary joining step, where the primary joining rotary tool F is moved counterclockwise for the columnar support 12 as in the present embodiment, the primary joining rotary tool F is preferably rotated clockwise. On the other hand, where the primary joining rotary tool F is moved clockwise for the columnar support 12, the primary joining rotary tool F is preferably rotated counterclockwise. The movement direction and rotation direction of the primary joining rotary tool F are set as described above, allowing joining defects caused by the friction stir welding to be formed at a position away from the hollow section of the liquid-cooled jacket 1D, thus making it possible to suppress a decrease in water-tightness and air-tightness.

As shown in FIG. 33A, after the primary joining rotary tool F is allowed to move one round along the outer edge of the columnar support 12, it is allowed to pass through the starting position s2 as it is. Then, the primary joining rotary tool F is moved to an ending position e2 set on the front surface 3a of the sealing body 3D (second overlapped portion J12), and when reaching the ending position e2, the primary joining rotary tool F is moved upward to allow the primary joining rotary tool F to be pulled out from the sealing body 3D.

Where a pull-out trace of the primary joining rotary tool F remains on the front surface 3a of the sealing body 3D after pulled out from the sealing body 3D, a repairing step for repairing the pull-out trace may be performed. For the repairing step, for example, weld metal can be filled by buildup welding in the pull-out trace for the repairing. This allows the front surface 3a of the sealing body 3D to be made flat.

Note that, where the primary joining rotary tool F is pulled out from the sealing body 3D, for example, the primary joining rotary tool F may be shifted to the center side of the columnar support 12 to be pulled out. Moreover, where the primary joining rotary tool F is pulled out from the sealing body 3D, for example, the primary joining rotary tool F may be gradually moved upward while moving the primary joining rotary tool F on the sealing body 3D, to allow the insertion depth of the primary joining rotary tool F to be gradually reduced. This makes it possible to allow no pull-out trace after the second primary joining step to remain on the front surface 3a of the sealing body 3D, or if any, to reduce the pull-out trace.

Figure 34A:
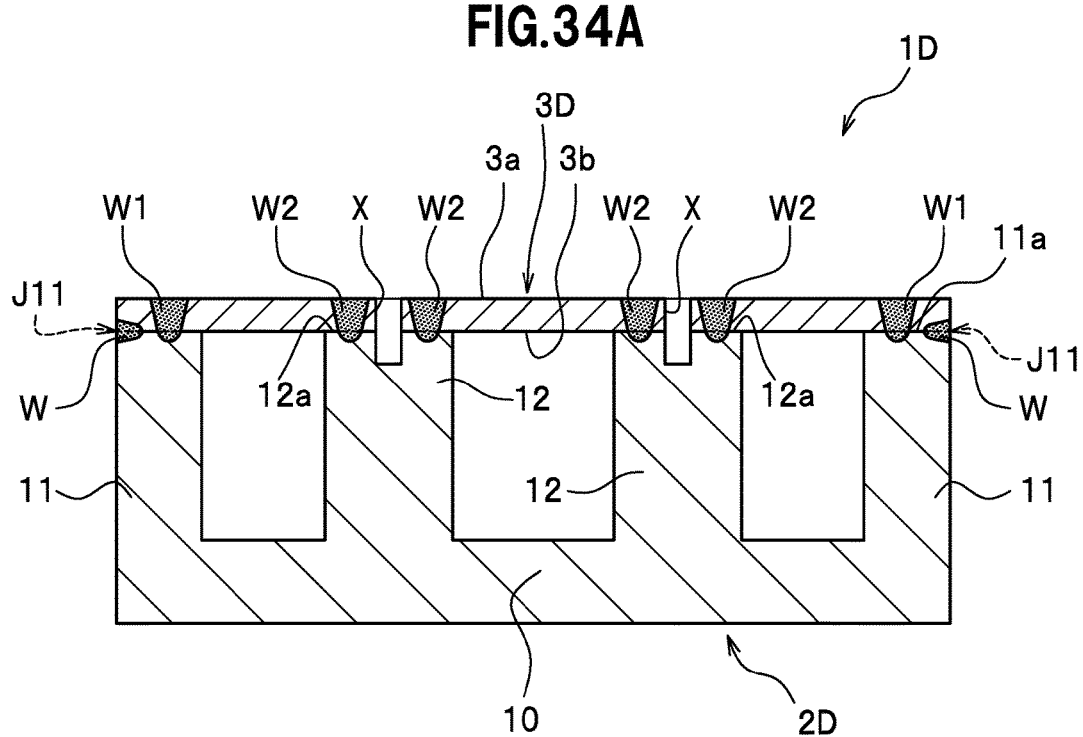

As shown in FIG. 34A, the boring step is a step of forming a fixing hole X which is communicated with the sealing body 3D and the columnar support 12. The fixing hole X is a hole for use in mounting a heat-generating element H.

In the burring step, burrs are removed, which have been exposed on the surfaces of the jacket body 2D and the sealing body 3D in the provisional joining step, the first primary joining step, the second primary joining step, and the boring step. This allows the surfaces of the jacket body 2D and the sealing body 3D to be cleanly finished.

Figure 34B:
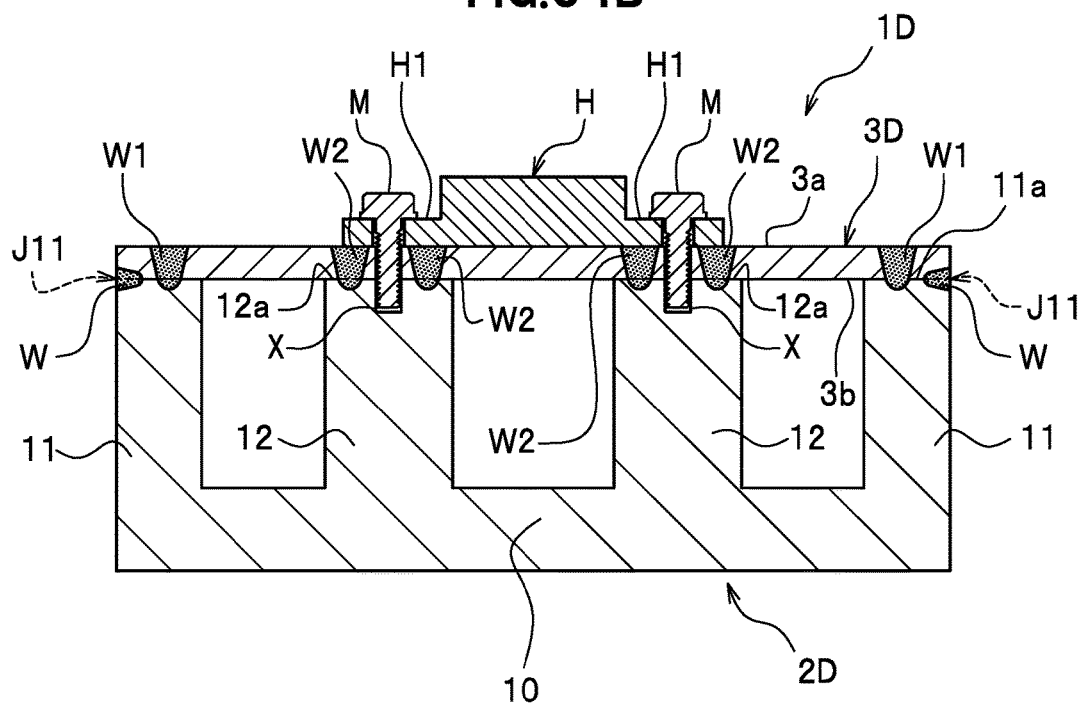

As shown in FIG. 34B, the mounting step is a step of mounting the heat-generating element H through fitting members M. When the heat-generating element H is mounted, it is fixed with the fitting members M such as screws while allowing through-holes formed in a flange H1 of the heat-generating element H to be communicated with the fixing holes X. The fitting member M is inserted to a position at which the columnar support 12 is reached.

Note that, although in the present embodiment, the fixing hole X is formed in the columnar support 12 to mount the heat-generating element H on the sealing body 3D, a fixing hole that reaches the columnar support 12 may be formed in the bottom part 10 to mount the heat-generating element H on the bottom part 10. The heat-generating element H only needs to be mounted on at least one of the sealing body 3D and the bottom part 10. Also, although the fixing holes X are formed in the present embodiment, the heat-generating element H may be fixed with the fitting members M without forming the fixing holes X.

According to the manufacturing method for the liquid-cooled jacket described above, the sealing body 3D is supported by the columnar supports 12, and the sealing body 3D and the columnar supports 12 are joined together by frictional stirring, thus making it possible to increase deformation resistance of the liquid-cooled jacket 1D. Also, according to the present embodiment, the columnar supports 12 are disposed in the hollow section within the liquid-cooled jacket 1D, thus allowing heat transport fluid to be brought into contact with outer peripheral surfaces of the columnar supports 12. Therefore, heat transferred to the columnar supports 12 from the heat-generating element H through the fitting members M can be efficiently exhausted. In other words, heat leak can be prevented from arising through the fitting members M that fix the heat-generating element H to the liquid-cooled jacket 1D. Moreover, since the columnar supports 12 to which the heat-generating element H is fixed are disposed inside the jacket body 2D, the liquid-cooled jacket 1D can be reduced in size.

Also, in the first primary joining step and the second primary joining step, since the shoulder portion of the rotary tool is not inserted into the sealing body 3D, widths of the plasticized regions W1, W2 can be decreased as compared to the conventional art, and a pressing force which acts on the jacket body 2D and the sealing body 3D can be reduced. The conventional manufacturing method has required the width of the wall parts 11A to 11D of the peripheral wall part 11 and the outside diameter of the columnar support 12 to be set to be greater than at least the diameter of the shoulder portion of the rotary tool. However, according to the present embodiment, even if the width of the wall parts 11A to 11D of the peripheral wall part 11 and the outside diameter of the columnar support 12 are decreased, the metal material can be prevented from escaping from inner corner portions constituted by the sealing body 3D and the peripheral wall part 11, or by the sealing body 3D and the columnar supports 12, thus improving a degree of freedom of designing.

Moreover, according to the manufacturing method for the liquid-cooled jacket according to the present embodiment, since only the stirring pin F2 is inserted into the jacket body 2D and the sealing body 3D, a load exerted on the friction stirring apparatus can be reduced as compared to a case where the shoulder portion of the rotary tool is pressed into the jacket body and the sealing body, and operability of the primary joining rotary tool F is bettered. Also, since the load exerted on the friction stirring apparatus can be reduced, the joining can be performed for the first overlapped portion J11 and the second overlapped portion J12 at deep locations, with no great load exerted on the friction stirring apparatus.

Furthermore, according to the manufacturing method for the liquid-cooled jacket according to the present embodiment, the provisional joining step is performed prior to the first primary joining step, thereby making it possible to prevent the sealing body 3D from being displaced in position when performing the first primary joining step and the second primary joining step.

Although the manufacturing method for the liquid-cooled jacket according to the fourth embodiment of the present invention is described above, appropriate design changes or modification are possible within the scope not departing from the gist of the present invention. Although in the present embodiment the primary joining step is performed for the first overlapped portion J11 and the second overlapped portion J12 in this order, for example, the friction stir welding may be performed initially for the second overlapped portion J12. Moreover, in the first primary joining step and the second primary joining step, the friction stir welding may be performed while allowing a cooling medium to flow within the jacket body 2D to cool the jacket body 2D and the sealing body 3D. This makes it possible to suppress the frictional heat, thus reducing deformation of the liquid-cooled jacket 1D due to heat contraction. Also, this method makes it possible to utilize the jacket body 2D and the sealing body 3D per se to cool the jacket body 2D and the sealing body 3D, without additionally using a cooling plate or a cooling unit. Moreover, the horizontal cross-section shape of the columnar support 12 may be other shapes.

Also, although the provisional joining rotary tool G is used to perform the provisional joining in the present embodiment, the primary joining rotary tool F may be used to perform the provisional joining. This makes it possible to save time and effort for exchanging one rotary tool for another. Moreover, the provisional joining step may be performed for the second overlapped portion J12 with the provisional joining rotary tool G or the primary joining rotary tool F being inserted into the second overlapped portion J12 from above the sealing body 3D. The provisional joining step only needs to be performed for at least one of the first overlapped portion J11 and the second overlapped portion J12.

Moreover, although the stirring pin F2 is allowed to contact with both of the sealing body 3D and the columnar support 12 in the first primary joining step and the second primary joining step, the insertion depth of the stirring pin F2 may be set to allow the stirring pin F2 to contact with only the sealing body 3D. In this case, heat generated by friction between the sealing body 3D and the stirring pin F2 causes the sealing body 3D and the peripheral wall part 11, or the sealing body 3D and the columnar support 12, to be plasticized and fluidized, allowing the first overlapped portion J11 and the second overlapped portion J12 to be joined together, respectively.

Further, the primary joining rotary tool F and the provisional joining rotary tool G may be attached on, for example, a robot arm having a rotation driving unit such as a spindle unit or the like provided at a head thereof. According to the configuration, the respective central rotation axes of the primary joining rotary tool F and the provisional joining rotary tool G can be easily changed with various angles. Although the provisional joining step in the present embodiment includes inserting the provisional joining rotary tool G from the side of the jacket body 2D, attachment of the provisional joining rotary tool G on the head of the robot arm makes it possible to easily perform the friction stir welding from the side of the jacket body 2D.

Furthermore, although the first primary joining step in the present embodiment includes inserting the primary joining rotary tool F from the front surface 3a of the sealing body 3D, friction stir welding may be performed over the entire circumference of the jacket body 2D while inserting the primary joining rotary tool F into the first overlapped portion J11 from the side of the jacket body 2D. Also in this case, attachment of the primary joining rotary tool F on the head of the robot arm makes it possible to easily perform the friction stir welding.

[First Modification]

Figure 35:
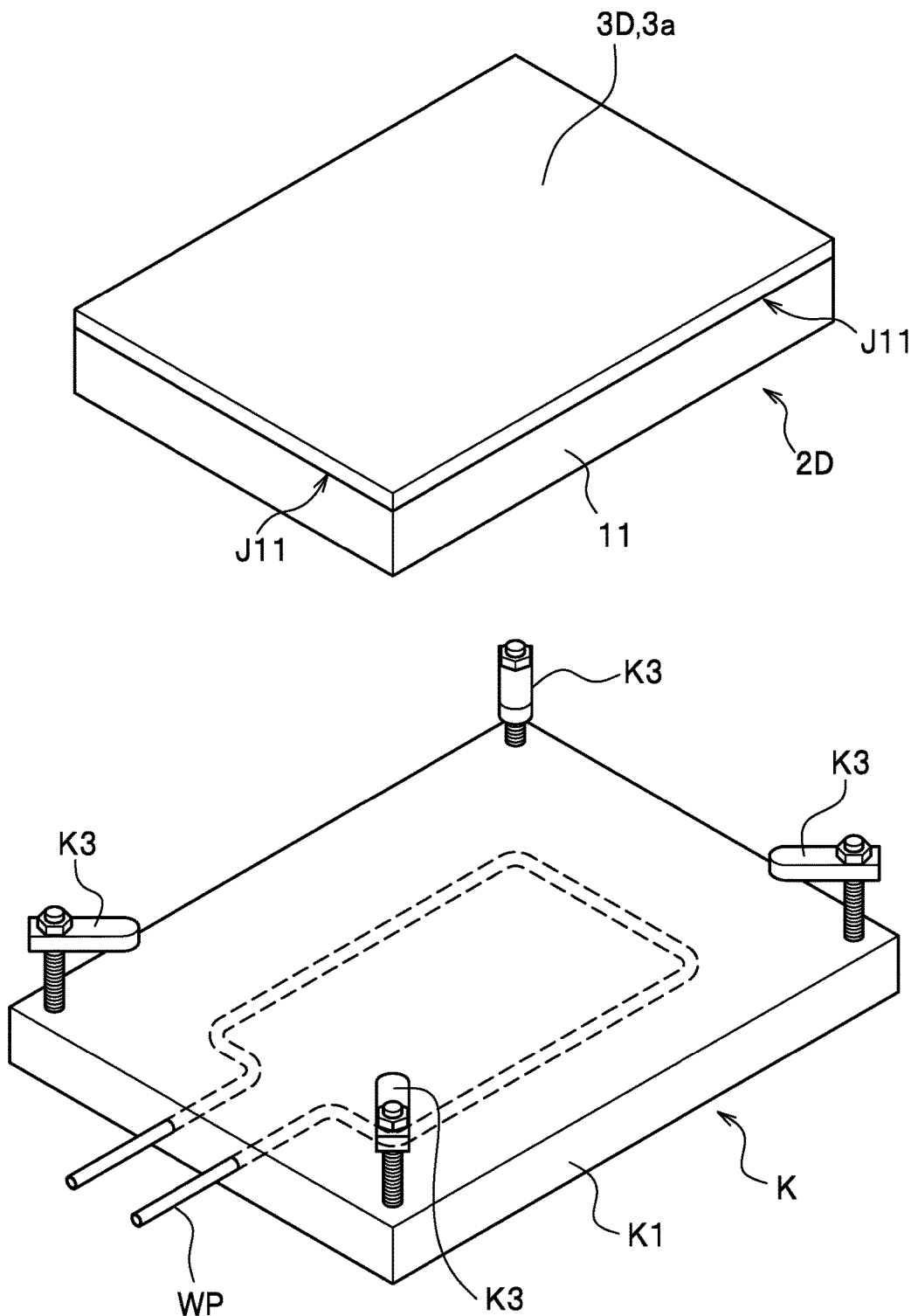
FIG. 35 is a perspective view showing a first modification of the manufacturing method for the liquid-cooled jacket according to the fourth embodiment.

Next, description will be given of a manufacturing method for a liquid-cooled jacket according to a first modification of the fourth embodiment. As shown in FIG. 35, the first modification of the fourth embodiment is different from the fourth embodiment in that the provisional joining step, the first primary joining step and the second primary joining step are performed using a cooling plate. The first modification of the fourth embodiment will be described with a focus on configurations different from the fourth embodiment.

As shown in FIG. 35, in the first modification of the fourth embodiment, the jacket body 2D is fixed on a table K when performing the fixing step.

The cooling pipe WP is a tubular member embedded within the substrate K1. The cooling pipe WP is adapted to allow a cooling medium for cooling the substrate K1 to flow therein. A location of the cooling pipe WP, namely the form of a cooling flow passage allowing the cooling medium to flow therein, is not particularly limited, but in the first modification of the fourth embodiment, is of a planar shape which follows the movement locus of the primary joining rotary tool F in the first primary joining step. More specifically, the cooling pipe WP is disposed so that the cooling pipe WP and the first overlapped portion J11 are nearly overlapped each other in planar view.

In the provisional joining step, the first primary joining step and the second primary joining step in the first modification of the fourth embodiment, the jacket body 2D is first fixed on the table K and friction stir welding is then performed while allowing a cooling medium to flow in the cooling pipe WP. This allows frictional heat generated in the frictional stirring to be suppressed low, thus making it possible to reduce deformation of the liquid-cooled jacket 1D due to heat contraction. Also, in the first modification of the fourth embodiment, since the cooling flow passage is disposed to overlap with the first overlapped portion J11 (the movement locus of the primary joining rotary tool F) in planar view, the portion in which the frictional heat is generated can be intensively cooled. This makes it possible to increase a cooling efficiency of the liquid-cooled jacket. Moreover, since the cooling pipe WP is disposed to allow a cooling medium to flow therein, control of the cooling medium can be easily performed. Furthermore, since the table K (cooling plate) and the jacket body 2D come into surface contact with each other, the cooling efficiency can be further increased.

Note that, in addition to cooling the jacket body 2D and the sealing body 3D using the table K (cooling plate), the friction stir welding may be performed while allowing a cooling medium to flow within the jacket body 2D.

[Second Modification]

Figure 36A:
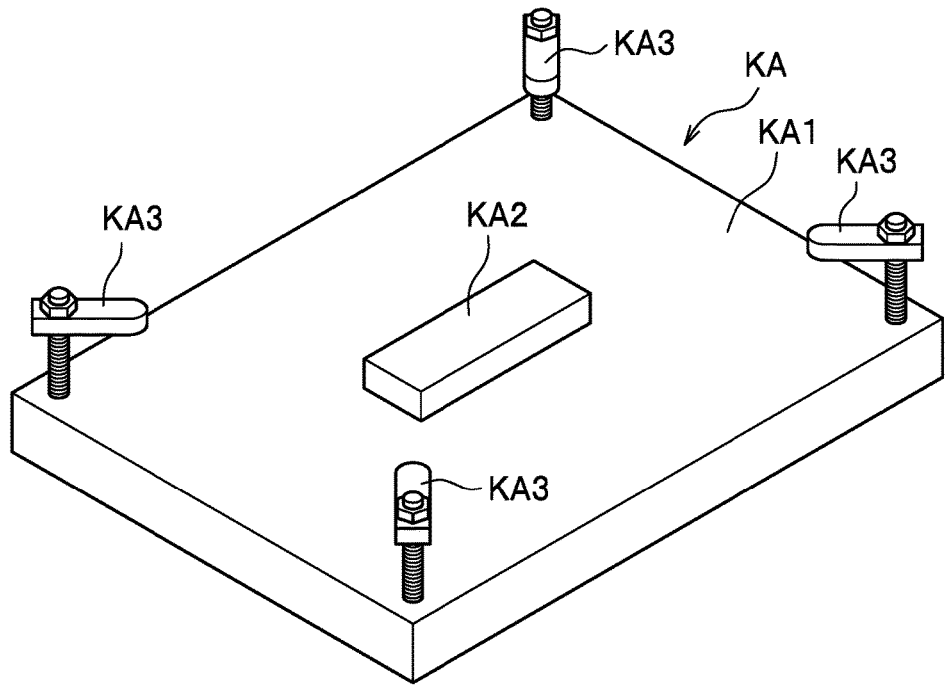
Figure 36B:
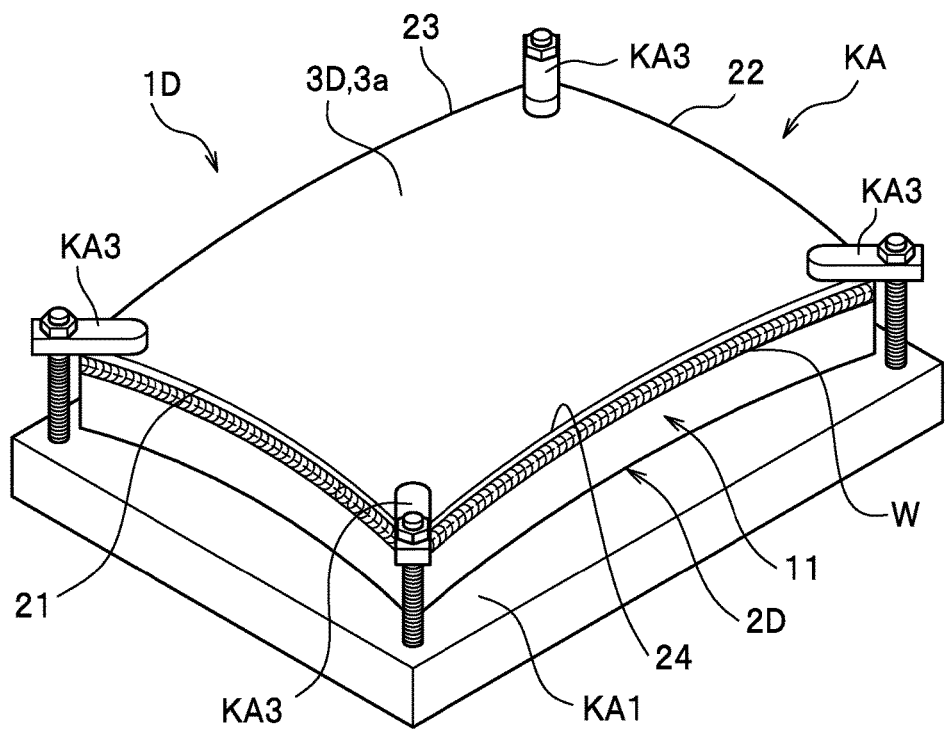

Next, description will be given of a manufacturing method for a liquid-cooled jacket according to a second modification of the fourth embodiment. As shown in FIGS. 36A and 36B, the second modification of the fourth embodiment is different from the fourth embodiment in that the first primary joining step and the second primary joining step are performed in a state in which the front surface side of the jacket body 2D and the front surface 3a of the sealing body 3D are curved to have a convex shape. The second modification will be described with a focus on configurations different from the fourth embodiment.

As shown in FIGS. 36A and 36B, a table KA is employed in the second modification of the fourth embodiment. The table KA is composed of a substrate KA1 having the form of a rectangular parallelepiped, a spacer KA2 formed in the center of the substrate KA1, and clamps KA3 each formed in four corners of the substrate KA1. The spacer KA2 may be formed integrally with or separately from the substrate KA1.

In the fixing step in the second modification of the fourth embodiment, the jacket body 2D and the sealing body 3D integrated with each other in the provisional joining step are fixed on the table KA by means of the clamps KA3. As shown in FIG. 36B, when the jacket body 2D and the sealing body 3D are fixed on the table KA, they are curved to allow the bottom part 10 and the peripheral wall end face 11a of the jacket body 2D and the front surface 3a of the sealing body 3D to have an upwardly convex shape. More specifically, the jacket body 2D and the sealing body 3D are curved to allow a first side portion 21, a second side portion 22, a third side portion 23 and a fourth side portion 24 of the sealing body 3D to exhibit a curved line.

In the first primary joining step and the second primary joining step in the second modification according to the fourth embodiment, the friction stir welding is performed by means of the primary joining rotary tool F. In the first primary joining step and the second primary joining step, the amount of deformation of at least one of the jacket body 2D and the sealing body 3D is measured beforehand and the friction stir welding is then performed while adjusting the insertion depth of the stirring pin F2 according to the amount of deformation. More specifically, the primary joining rotary tool F is moved to allow the movement locus thereof to trace a curved line along the curved surfaces of the peripheral wall end face 11a of the jacket body 2D and the front surface 3a of the sealing body 3D. This makes it possible to keep the depth and width of the plasticized region W1, W2 constant.

There is a risk that heat input at the time of friction stir welding causes heat contraction to be generated in the plasticized region W1, W2 and the sealing body 3D of the liquid-cooled jacket 1D to be deformed into a concave shape. However, according to the first primary joining step and the second primary joining step in the second modification of the fourth embodiment, since the jacket body 2D and the sealing body 3D are fixed in the form of a convex shape beforehand so as to allow a tensile stress to act on the peripheral wall end face 11a and the front surface 3a, the liquid-cooled jacket 1D can be made flat by making use of the heat contraction after the friction stir welding. Moreover, where the primary joining step is performed by means of the conventional rotary tool, a problem occurs in that, when the jacket body 2D and the sealing body 3D are warped in the form of a convex shape, the shoulder portion of the rotary tool comes in contact with the jacket body 2D and the sealing body 3D and thus operability of the rotary tool is decreased. However, according to the second modification of the fourth embodiment, since the primary joining rotary tool F has no shoulder portion, operability of the primary joining rotary tool F is bettered even if the jacket body 2D and the sealing body 3D are warped in the form of a convex shape.

Note that the measurement of the amount of deformation of the jacket body 2D and the sealing body 3D can be made using a known height detecting device. Also, a friction stirring apparatus equipped with, for example, a detecting device that detects a height from the table KA to at least one of the jacket body 2D and the sealing body 3D, may be used to perform the first primary joining step and the second primary joining step while detecting the amount of deformation of the jacket body 2D or the sealing body 3D.

Also, although the jacket body 2D and the sealing body 3D are curved to allow all of the first to fourth side portions 21 to 24 to exhibit a curved line in the second modification of the fourth embodiment, the form of curves is not limited to this example. For example, the jacket body 2D and the sealing body 3D may be curved to allow the first side portion 21 and the second side portion 22 to exhibit a straight line and to allow the third side portion 23 and the fourth side portion 24 to exhibit a curved line. Also, for example, the jacket body 2D and the sealing body 3D may be curved to allow the first side portion 21 and the second side portion 22 to exhibit a curved line and to allow the third side portion 23 and the fourth side portion 24 to exhibit a straight line.

Further, although the position of height of the stirring pin F2 is changed according to the amount of deformation of the jacket body 2D or the sealing body 3D in the second modification of the fourth embodiment, the primary joining step may be performed with the height of the stirring pin F2 relative to the table KA being kept constant.

Moreover, the spacer KA2 may have any shape or form as long as the jacket body 2D and the sealing body 3D can be fixed to allow the front surface sides thereof to have a convex shape. Also, the spacer KA2 may be omitted as long as the jacket body 2D and the sealing body 3D can be fixed to allow the front surface sides thereof to have a convex shape.

[Third Modification]

Next, description will be given of a manufacturing method for a liquid-cooled jacket according to a third modification of the fourth embodiment. As shown in FIG. 37, the third modification of the fourth embodiment is different from the fourth embodiment in that the jacket body 2D and the sealing body 3D are formed to allow the front surface sides thereof to be curved into a convex shape beforehand in the preparation step. The third modification of the fourth embodiment will be described with a focus on configurations different from the fourth embodiment.

In the preparation step according to the third modification of the fourth embodiment, the jacket body 2D and the sealing body 3D are formed by die-casting to allow the front surface sides thereof to be curved into a convex shape. This allows the jacket body 2D to be formed to allow the bottom part 10 and the peripheral wall part 11 to have an upwardly convex shape, respectively. Also, the sealing body 3D is formed to allow the front surface 3a thereof to have an upwardly convex shape.

As shown in FIG. 38, in the third modification of the fourth embodiment, the jacket body 2D and the sealing body 3D provisionally joined together are fixed on a table KB when performing the fixing step. The table KB is composed of a substrate KB1 in the form of a rectangular parallelepiped, a spacer KB2 disposed in the center of the substrate KB1, clamps KB3 each formed in four corners of the substrate KB1, and a cooling pipe WP embedded inside the substrate KB1. The table KB is a member that immovably fixes the jacket body 2D thereon and serves as a "cooling plate" set forth in the claims.

The spacer KB2 is composed of a curved surface KB2a curved to have an upwardly convex shape, and elevation surfaces KB2b, KB2b formed at both ends of the curved surface KB2a and rising from the substrate KB1. The spacer KB2 has a first side portion Ka and a second side portion Kb which exhibit a curved line, and a third side portion Kc and a fourth side portion Kd which exhibit a straight line.

The cooling pipe WP is a tubular member embedded within the substrate KB1. The cooling pipe WP is adapted to allow a cooling medium for cooling the substrate KB1 to flow therein. A location of the cooling pipe WP, namely the form of a cooling flow passage allowing the cooling medium to flow therein, is not particularly limited, but in the third modification of the fourth embodiment, is of a planar shape which follows the movement locus of the primary joining rotary tool F in the first primary joining step. More specifically, the cooling pipe WP is disposed so that the cooling pipe WP and the first overlapped portion J11 are nearly overlapped each other in planar view.

In the fixing step according to the third modification of the fourth embodiment, the jacket body 2D and the sealing body 3D integrated with each other in the provisional joining step are fixed on the table KB by means of the clamps KB3. More specifically, the jacket body 2D and the sealing body 3D are fixed on the table KB to allow the back surface of the bottom part 10 of the jacket body 2D to come into surface contact with the curved surface KB2a. When the jacket body 2D and the sealing body 3D are fixed on the table KB, they are curved to allow the first side portion 21 of the wall part 11A of the jacket body 2D and the second side portion 22 of the wall part 11B to exhibit a curved line, and to allow the third side portion 23 of the wall part 11C and the fourth side portion 24 of the wall part 11D to exhibit a straight line.

In the first primary joining step and the second primary joining step in the third modification of the fourth embodiment, the friction stir welding is performed for the first overlapped portion J11 and the second overlapped portion J12, respectively, by means of the primary joining rotary tool F. In the first primary joining step and the second primary joining step, the amount of deformation of at least one of the jacket body 2D and the sealing body 3D is measured beforehand and the friction stir welding is then performed while adjusting the insertion depth of the stirring pin F2 according to the amount of deformation. More specifically, the primary joining rotary tool F is moved to allow the movement locus thereof to trace a curved line or a straight line along the peripheral wall end face 11a of the jacket body 2D and the front surface 3a of the sealing body 3D. This makes it possible to keep the depth and width of the plasticized regions W1, W2 constant.

There is a risk that heat input at the time of friction stir welding causes heat contraction to be generated in the plasticized regions W1, W2 and the sealing body 3D of the liquid-cooled jacket 1D to be deformed into a concave shape. However, according to the first primary joining step and the second primary joining step in the third modification of the fourth embodiment, since the jacket body 2D and the sealing body 3D are formed into a convex shape beforehand, the liquid-cooled jacket 1D can be made flat by making use of the heat contraction after the friction stir welding.

Moreover, in the third modification of the fourth embodiment, the curved surface KB2a of the spacer KB2 comes into surface contact with the back surface which is in a concave shape, of the bottom part 10 of the jacket body 2D. This makes it possible to perform the friction stir welding while cooling the jacket body 2D and the sealing body 3D more effectively. Since the frictional heat generated in the friction stir welding can be suppressed low, deformation of the liquid-cooled jacket 1D due to heat contraction can be reduced. This makes it possible to reduce a curvature of the jacket body 2D and the sealing body 3D when the jacket body 2D and the sealing body 3D are formed into a convex shape in the preparation step.

Note that the measurement of the amount of deformation of the jacket body 2D and the sealing body 3D can be made using a known height detecting device. Moreover, a friction stirring apparatus equipped with, for example, a detecting device that detects a height from the table KB to at least one of the jacket body 2D and the sealing body 3D, may be used to perform the primary joining step while detecting the amount of deformation of the jacket body 2D or the sealing body 3D.

Moreover, although the jacket body 2D and the sealing body 3D are curved to allow the first side portion 21 and the second side portion 22 to exhibit a curved line in the third modification of the fourth embodiment, the form of curves is not limited to this example. For example, the spacer KB2 having a spherical surface may be formed to allow the back surface of the bottom part 10 of the jacket body 2D to come into surface contact with the spherical surface. In this case, when the jacket body 2D is fixed on the table KB, all of the first to fourth side portions 21 to 24 exhibit a curved line.

Moreover, although the position of height of the stirring pin F2 is changed according to the amount of deformation of the jacket body 2D or the sealing body 3D in the third modification of the fourth embodiment, the primary joining step may be performed with the height of the stirring pin F2 relative to the table KB being kept constant.

Fifth Embodiment

Figure 39:
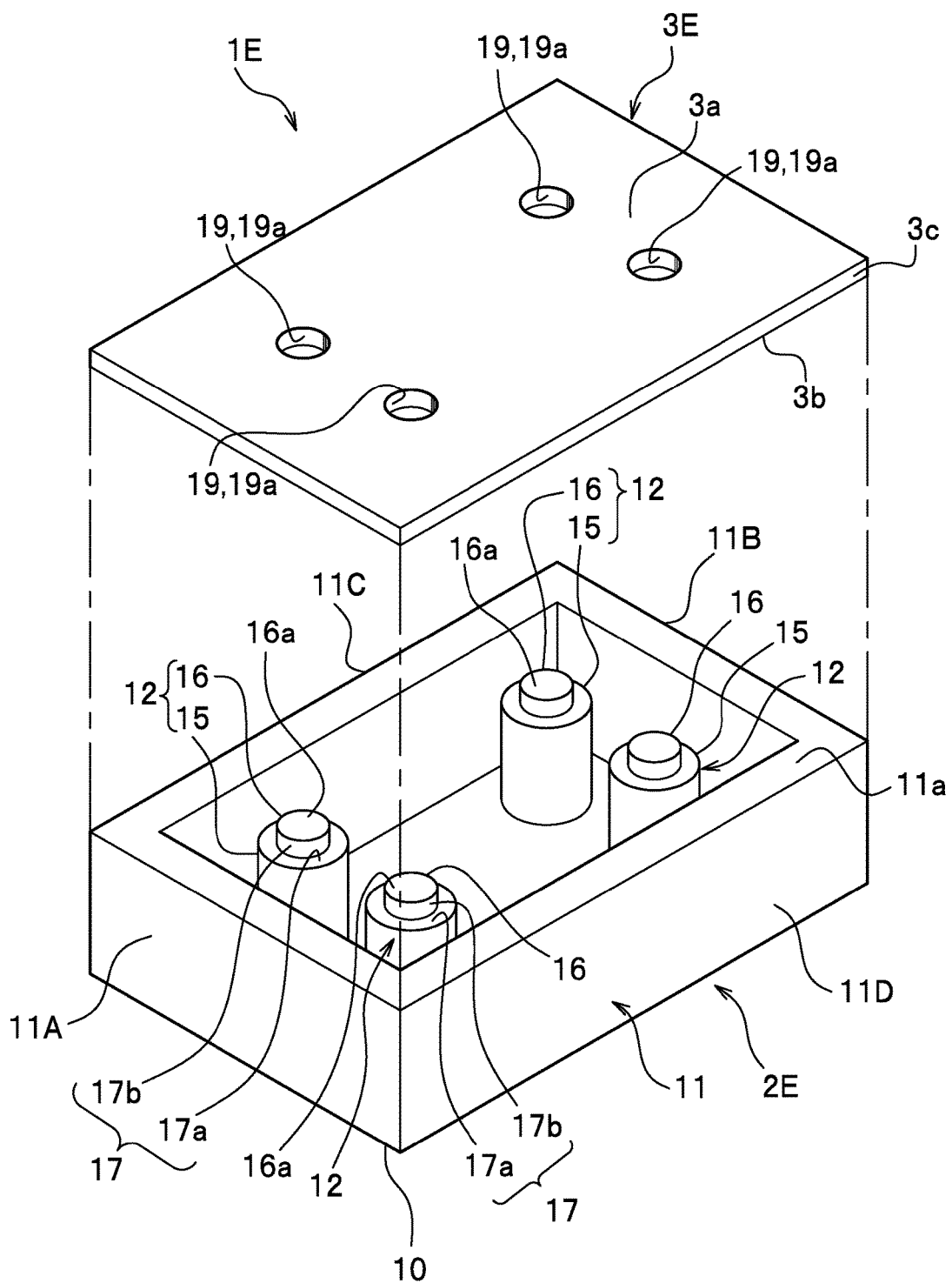
FIG. 39 is an exploded perspective view showing a liquid-cooled jacket according to a fifth embodiment.

Next, description will be given of a method of manufacturing a liquid-cooled jacket according to a fifth embodiment of the present invention. As shown in FIG. 39, the fifth embodiment is different from the fourth embodiment in that the columnar support 12 has a columnar support stepped portion 17 formed thereon. The method of manufacturing the liquid-cooled jacket according to the fifth embodiment will be described with a focus on configurations different from the fourth embodiment.

A liquid-cooled jacket 1E according to the fifth embodiment is composed of a jacket body 2E and a sealing body 3E. The jacket body 2E is a box-shaped body which opens upward. The jacket body 2E includes a bottom part 10, a peripheral wall part 11, and a plurality of columnar supports 12. The bottom part 10 has the form of a rectangle in planar view. The peripheral wall part 11 is composed of wall parts 11A, 11B, 11C and 11D, each having the same plate thickness.

The columnar supports 12 are provided to stand on the bottom part 10 and have the form of a circular column. The number of the columnar supports 12 is not particularly limited as long as it is one or more, but four columnar supports 12 are formed in the present embodiment. The columnar supports 12 each have the same shape. The columnar supports 12 are each composed of a large-diameter part 15 and a small-diameter part 16. The columnar support stepped portion 17 is formed on a step between the large-diameter part 15 and the small-diameter part 16. The columnar support stepped portion 17 is composed of a step bottom surface 17a, and a step side surface 17b rising from the step bottom surface 17a. The step bottom surface 17a and the peripheral wall end face 11a of the peripheral wall part 11 are formed in the same plane. The height dimension of the step side surface 17b is the same as the plate thickness dimension of the sealing body 3E.

The sealing body 3E is a plate-like member having the form of a rectangle in planar view. The sealing body 3E has the same planar shape as the jacket body 2E. Materials for the sealing body 3E are not particularly limited, but in the present embodiment, the sealing body 3E is formed of the same material as the jacket body 2E. The sealing body 3E has four holes 19 formed therein, which correspond to the columnar supports 12. The hole 19 is a section into which the small-diameter part 16 of the columnar support 12 is inserted.

Figure 40:
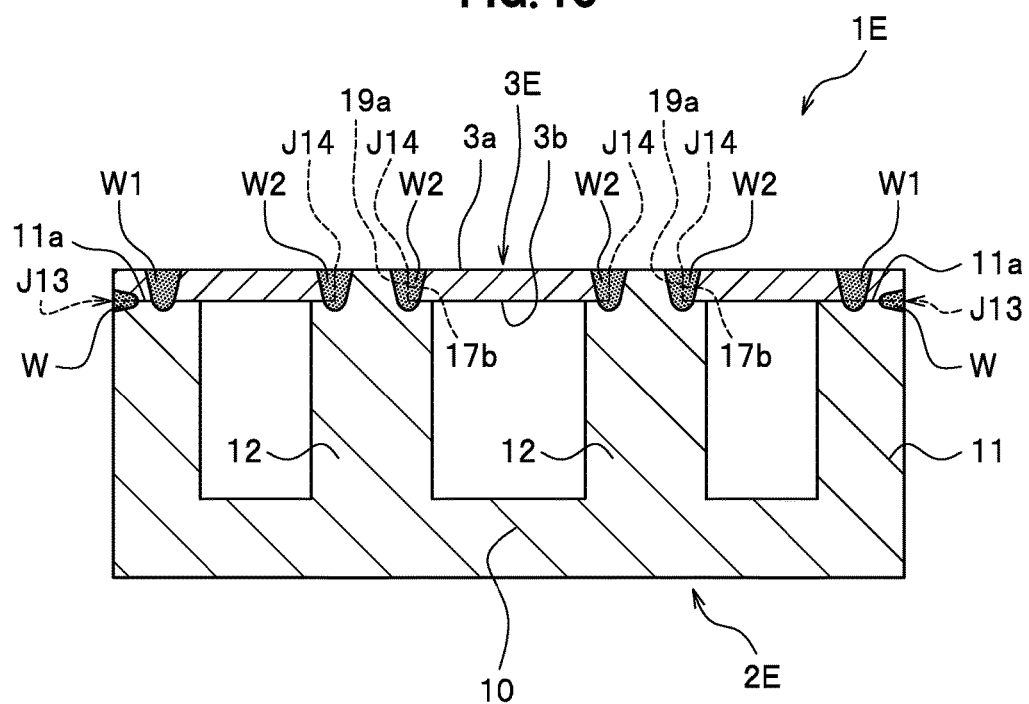
FIG. 40 is a cross-sectional view showing the liquid-cooled jacket according to the fifth embodiment.

As shown in FIG. 40, the liquid-cooled jacket 1E is one obtained by joining together the jacket body 2E and the sealing body 3E by frictional stirring to be integrated with each other. In the liquid-cooled jacket 1E, an overlapped portion J13 in which the peripheral wall end face 11a of the peripheral wall part 11 and a back surface 3b of the sealing body 3E are overlapped each other, and four abutment portions J14 in each of which the step side surface 17b of columnar support stepped portion 17 and a hole wall 19a of the hole 19 abut on each other, are joined together by frictional stirring, respectively. The plasticized regions W, W1 are formed on the overlapped portion J13, and the plasticized region W2 is formed on the abutment portion J14. The liquid-cooled jacket 1E has a hollow section formed therein, in which heat transport fluid flows for transporting heat to the outside.

Next, description will be given of a manufacturing method for the liquid-cooled jacket according to the fifth embodiment (a manufacturing method for the liquid-cooled jacket with a heat-generating element). The manufacturing method for the liquid-cooled jacket includes a preparation step, a placing step, a fixing step, a provisional joining step, a first primary joining step, a second primary joining step, a boring step, a burring step, and a mounting step.

As shown in FIG. 39, the preparation step is a step of forming the jacket body 2E and the sealing body 3E. The jacket body 2E is formed, for example, by die-casting.

Figure 41A:
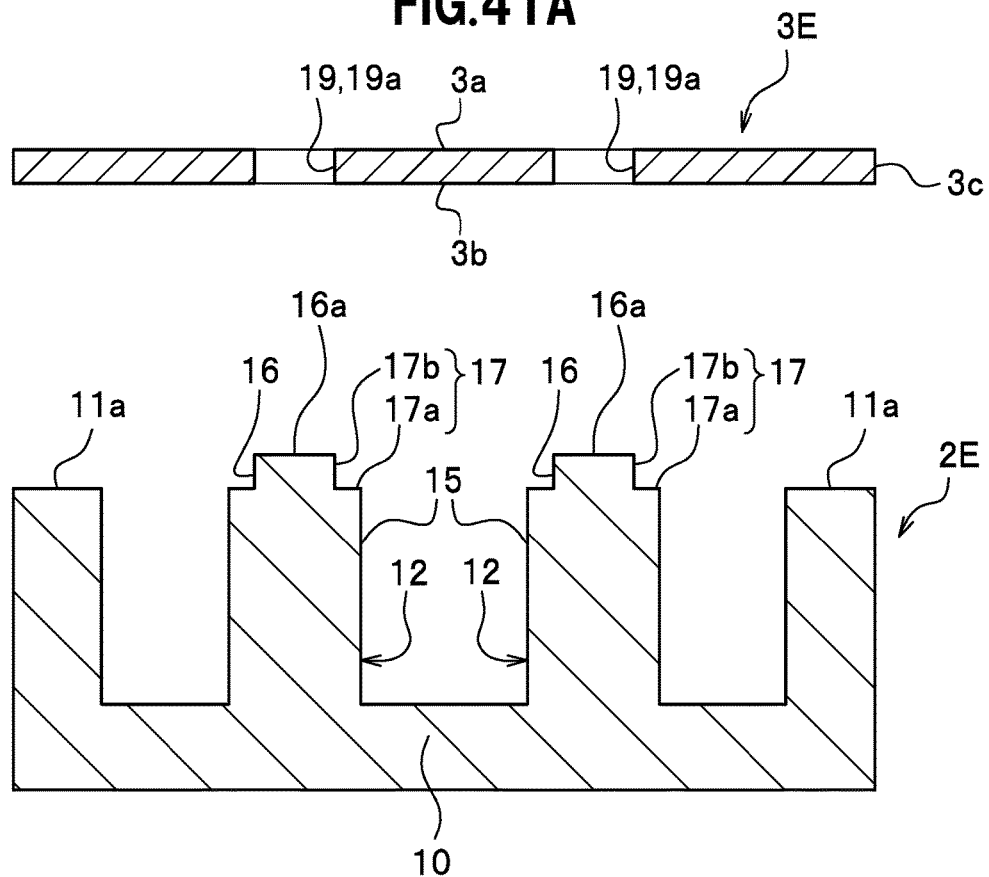
Figure 41B:
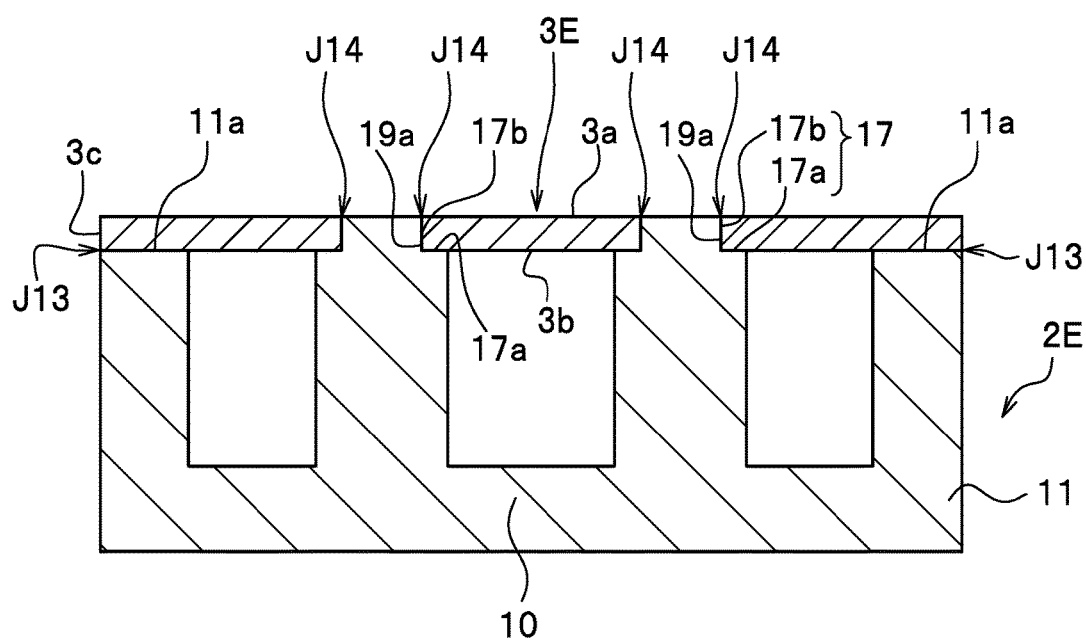

As shown in FIGS. 41A and 41B, the placing step is a step of placing the sealing body 3E on the jacket body 2E while allowing the small-diameter parts 16 of the columnar supports 12 to be inserted into the holes 19 of the sealing body 3E. The back surface 3b of the sealing body 3E comes into surface contact with the peripheral wall end face 11a of the peripheral wall part 11 and the step bottom surface 17a of the columnar support stepped portion 17, respectively. The placing step allows the back surface 3b of the sealing body 3E and the peripheral wall end face 11a of the peripheral wall part 11 to be overlapped each other to form the overlapped portion J13. Also, the placing step allows the step side surfaces 17b of the columnar support stepped portions 17 and the hole walls 19a of the holes 19 to abut on each other to form the abutment portions J14. Moreover, the placing step allows the columnar support end face 16a and the front surface 3a of the sealing body 3E to be flush with each other.

In the fixing step, the jacket body 2E and the sealing body 3E are fixed on a table (not shown). The jacket body 2E and the sealing body 3E are immovably fixed on the table by means of a fixing tool such as a clamp.

Figure 42:
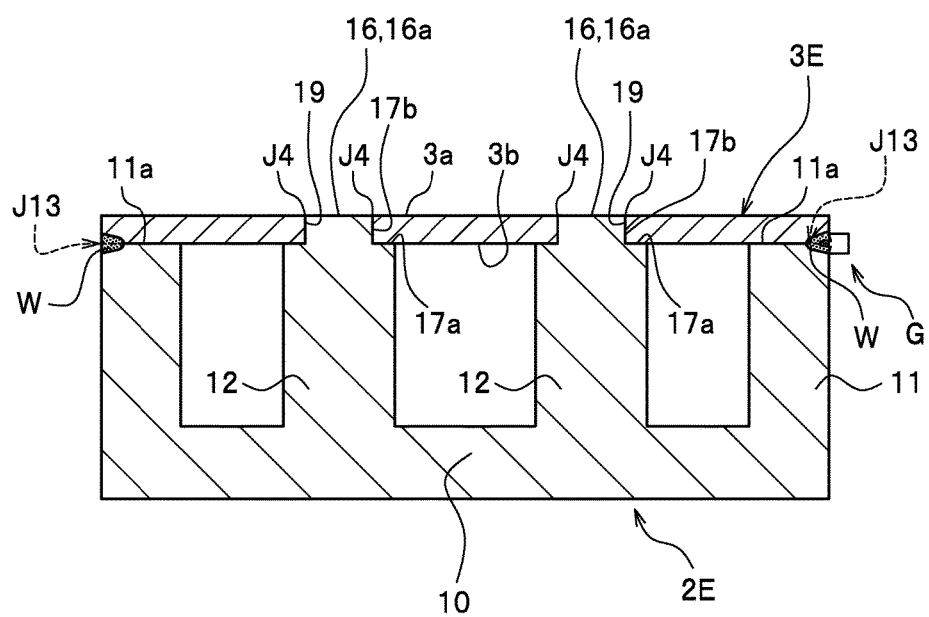
FIG. 42 is a cross-sectional view showing a provisional joining step in the manufacturing method for the liquid-cooled jacket according to the fifth embodiment.

As shown in FIG. 42, the provisional joining step is a step of provisionally joining the jacket body 2E and the sealing body 3E together. The provisional joining step is the same as that in the fourth embodiment, and thus explanation thereof is omitted.

Figure 43A:
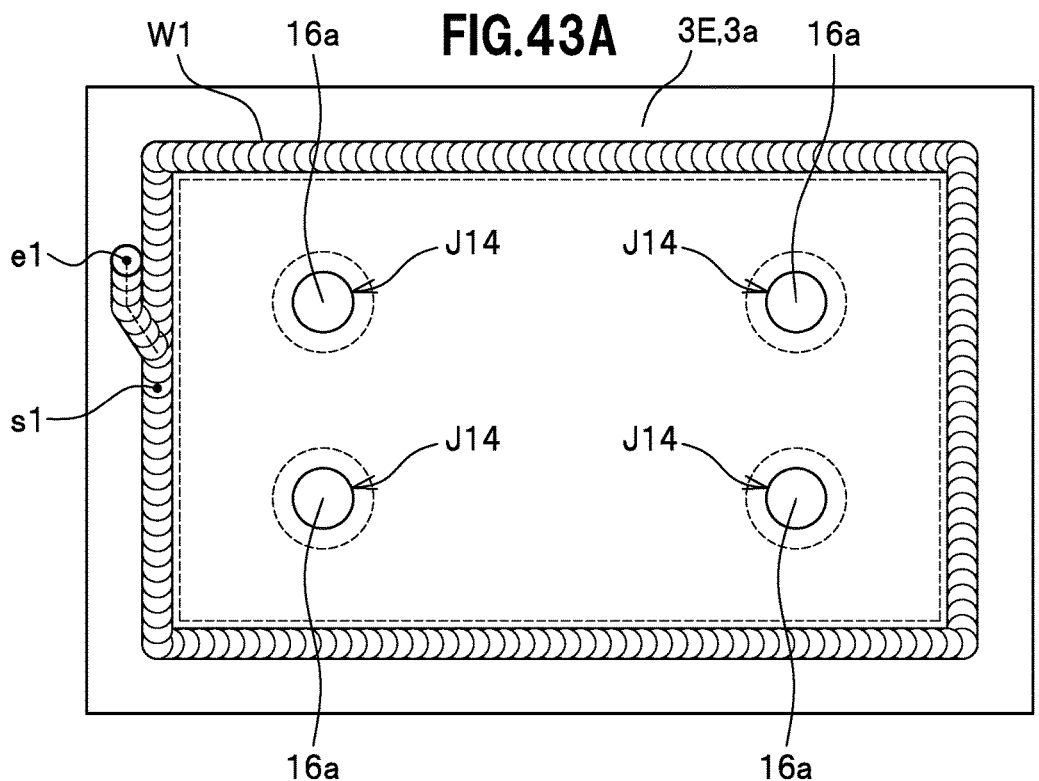
Figure 43B:
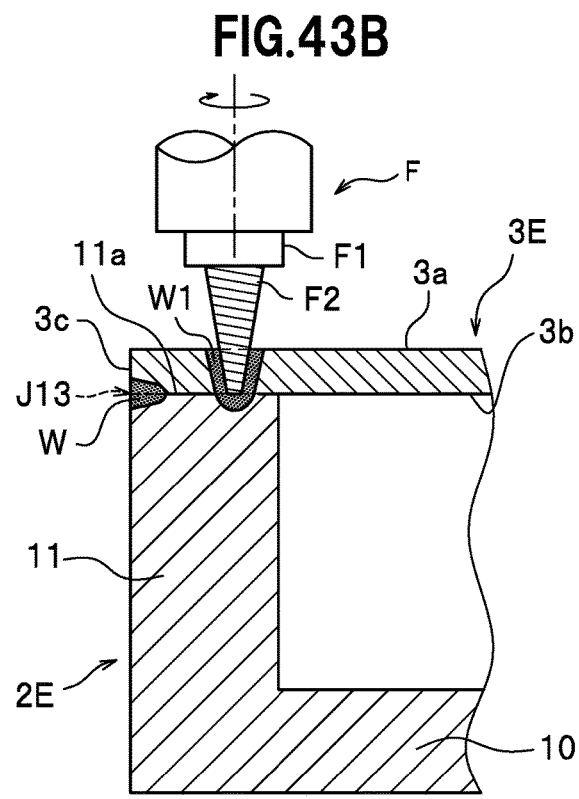

As shown in FIGS. 43A and 43B, the first primary joining step is a step of performing friction stir welding for the overlapped portion J13 by means of the primary joining rotary tool F. The first primary joining step is the same as that in the fourth embodiment, and thus explanation thereof is omitted.

Figure 44A:
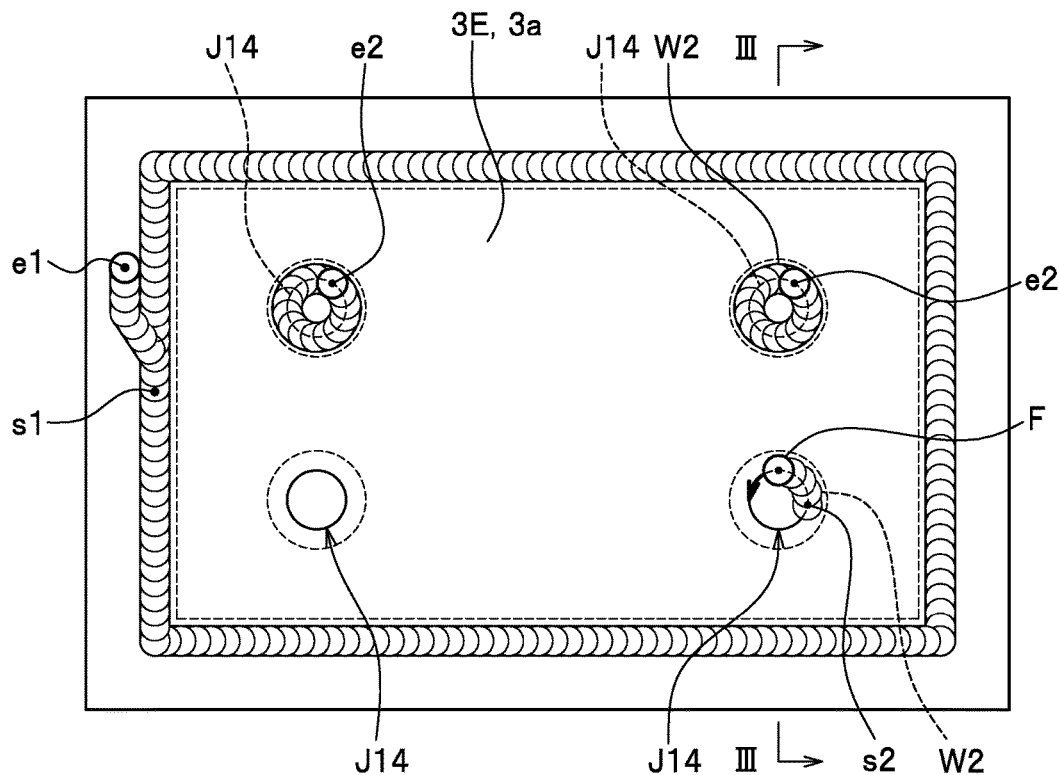
Figure 44B:
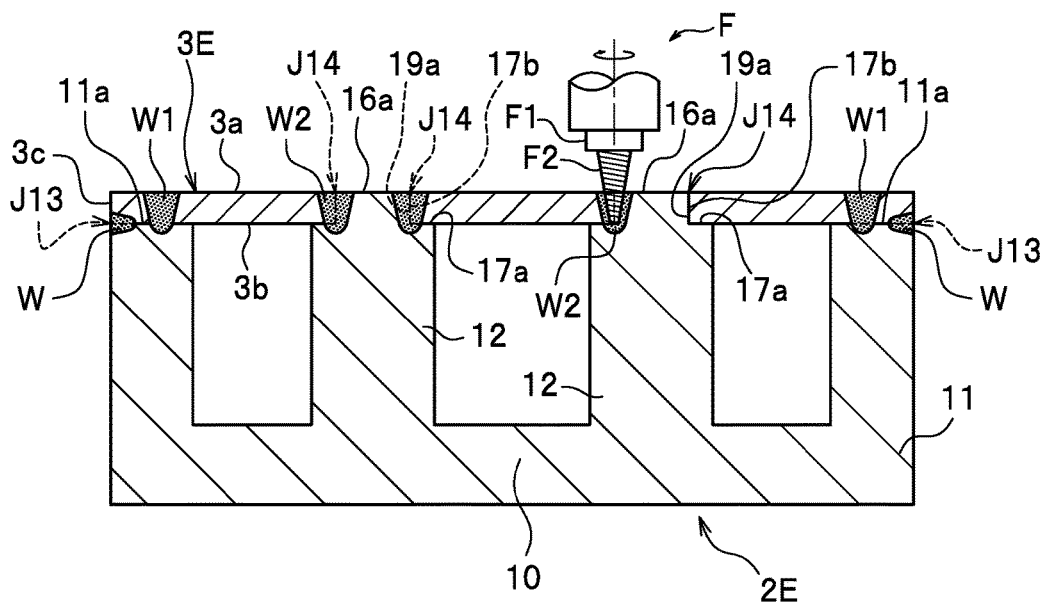

As shown in FIGS. 44A and 44B, the second primary joining step is a step of performing friction stir welding for each of the abutment portions J14 by means of the primary joining rotary tool F. In the second primary joining step, the primary joining rotary tool F being rotated clockwise is inserted into an arbitrary starting position s2 set on the abutment portion J14 and the primary joining rotary tool F is moved counterclockwise along the abutment portion J14. The second primary joining step allows the plasticized region W2 to be formed on each of the abutment portions J14.

As shown in FIG. 44B, an insertion depth of the stirring pin F2 is set to allow the tip of the stirring pin F2 to reach the step bottom surface 17a of the columnar support stepped portion 17, and set to allow only the stirring pin F2 to contact with the sealing body 3E and the columnar support 12. Then, the primary joining rotary tool F is moved to trace each of the abutment portions J14 with a constant depth thereof being kept.

In the second primary joining step, where the primary joining rotary tool F is moved counterclockwise for the columnar support 12 as in the present embodiment, the primary joining rotary tool F is preferably rotated clockwise. On the other hand, where the primary joining rotary tool F is moved clockwise for the columnar support 12, the primary joining rotary tool F is preferably rotated counterclockwise. The movement direction and rotation direction of the primary joining rotary tool F are set as described above, allowing joining defects caused by the friction stir welding to be formed in the columnar support 12 having a relatively great thickness and to be formed at a position away from the hollow section of the liquid-cooled jacket 1E, thus making it possible to suppress a decrease in water-tightness and air-tightness.

As shown in FIG. 44A, after the primary joining rotary tool F is allowed to move one round along the abutment portion J14, it is allowed to pass through the starting position s2 as it is. Then, the primary joining rotary tool F is moved to an ending position e2 set on the abutment portion J14, and when reaching the ending position e2, the primary joining rotary tool F is moved upward to allow the primary joining rotary tool F to be pulled out from the abutment portion J14.

Where a pull-out trace of the primary joining rotary tool F remains on the abutment portion J14 after pulled out from the abutment portion J14, a repairing step for repairing the pull-out trace may be performed. For the repairing step, for example, weld metal can be filled by buildup welding in the pull-out trace for the repairing. This allows the front surface 3a of the sealing body 3E and the columnar support end face 16a of the columnar support 12 to be made flat.

Note that, where the primary joining rotary tool F is pulled out from the abutment portion J14, the primary joining rotary tool F may be shifted to the center side of the columnar support 12 to be pulled out from the columnar support 12. Also, where the primary joining rotary tool F is pulled out from the abutment portion J14, for example, the primary joining rotary tool F may be gradually moved upward while moving the primary joining rotary tool F on the abutment portion J14 or on the columnar support end face 16a, to allow the insertion depth of the primary joining rotary tool F to be gradually reduced. This makes it possible to allow no pull-out trace after the second primary joining step to remain on the front surface 3a of the sealing body 3E and the columnar support end face 16a of the columnar support 12, or if any, to reduce the pull-out trace.

As shown in FIG. 45A, the boring step is a step of forming a fixing hole X which is communicated with the sealing body 3E and the columnar support 12 and used in fixing a heat-generating element H. The fixing hole X is formed to reach the columnar support 12.

In the burring step, burrs are removed, which have been exposed on the surfaces of the jacket body 2E and the sealing body 3E in the first primary joining step, the second primary joining step, and the boring step. This allows the surfaces of the jacket body 2E and the sealing body 3E to be cleanly finished.

As shown in FIG. 45B, the mounting step is a step of mounting the heat-generating element H through fitting members M. When the heat-generating element H is mounted, it is fixed with the fitting members M such as screws while allowing through-holes formed in a flange H1 of the heat-generating element H to be communicated with the fixing holes X. The fitting member M is inserted to a position at which the columnar support 12 is reached.

Note that, although in the present embodiment, the fixing hole X is formed on the sealing body 3E to fix the heat-generating element H to the sealing body 3E, a fixing hole communicated with the bottom part 10 and the columnar support 12 may be formed in the bottom part 10 to fix the heat-generating element H to the bottom part 10. The heat-generating element H only needs to be mounted on at least one of the sealing body 3E and the bottom part 10. Also, although the fixing holes X are formed in the present embodiment, the heat-generating element H may be fixed with the fitting members M without forming the fixing holes X.

The manufacturing method for the liquid-cooled jacket described above can also produce nearly the same advantageous effects as those in the fourth embodiment. Moreover, in the first primary joining step and the second primary joining step in the present embodiment, since the shoulder portion of the rotary tool is not inserted into the jacket body 2E and the sealing body 3E, widths of the plasticized regions W1, W2 can be decreased as compared to the conventional art, and a pressing force which acts on the jacket body 2E and the sealing body 3E can be reduced. According to the present embodiment, even if the width of the peripheral wall end face 11a of the peripheral wall part 11 and the width of the step bottom surface 17a of the columnar support stepped portion 17 are decreased, the metal material can be prevented from escaping from inner corner portions constituted by the sealing body 3E and the peripheral wall part 11, or by the sealing body 3E and the columnar supports 12, thus improving a degree of freedom of designing.

Moreover, according to the manufacturing method for the liquid-cooled jacket according to the present embodiment, the provisional joining step is performed prior to the first primary joining step, thereby making it possible to prevent the sealing body 3E from being displaced in position when performing the first primary joining step and the second primary joining step.

Furthermore, the columnar supports 12 (columnar support end faces 16a) are exposed on the front surface 3a of the sealing body 3E in the present embodiment, thus making it possible to easily perform the boring step for boring the fixing holes X, and the mounting step for mounting the heat-generating element H. Also, since the columnar supports 12 and the heat-generating element H can be allowed to come into direct contact with each other, a cooling efficiency of the liquid-cooled jacket can be increased.

Note that the provisional joining step may be performed for at least one of the overlapped portion J13 and the abutment portions J14. Moreover, for example, the manufacturing method according to the first to third modifications of the fourth embodiment described above may be adopted to manufacture the liquid-cooled jacket in the fifth embodiment.

Sixth Embodiment

Figure 46:
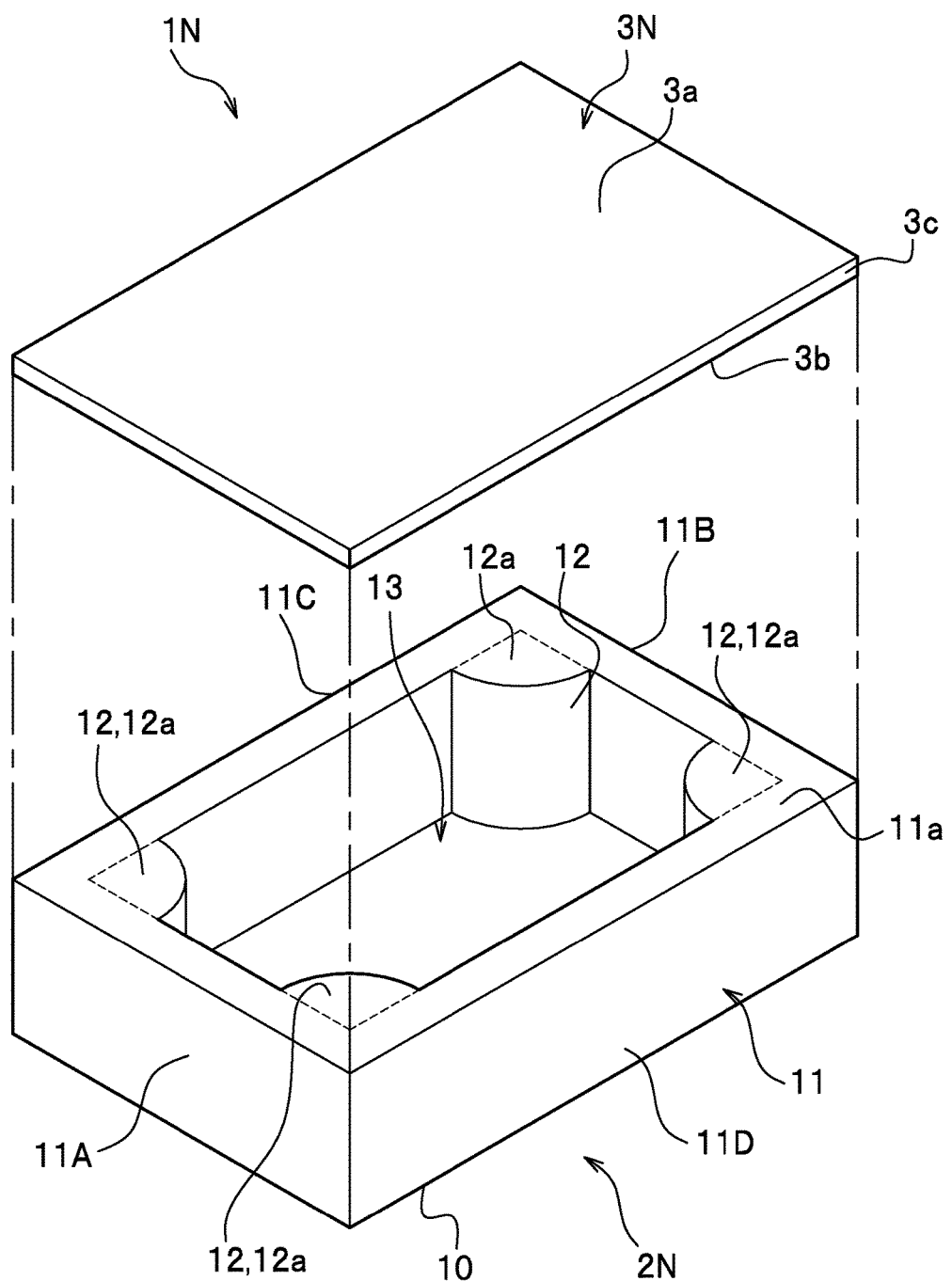
FIG. 46 is an exploded perspective view showing a liquid-cooled jacket according to a sixth embodiment.

Next, description will be given of a method of manufacturing a liquid-cooled jacket according to a sixth embodiment of the present invention. As shown in FIG. 46, the sixth embodiment is different from the fourth embodiment in that the columnar supports 12 are formed to be extended from the peripheral wall part 11. The method of manufacturing the liquid-cooled jacket according to the sixth embodiment will be described with a focus on configurations different from the fourth embodiment.

A liquid-cooled jacket 1N according to the sixth embodiment is composed of a jacket body 2N and a sealing body 3N. The jacket body 2N is a box-shaped body which opens upward. The jacket body 2N includes a bottom part 10, a peripheral wall part 11, and a plurality of columnar supports 12.

The columnar supports 12 are provided to stand on the bottom part 10 and continuously formed on the peripheral wall part 11. The number of the columnar supports 12 is not particularly limited as long as it is one or more, but in the present embodiment, one columnar support 12 for each of four corners of the peripheral wall part 11, i.e., a total of four columnar supports 12 are formed. The columnar supports 12 each have the form of a sector in planar view. The columnar supports 12 have the same shape, respectively. The columnar support 12 has a columnar support end face 12a which is flush with a peripheral wall end face 11a of the peripheral wall part 11.

The sealing body 3N is a plate-like member having the form of a rectangle in planar view. Materials for the sealing body 3N are not particularly limited, but in the present embodiment, the sealing body 3N is formed of the same material as the jacket body 2N. A planar shape of the sealing body 3N is the same as a planar shape of the jacket body 2N.

Next, description will be given of a manufacturing method for the liquid-cooled jacket according to the sixth embodiment (a manufacturing method for the liquid-cooled jacket with a heat-generating element). The manufacturing method for the liquid-cooled jacket includes a preparation step, a placing step, a fixing step, a provisional joining step, a first primary joining step, a second primary joining step, a boring step, a burring step, and a mounting step.

As shown in FIG. 46, the preparation step is a step of forming the jacket body 2N and the sealing body 3N. The jacket body 2N is formed, for example, by die-casting.

Figure 47A:
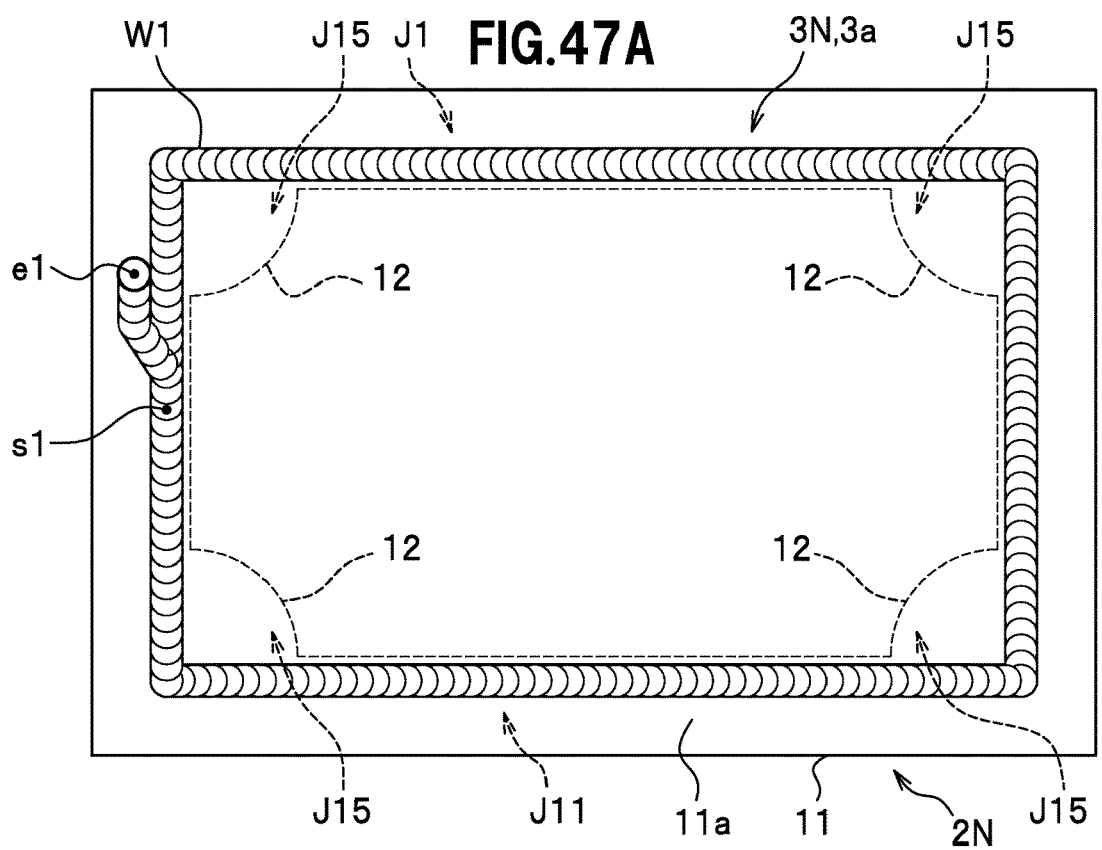
Figure 47B:
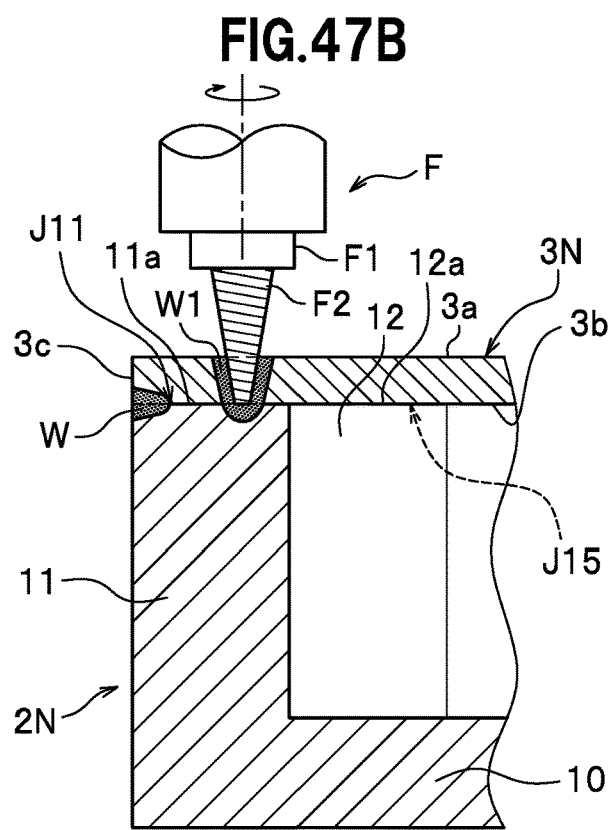

As shown in FIGS. 46, 47A and 47B, the placing step is a step of placing the sealing body 3N on the jacket body 2N. The back surface 3b of the sealing body 3N comes into surface contact with the peripheral wall end face 11a of the peripheral wall part 11 and the columnar support end faces 12a of the columnar supports 12, respectively. The placing step allows the peripheral wall end face 11a of the peripheral wall part 11 and the back surface 3b of the sealing body 3N to be overlapped each other to form a first overlapped portion J11. The first overlapped portion J11 has the form of a rectangular frame in planar view. Also, the placing step allows the back surface 3b of the sealing body 3N and the columnar support end faces 12a of the columnar supports 12 to be overlapped each other to form second overlapped portions J15. The second overlapped portions J15 each have a sectoral shape in planar view.

In the fixing step, the jacket body 2N and the sealing body 3N are fixed on a table (not shown). The jacket body 2N is immovably fixed on the table by means of a fixing tool such as a clamp.

The provisional joining step is a step of provisionally joining the jacket body 2N and the sealing body 3N together. The provisional joining step is the same as that in the fourth embodiment, and thus explanation thereof is omitted.

As shown in FIGS. 47A and 47B, the first primary joining step is a step of performing friction stir welding for the first overlapped portion J11 by means of the primary joining rotary tool F. The first primary joining step is the same as that in the fourth embodiment, and thus explanation thereof is omitted.

Figure 48A:
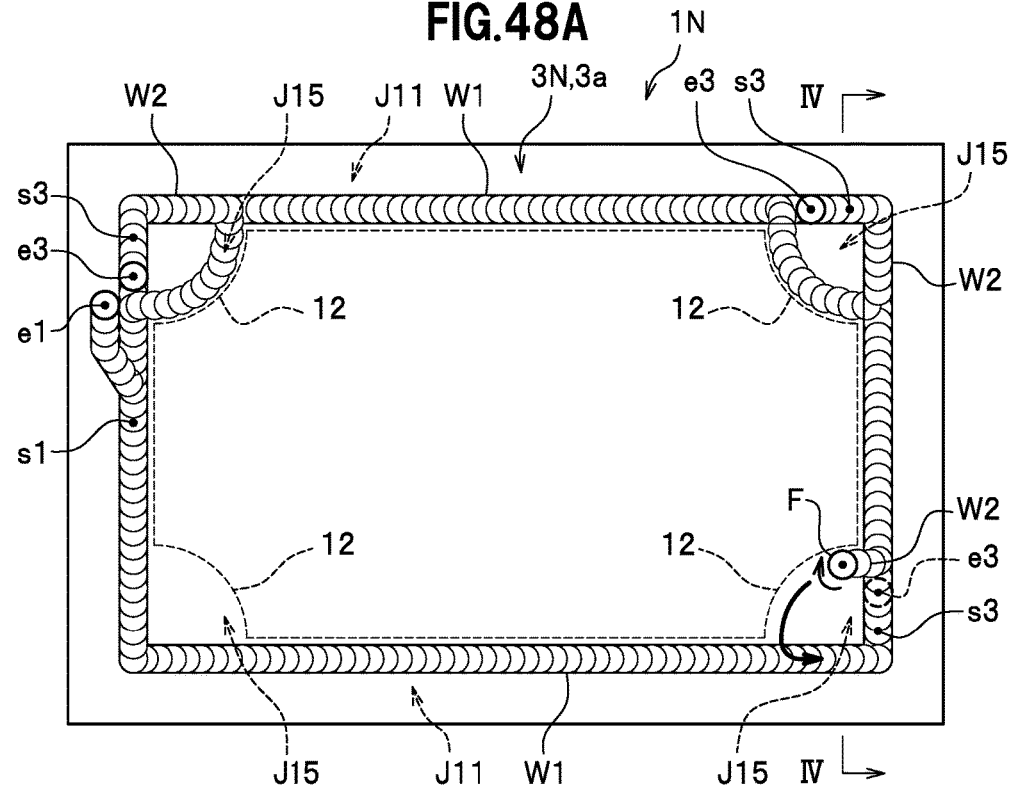
Figure 48B:
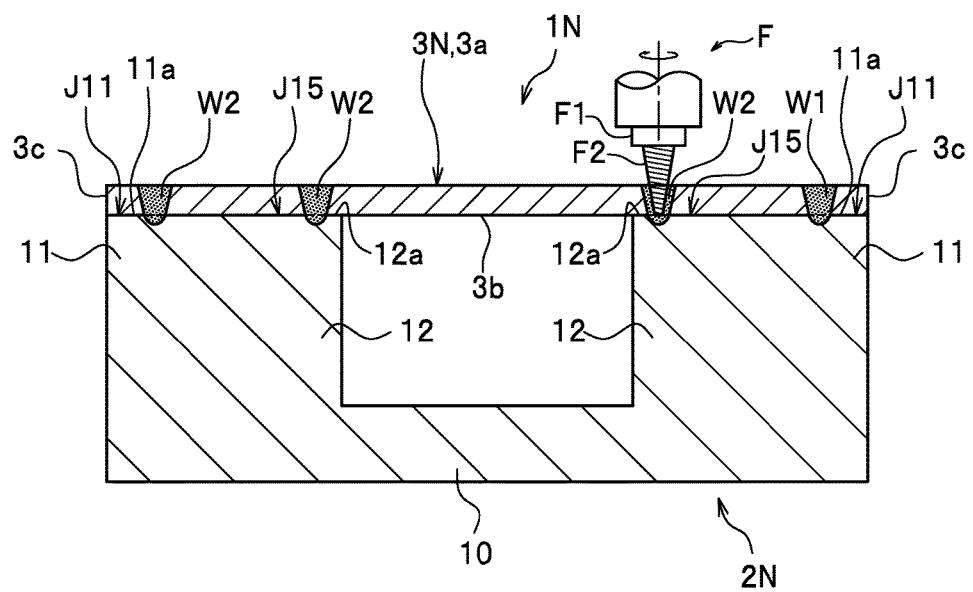
Figure 50:
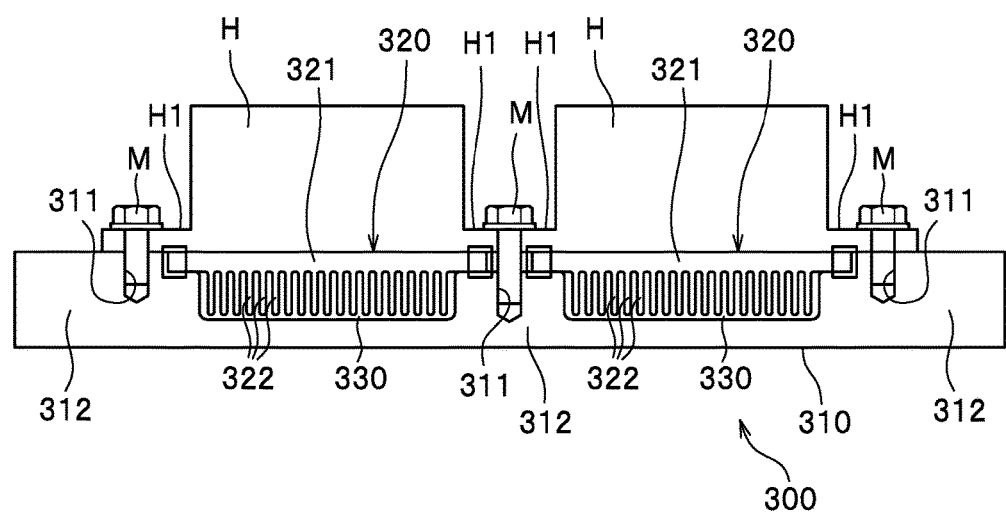
FIG. 50 is a cross-sectional view showing a conventional liquid-cooled jacket.

As shown in FIGS. 48A and 48B, the second primary joining step is a step of performing friction stir welding for each of the second overlapped portions J15 by means of the primary joining rotary tool F. In the second primary joining step, the primary joining rotary tool F being rotated clockwise is inserted into a starting position s3 on the front surface 3a of the sealing body 3N. Then, the primary joining rotary tool F is relatively moved to trace the plasticized region W1 and the primary joining rotary tool F is relatively moved counterclockwise along the inside of the outer peripheral edge of the columnar support 12. The starting position s3 is suitably set, and in the present embodiment, it is set near each of corners on the plasticized region W1. The insertion depth of the stirring pin F2 is the same as that in the fourth embodiment. The plasticized region W2 is formed on the movement locus of the primary joining rotary tool F.

As shown in FIG. 48A, after the primary joining rotary tool F is allowed to move a quarter of one round along the second overlapped portion J15, the primary joining rotary tool F is relatively moved again to trace the plasticized region W1 and allowed to pass through the starting position s3. Then, when reaching an ending position e3, the primary joining rotary tool F is moved upward to allow the primary joining rotary tool F to be pulled out from the sealing body 3N. Measures to be taken for a pull-out trace of the primary joining rotary tool F, which is generated when pulled out, are the same as those in the fourth embodiment.

As shown in FIG. 49A, the boring step is a step of forming a fixing hole X which is communicated with the sealing body 3N and the columnar support 12 and used in fixing a heat-generating element H. The fixing hole X is formed to reach the columnar support 12.

In the burring step, burrs are removed, which have been exposed on the surfaces of the jacket body 2N and the sealing body 3N in the first primary joining step, the second primary joining step, and the boring step. This allows the surfaces of the jacket body 2N and the sealing body 3N to be cleanly finished.

As shown in FIG. 49B, the mounting step is a step of mounting the heat-generating element H through fitting members M. When the heat-generating element H is mounted, it is fixed with the fitting members M such as screws while allowing through-holes formed in a flange H1 of the heat-generating element H to be communicated with the fixing holes X. The fitting member M is inserted to a position at which the columnar support 12 is reached.

The manufacturing method for the liquid-cooled jacket described above can also produce nearly the same advantageous effects as those in the fourth embodiment. The columnar supports 12 may be formed to be extended from the peripheral wall part 11 as in the sixth embodiment. Also, although the columnar supports 12 are each formed at each corner of the peripheral wall part 11 in the present embodiment, the columnar supports may be formed to be extended from locations which are not the corners of the peripheral wall part 11.

Moreover, for example, the manufacturing method according to the first to third modifications of the fourth embodiment described above may be adopted to manufacture the liquid-cooled jacket in the sixth embodiment. Further, when proceeding to the second primary joining step from the first primary joining step in the sixth embodiment, the friction stir welding may be performed in succession without pulling out the primary joining rotary tool F.

Although the embodiments and modifications of the present invention are described above, appropriate design changes or modification are possible. For example, fins may be formed on at least one of the jacket body and the sealing body. Also, in the first primary joining step, the primary joining rotary tool F may be allowed to move two rounds along the first overlapped portion J11 and the overlapped portion J13. Moreover, although in the embodiments, the first primary joining step and the second primary joining step are performed by means of the primary joining rotary tool F, frictional stirring may be performed by means of a rotary tool provided with a shoulder portion and a stirring pin while pressing the shoulder portion into the jacket body and the sealing body. Furthermore, rotary tools to be used in the first primary joining step and the second primary joining step may be different ones.

Moreover, although the provisional joining step is performed using a compact provisional joining rotary tool in the embodiments, it may be performed using the primary joining rotary tool F. In this case, the plasticized region W formed in the provisional joining step and the plasticized region W1 formed in the first primary joining step are preferably overlapped each other. This makes it possible to further increase water-tightness and air-tightness.

REFERENCE SIGNS LIST

1 Liquid-cooled jacket
1A Liquid-cooled jacket
2 Jacket body
2A Jacket body
3 Sealing body
3A Sealing body
3a Front surface
3b Back surface
3c Outer peripheral side surface
10 Bottom part
11 Peripheral wall part
11A Wall part
11B Wall part
11C Wall part
11D Wall part
11a Peripheral wall end face
12 Columnar support
12a Columnar support end face
13 Recess
14 Peripheral wall stepped portion
14a Step bottom surface
14b Step side surface
16a Columnar support end face
17 Columnar support stepped portion
17a Step bottom surface
17b Step side surface
F Primary joining rotary tool (Rotary tool)
F2 Stirring pin
G Provisional joining rotary tool
J1 First abutment portion
J2 Second abutment portion
J3 Overlapped portion
K Table (Cooling plate)
M Fastening member
W1 Plasticized region
W2 Plasticized region
WP Cooling pipe

What is claimed is:
1. A method of manufacturing a liquid-cooled jacket which is composed of a jacket body that has a bottom part, a peripheral wall part rising from a peripheral edge of the bottom part, and a columnar support rising from the bottom part, the columnar support formed separately from the peripheral wall part, and a sealing body that is provided with a hole into which a head of the columnar support is inserted, and seals an opening of the jacket body, and in which the jacket body and the sealing body is joined together by frictional stirring, the method comprising:
a preparation step which includes forming, on an inner peripheral edge of the peripheral wall part, a peripheral wall stepped portion having a step bottom surface and a step side surface rising from the step bottom surface, forming a columnar support end face of the columnar support at the same height position as a peripheral wall end face of the peripheral wall, and forming, on an outer periphery of the head of the columnar support, a columnar support stepped portion having a step bottom surface and a step side surface rising from the step bottom surface;

a placing step of placing the sealing body on the jacket body;

a first primary joining step which includes allowing a rotary tool to move one round along a first abutment portion in which the step side surface of the peripheral wall stepped portion and an outer peripheral side surface of the sealing body abut on each other, to perform frictional stirring; and a second primary joining step which includes allowing a rotary tool to move one round along a second abutment portion in which the step side surface of the columnar support stepped portion and a hole wall of the hole abut on each other, to perform frictional stirring, wherein in the first primary joining step, where the rotary tool is moved clockwise around the sealing body, the rotary tool is rotated clockwise, and where the rotary tool is moved counterclockwise around the sealing body, the rotary tool is rotated counterclockwise, and wherein in the second primary joining step, where the rotary tool is moved counterclockwise for the columnar support, the rotary tool is rotated clockwise, and where the rotary tool is moved clockwise for the columnar support, the rotary tool is rotated counterclockwise.

2. The method of manufacturing the liquid-cooled jacket, according to claim 1, wherein the rotary tool is a primary joining rotary tool provided with a stirring pin a length of which is greater than a thickness of the sealing body, and the first primary joining step and the second primary joining step each include performing frictional stirring with only the stirring pin being brought into contact with the jacket body and the sealing body.

3. A method of manufacturing a liquid-cooled jacket which is composed of a jacket body that has a bottom part, a peripheral wall part rising from a peripheral edge of the bottom part, and a columnar support rising from the bottom part, the columnar support formed separately from the peripheral wall part, and a sealing body that seals an opening of the jacket body, and in which the jacket body and the sealing body is joined together by frictional stirring, the method comprising:

a preparation step which includes forming, on an inner peripheral edge of the peripheral wall part, a peripheral wall stepped portion having a step bottom surface and a step side surface rising from the step bottom surface, and forming a columnar support end face of the columnar support at the same height position as the step bottom surface of the peripheral wall stepped portion;

a placing step of placing the sealing body on the jacket body;

a first primary joining step which includes allowing a rotary tool to move one round along a first abutment portion in which the step side surface of the peripheral wall stepped portion and an outer peripheral side surface of the sealing body abut on each other, to perform frictional stirring; and a second primary joining step which includes allowing a rotary tool to move for an overlapped portion in which the columnar support end face of the columnar support and a back surface of the sealing body are overlapped each other, to perform frictional stirring, wherein in the first primary joining step, where the rotary tool is moved clockwise around the sealing body, the rotary tool is rotated clockwise, and where the rotary tool is moved counterclockwise around the sealing body, the rotary tool is rotated counterclockwise, and wherein in the second primary joining step, where the rotary tool is moved counterclockwise for the columnar support, the rotary tool is rotated clockwise, and where the rotary tool is moved clockwise for the columnar support, the rotary tool is rotated counterclockwise.

4. The method of manufacturing the liquid-cooled jacket, according to claim 3, wherein the rotary tool is a primary joining rotary tool provided with a stirring pin a length of which is greater than a thickness of the sealing body, the first primary joining step includes performing frictional stirring with only the stirring pin being brought into contact with the jacket body and the sealing body, and the second primary joining step includes performing frictional stirring with only the stirring pin being brought into contact with the columnar support of the jacket body and the sealing body, or performing frictional stirring with only the stirring pin being brought into contact with only the sealing body.

5. A method of manufacturing a liquid-cooled jacket which is composed of a jacket body that has a bottom part, a peripheral wall part rising from a peripheral edge of the bottom part, and a columnar support rising from the bottom part, the columnar support formed separately from the peripheral wall part, and a sealing body that seals an opening of the jacket body, and in which the jacket body and the sealing body is joined together by frictional stirring, the method comprising:

a preparation step which includes forming a columnar support end face of the columnar support at the same height position as a peripheral wall end face of the peripheral wall part;

a placing step of placing the sealing body on the jacket body;

a first primary joining step which includes allowing a rotary tool to move one round for a first overlapped portion in which the peripheral wall end face of the peripheral wall part and a back surface of the sealing body are overlapped each other, to perform frictional stirring; and a second primary joining step which includes allowing a rotary tool to move for, while inserting the rotary tool from a front surface of the sealing body into, a second overlapped portion in which the columnar support end face of the columnar support and the back surface of the sealing body are overlapped each other, to perform frictional stirring, wherein in the first primary joining step, where the rotary tool is moved clockwise around the sealing body, the rotary tool is rotated clockwise, and where the rotary tool is moved counterclockwise around the sealing body, the rotary tool is rotated counterclockwise, and wherein in the second primary joining step, where the rotary tool is moved counterclockwise for the columnar support, the rotary tool is rotated clockwise, and where the rotary tool is moved clockwise for the columnar support, the rotary tool is rotated counterclockwise.

6. The method of manufacturing the liquid-cooled jacket, according to claim 5, wherein the rotary tool is a primary joining rotary tool provided with a stirring pin a length of which is greater than a thickness of the sealing body, and the first primary joining step and the second primary joining step each include performing frictional stirring with only the stirring pin being brought into contact with the jacket body and the sealing body, or performing frictional stirring with only the stirring pin being brought into contact with only the sealing body.

7. A method of manufacturing a liquid-cooled jacket which is composed of a jacket body that has a bottom part, a peripheral wall part rising from a peripheral edge of the bottom part, and a columnar support rising from the bottom part, the columnar support formed separately from the peripheral wall part, and a sealing body that is provided with a hole into which a head of the columnar support is inserted, and seals an opening of the jacket body, and in which the jacket body and the sealing body is joined together by frictional stirring, the method comprising:

a preparation step which includes forming, on an outer periphery of the head of the columnar support, a columnar support stepped portion having a step bottom surface and a step side surface rising from the step bottom surface, and forming the step bottom surface of the columnar support at the same height position as a peripheral wall end face of the peripheral wall;

a placing step of placing the sealing body on the jacket body;

a first primary joining step which includes allowing a rotary tool to move one round for an overlapped portion in which the peripheral wall end face of the peripheral wall part and a back surface of the sealing body are overlapped each other, to perform frictional stirring; and a second primary joining step which includes allowing a rotary tool to move one round for an abutment portion in which the step side surface of the columnar support and a hole wall of the hole abut on each other, to perform frictional stirring, wherein in the first primary joining step, where the rotary tool is moved clockwise around the sealing body, the rotary tool is rotated clockwise, and where the rotary tool is moved counterclockwise around the sealing body, the rotary tool is rotated counterclockwise, and wherein in the second primary joining step, where the rotary tool is moved counterclockwise for the columnar support, the rotary tool is rotated clockwise, and where the rotary tool is moved clockwise for the columnar support, the rotary tool is rotated counterclockwise.

8. The method of manufacturing the liquid-cooled jacket, according to claim 7, wherein the rotary tool is a primary joining rotary tool provided with a stirring pin a length of which is greater than a thickness of the sealing body, the first primary joining step includes performing frictional stirring with only the stirring pin being brought into contact with the jacket body and the sealing body, or performing frictional stirring with only the stirring pin being brought into contact with only the sealing body, and the second primary joining step includes performing frictional stirring with only the stirring pin being brought into contact with the columnar support of the jacket body and the sealing body.

* * * * *